US011024561B2

(12) United States Patent
Shim et al.

(10) Patent No.: US 11,024,561 B2
(45) **Date of Patent: *Jun. 1, 2021**

(54) SEMICONDUCTOR DEVICE AND METHOD OF FORMING A FAN-OUT POP DEVICE WITH PWB VERTICAL INTERCONNECT UNITS

(71) Applicant: STATS ChipPAC Pte. Ltd., Singapore (SG)

(72) Inventors: Il Kwon Shim, Singapore (SG); Yaojian Lin, Jiangyin (CN); Pandi C. Marimuthu, Singapore (SG); Kang Chen, Singapore (SG); Yu Gu, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/885,640

(22) Filed: May 28, 2020

(65) Prior Publication Data

US 2020/0294890 A1 Sep. 17, 2020

Related U.S. Application Data

(60) Continuation of application No. 16/030,668, filed on Jul. 9, 2018, now Pat. No. 10,707,150, which is a (Continued)

(51) Int. Cl.
*H01L 23/48* (2006.01)
*H01L 23/00* (2006.01)
(Continued)

(52) U.S. Cl.
CPC .......... *H01L 23/481* (2013.01); *H01L 21/561* (2013.01); *H01L 21/563* (2013.01); (Continued)

(58) Field of Classification Search
CPC ............. H01L 23/481; H01L 23/49827; H01L 23/49838; H01L 23/3128; H01L 23/49811;
(Continued)

(56) References Cited

U.S. PATENT DOCUMENTS 5,148,266 A 9/1992 Khandros et al.
5,773,884 A 6/1998 Andros et al.
(Continued)

FOREIGN PATENT DOCUMENTS

TW 201108335 A1 3/2011
TW 201142932 A 12/2011

*Primary Examiner* — David A Zarneke
(74) *Attorney, Agent, or Firm* — Robert D. Atkins; Patent Law Group: Atkins and Associates, P.C.

(57) ABSTRACT

A semiconductor device has a semiconductor package and an interposer disposed over the semiconductor package. The semiconductor package has a first semiconductor die and a modular interconnect unit disposed in a peripheral region around the first semiconductor die. A second semiconductor die is disposed over the interposer opposite the semiconductor package. An interconnect structure is formed between the interposer and the modular interconnect unit. The interconnect structure is a conductive pillar or stud bump. The modular interconnect unit has a core substrate and a plurality of vertical interconnects formed through the core substrate. A build-up interconnect structure is formed over the first semiconductor die and modular interconnect unit. The vertical interconnects of the modular interconnect unit are exposed by laser direct ablation. An underfill is deposited between the interposer and semiconductor package. A total thickness of the semiconductor package and build-up interconnect structure is less than 0.4 millimeters.

25 Claims, 58 Drawing Sheets

Related U.S. Application Data division of application No. 14/061,244, filed on Oct. 23, 2013, now Pat. No. 10,049,964, which is a continuation-in-part of application No. 13/477,982, filed on May 22, 2012, now abandoned, which is a continuation-in-part of application No. 13/429,119, filed on Mar. 23, 2012, now Pat. No. 8,810,024.

(51) Int. Cl.

| | |
|---|---|
| ***H01L 23/31*** | (2006.01) |
| ***H01L 23/498*** | (2006.01) |
| ***H01L 21/56*** | (2006.01) |
| ***H01L 25/10*** | (2006.01) |
| ***H01L 25/00*** | (2006.01) |
| ***H01L 23/538*** | (2006.01) |

(52) U.S. Cl.

CPC ........ *H01L 21/565* (2013.01); *H01L 23/3121* (2013.01); *H01L 23/3128* (2013.01); *H01L 23/49816* (2013.01); *H01L 23/49827* (2013.01); *H01L 23/49833* (2013.01); *H01L 23/5389* (2013.01); *H01L 24/11* (2013.01); *H01L 24/19* (2013.01); *H01L 24/20* (2013.01); *H01L 24/96* (2013.01); *H01L 24/97* (2013.01); *H01L 25/105* (2013.01); *H01L 25/50* (2013.01); *H01L 23/49838* (2013.01); *H01L 24/32* (2013.01); *H01L 24/48* (2013.01); *H01L 2224/0401* (2013.01); *H01L 2224/04105* (2013.01); *H01L 2224/05548* (2013.01); *H01L 2224/05552* (2013.01); *H01L 2224/05567* (2013.01); *H01L 2224/12105* (2013.01); *H01L 2224/13022* (2013.01); *H01L 2224/24155* (2013.01); *H01L 2224/32225* (2013.01); *H01L 2224/48091* (2013.01); *H01L 2224/48227* (2013.01); *H01L 2224/73267* (2013.01); *H01L 2224/94* (2013.01); *H01L 2224/97* (2013.01); *H01L 2225/107* (2013.01); *H01L 2225/1035* (2013.01); *H01L 2225/1058* (2013.01); *H01L 2924/00014* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/3511* (2013.01)

(58) Field of Classification Search

CPC ................ H01L 21/561; H01L 21/563; H01L 21/76802

See application file for complete search history.

(56) References Cited

U.S. PATENT DOCUMENTS

| | | | |
|---|---|---|---|
| 5,953,816 | A | 9/1999 | Pai et al. |
| 6,022,758 | A | 2/2000 | Badehi |
| 6,191,023 | B1 | 2/2001 | Chen |
| 6,569,712 | B2 | 5/2003 | Ho et al. |
| 6,680,529 | B2 | 1/2004 | Chen et al. |
| 6,815,712 | B1 | 11/2004 | Kline |
| 6,818,978 | B1 | 11/2004 | Fan |
| 7,169,694 | B2 | 1/2007 | Pozder et al. |
| 7,235,431 | B2 | 6/2007 | Wood et al. |
| 7,239,014 | B2 | 7/2007 | Ogawa et al. |
| 7,345,361 | B2 | 3/2008 | Mallik et al. |
| 7,372,151 | B1 | 5/2008 | Fan et al. |
| 7,545,047 | B2 | 6/2009 | Bauer et al. |
| 7,648,911 | B2 | 1/2010 | Pagaila et al. |
| 7,659,145 | B2 | 2/2010 | Do et al. |
| 7,714,453 | B2 | 5/2010 | Khan et al. |
| 7,838,337 | B2 | 11/2010 | Marimuthu et al. |
| 7,859,085 | B2 | 12/2010 | Pagaila et al. |
| 7,948,095 | B2 | 5/2011 | Ng et al. |
| 8,012,797 | B2 | 9/2011 | Shen et al. |
| 8,018,034 | B2 | 9/2011 | Chi et al. |
| 8,076,756 | B2 | 12/2011 | Lane et al. |
| 8,105,875 | B1 | 1/2012 | Hu et al. |
| 8,138,609 | B2 | 3/2012 | Horiuchi et al. |
| 8,148,256 | B2 | 4/2012 | Hebert et al. |
| 8,222,538 | B1 | 7/2012 | Yoshida et al. |
| 8,237,278 | B2 | 8/2012 | Gluschenkov et al. |
| 8,247,269 | B1 | 8/2012 | Liu |
| 8,263,439 | B2 | 9/2012 | Marimuthu et al. |
| 8,270,176 | B2 | 9/2012 | Pagaila et al. |
| 8,304,900 | B2 | 11/2012 | Jang et al. |
| 8,378,476 | B2 | 2/2013 | Lee et al. |
| 8,378,480 | B2 | 2/2013 | Chen et al. |
| 8,405,212 | B2 | 3/2013 | Chu et al. |
| 8,421,202 | B2 | 4/2013 | Shim et al. |
| 8,471,154 | B1 | 6/2013 | Yoshida et al. |
| 8,546,938 | B2 | 10/2013 | Kim et al. |
| 8,552,548 | B1 | 10/2013 | Do et al. |
| 8,592,992 | B2 | 11/2013 | Lin et al. |
| 8,633,598 | B1 | 1/2014 | St. Amand |
| 8,659,162 | B2 | 2/2014 | Suthiwongsunthorn et al. |
| 8,779,601 | B2 | 7/2014 | Gan et al. |
| 8,796,561 | B1 | 8/2014 | Scanlan et al. |
| 8,802,554 | B2 | 8/2014 | Sutardja |
| 8,810,024 | B2 | 8/2014 | Lin et al. |
| 8,823,156 | B2 | 9/2014 | Hsieh |
| 8,884,422 | B2 | 11/2014 | Goh et al. |
| 8,912,662 | B2 | 12/2014 | Chun |
| 8,980,691 | B2 * | 3/2015 | Lin .................... H01L 23/5389 438/107 |
| 8,987,896 | B2 | 3/2015 | Cheah et al. |
| 9,030,022 | B2 | 5/2015 | Chen et al. |
| 9,171,792 | B2 | 10/2015 | Sun et al. |
| 9,209,163 | B2 | 12/2015 | Kao et al. |
| 9,258,922 | B2 | 2/2016 | Chen et al. |
| 9,379,078 | B2 | 6/2016 | Yu et al. |
| 9,391,041 | B2 | 7/2016 | Lin |
| 9,406,580 | B2 | 8/2016 | Erhart et al. |
| 9,508,688 | B2 | 11/2016 | Kim |
| 9,591,747 | B2 | 3/2017 | Mizushiro |
| 9,679,863 | B2 | 6/2017 | Lin et al. |
| 9,837,303 | B2 | 12/2017 | Lin et al. |
| 9,865,525 | B2 | 1/2018 | Lin et al. |
| 10,049,964 | B2 * | 8/2018 | Shim .................... H01L 25/105 |
| 10,177,090 | B2 | 1/2019 | Lin et al. |
| 10,707,150 | B2 * | 7/2020 | Shim .................... H01L 21/561 |
| 2002/0135057 | A1 | 9/2002 | Kurita |
| 2005/0121764 | A1 | 6/2005 | Mallik et al. |
| 2006/0194373 | A1 | 8/2006 | Fee et al. |
| 2007/0158813 | A1 | 7/2007 | Kim et al. |
| 2007/0190690 | A1 | 8/2007 | Chow et al. |
| 2007/0228543 | A1 | 10/2007 | Walter et al. |
| 2008/0017968 | A1 | 1/2008 | Choi et al. |
| 2009/0057849 | A1 | 3/2009 | Tang et al. |
| 2009/0127686 | A1 | 5/2009 | Yang et al. |
| 2009/0146315 | A1 | 6/2009 | Shim et al. |
| 2009/0166886 | A1 | 7/2009 | Kim et al. |
| 2009/0236031 | A1 | 9/2009 | Sunohara et al. |
| 2009/0311829 | A1 | 12/2009 | Yang et al. |
| 2010/0006330 | A1 | 1/2010 | Fu et al. |
| 2010/0007029 | A1 | 1/2010 | Do et al. |
| 2010/0013081 | A1 | 1/2010 | Toh et al. |
| 2010/0109169 | A1 | 5/2010 | Kolan et al. |
| 2010/0133704 | A1 | 6/2010 | Marimuthu et al. |
| 2010/0171205 | A1 | 7/2010 | Chen et al. |
| 2010/0171207 | A1 | 7/2010 | Shen et al. |
| 2010/0221873 | A1 | 9/2010 | Marimuthu et al. |
| 2010/0276792 | A1 | 11/2010 | Chi et al. |
| 2011/0012266 | A1 | 1/2011 | Horiuchi et al. |
| 2011/0037155 | A1 | 2/2011 | Pagaila |
| 2011/0068459 | A1 | 3/2011 | Pagaila et al. |
| 2011/0215470 | A1 | 9/2011 | Chen et al. |
| 2011/0217812 | A1 | 9/2011 | Hedler et al. |
| 2011/0221057 | A1 | 9/2011 | Lin et al. |
| 2011/0278707 | A1 | 11/2011 | Chi et al. |

(56) References Cited

U.S. PATENT DOCUMENTS

| | | | |
|---|---|---|---|
| 2011/0278736 | A1 | 11/2011 | Lin et al. |
| 2011/0309490 | A1 | 12/2011 | Lu et al. |
| 2012/0013000 | A1 | 1/2012 | Haba |
| 2012/0074585 | A1 | 3/2012 | Koo et al. |
| 2012/0074587 | A1 | 3/2012 | Koo et al. |
| 2012/0319294 | A1 | 12/2012 | Lee et al. |
| 2013/0001767 | A1 | 1/2013 | Kajiki |
| 2013/0049217 | A1 | 2/2013 | Gong et al. |
| 2013/0062760 | A1 | 3/2013 | Hung et al. |
| 2013/0075936 | A1 | 3/2013 | Lin et al. |
| 2013/0105991 | A1 | 5/2013 | Gan et al. |
| 2013/0154108 | A1 | 6/2013 | Lin et al. |
| 2013/0182402 | A1 | 7/2013 | Chen et al. |
| 2013/0228917 | A1 | 9/2013 | Yoon et al. |
| 2013/0249101 | A1 | 9/2013 | Lin et al. |
| 2013/0249106 | A1 | 9/2013 | Lin et al. |
| 2013/0277851 | A1 | 10/2013 | Lin et al. |
| 2014/0110856 | A1 | 4/2014 | Lin |
| 2014/0110860 | A1 | 4/2014 | Choi et al. |
| 2015/0001708 | A1 | 1/2015 | Lin |

* cited by examiner

SEMICONDUCTOR DEVICE AND METHOD OF FORMING A FAN-OUT POP DEVICE WITH PWB VERTICAL INTERCONNECT UNITS

CLAIM TO DOMESTIC PRIORITY

The present application is a continuation of U.S. patent application Ser. No. 16/030,668, now U.S. Pat. No. 10,707,150, filed Jul. 9, 2018, which is a division of U.S. patent application Ser. No. 14/061,244, now U.S. Pat. No. 10,049,964, filed Oct. 23, 2013, which is a continuation-in-part of U.S. patent application Ser. No. 13/477,982, now abandoned, filed May 22, 2012, which is a continuation-in-part of U.S. patent application Ser. No. 13/429,119, now U.S. Pat. No. 8,810,024, filed Mar. 23, 2012, which applications are incorporated herein by reference.

FIELD OF THE INVENTION

The present invention relates in general to semiconductor devices and, more particularly, to a semiconductor device and method of forming a fan-out package-on-package (Fo-PoP) with printed wiring board (PWB) modular vertical interconnect units.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term “semiconductor die” as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The manufacturing of smaller semiconductor devices relies on implementing improvements to horizontal and vertical electrical interconnection between multiple semiconductor devices on multiple levels, i.e., three dimensional (3-D) device integration. One approach to achieving the objectives of greater integration and smaller semiconductor devices is to focus on 3-D packaging technologies including PoP. However, PoP often requires laser drilling to form interconnect structures, which increases equipment cost and requires drilling through an entire package thickness. Laser drilling increases cycle time and decreases manufacturing throughput. Vertical interconnections formed exclusively by a laser drilling process can result in reduced control for vertical interconnections. Unprotected contacts can also lead to increases in yield loss for interconnections formed with subsequent surface mount technology (SMT). Furthermore, conductive materials used for forming vertical interconnects within PoP, such as copper (Cu), can incidentally be transferred to semiconductor die during package formation, thereby contaminating the semiconductor die within the package.

The electrical interconnection between a PoP and external devices can be accomplished by forming redistribution layers (RDLs) within a build-up interconnect structure over both a front side and a backside of a semiconductor die within the PoP. However, the formation of multiple RDLs over both a front side and a backside of the semiconductor die can be a slow and costly approach for making electrical interconnection between stacked semiconductor devices and can result in higher fabrication costs. The electrical interconnection between a Fo-PoP and external devices can also be accomplished by disposing an interposer over the Fo-PoP. However, using an interposer for electrical interconnection between semiconductor devices results in a thicker overall semiconductor package. In addition, as fabrication technologies improve, the number of input/output (I/O) pins per semiconductor device is increasing while the average semiconductor device size in pitch between adjacent interconnect structures is decreasing. Mounting semiconductor devices with increased I/O density to conventional motherboards can prove difficult because interconnection pads on conventional motherboards are typically configured with a larger pitch.

SUMMARY OF THE INVENTION

A need exists for a thin, cost-effective semiconductor package with vertical interconnects formed without laser drilling that will accommodate fine-pitch semiconductor die with high I/O count. Accordingly, in one embodiment, the present invention is a method of making a semiconductor device comprising the steps of providing a semiconductor package including a first semiconductor die and a modular interconnect unit disposed around the first semiconductor die, providing an interposer, disposing the interposer over the semiconductor package, providing a second semiconductor die, and disposing the second semiconductor die over the interposer opposite the semiconductor package.

In another embodiment, the present invention is a method of making a semiconductor device comprising the steps of providing an interposer, providing a semiconductor package including a first semiconductor die and a modular interconnect unit disposed around the first semiconductor die, and disposing the semiconductor package over the interposer.

In another embodiment, the present invention is a semiconductor device comprising a first semiconductor die and a modular interconnect unit disposed in a peripheral region around the first semiconductor die. An interposer is disposed over the first semiconductor die.

In another embodiment, the present invention is a semiconductor device comprising a first semiconductor die and a modular interconnect unit disposed in a peripheral region around the first semiconductor die.

BRIEF DESCRIPTION OF THE DRAWINGS

FIGS. 20*a*-201 illustrate another process of forming a 3-D semiconductor device including a Fo-PoP with semiconductor die interconnected by PWB modular units having vertical interconnect structures;

DETAILED DESCRIPTION OF THE DRAWINGS

Figure 1:
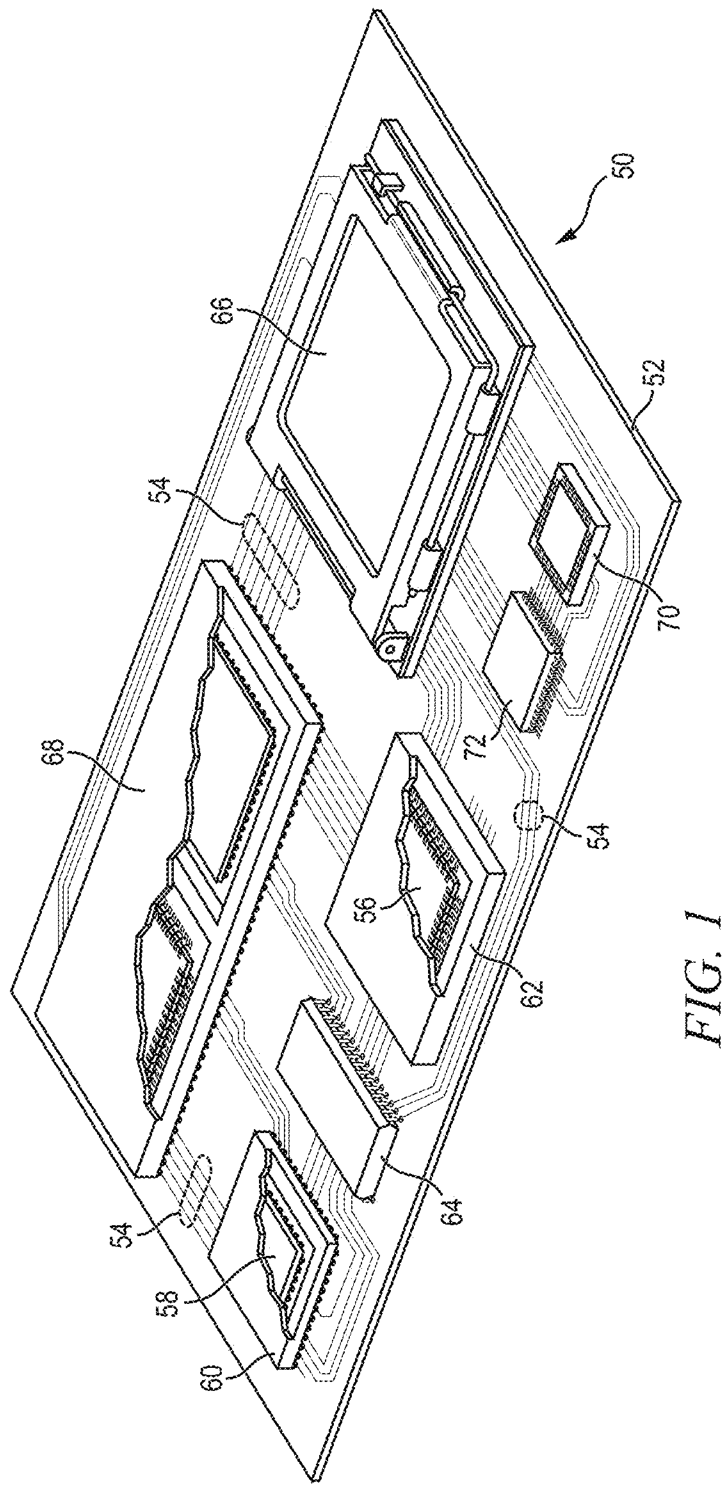
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, those skilled in the art will appreciate that the disclosure is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layers of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on the PCB's surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for these products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
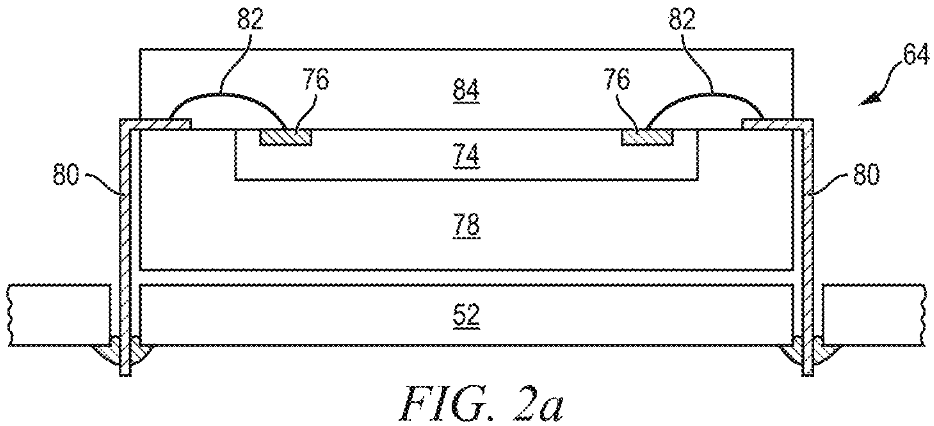
FIGS. 2*a*-2*c* illustrate further detail of the representative semiconductor packages mounted to the PCB.
Figure 2B:
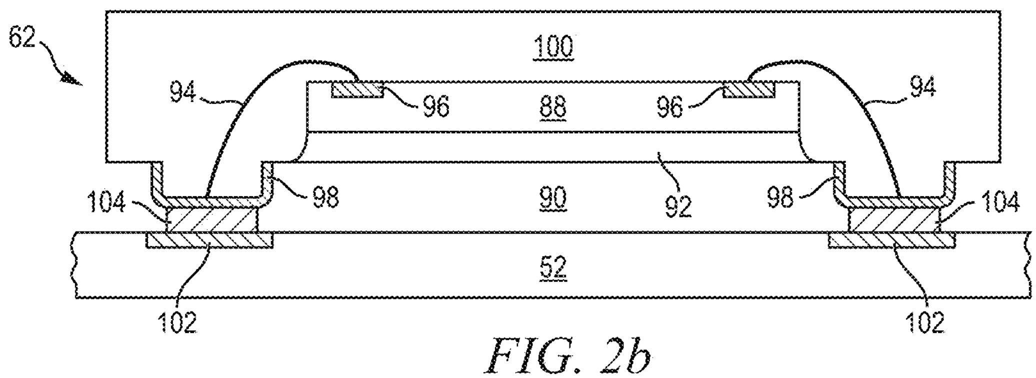
Figure 2C:
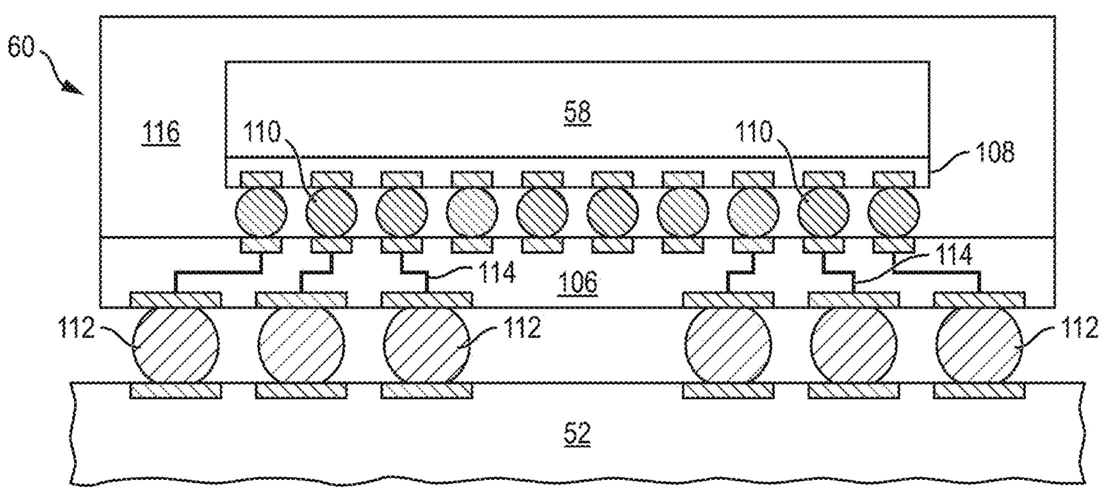

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2*b* illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
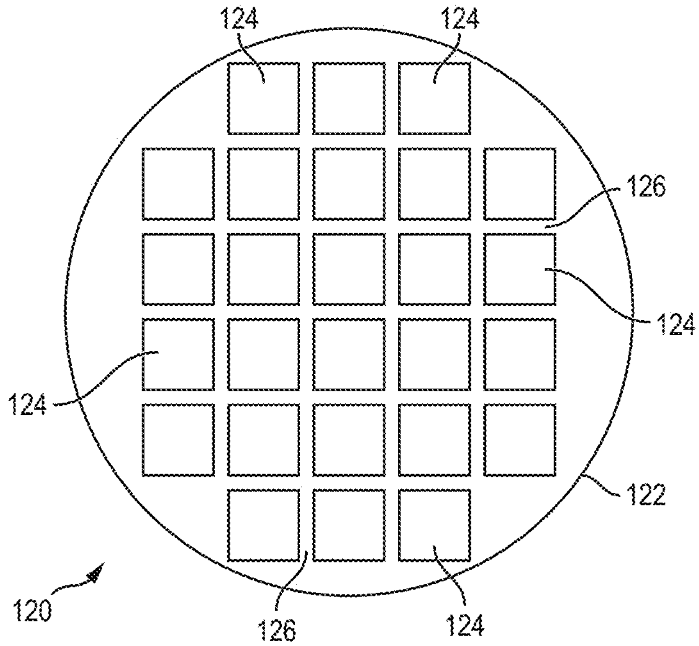
FIGS. 3*a*-3*c* illustrate a semiconductor wafer with a plurality of semiconductor die separated by saw streets.

FIG. 3*a* shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 3B:
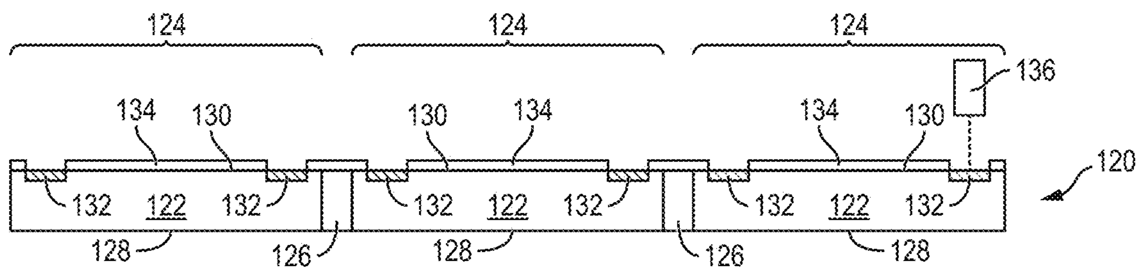

FIG. 3*b* shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3*b*. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is conformally applied over active surface 130 using PVD, CVD, screen printing, spin coating, or spray coating. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 covers and provides protection for active surface 130. A portion of insulating layer 134 is removed by laser direct ablation (LDA) using laser 136 or other suitable process to expose conductive layer 132 and provide for subsequent electrical interconnect.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 132 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3C:
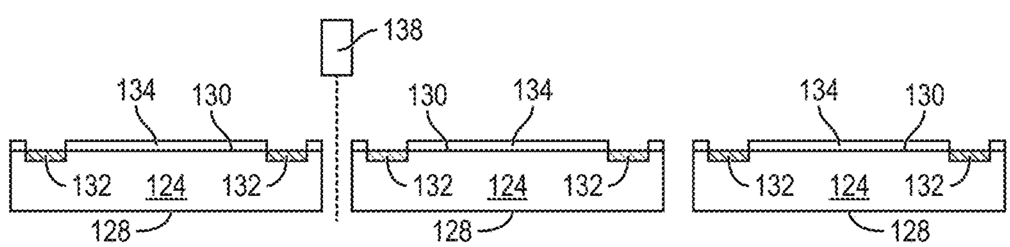

In FIG. 3*c*, semiconductor wafer 120 is singulated through saw street 126 using a saw blade or laser cutting tool 138 into individual semiconductor die 124. The individual semiconductor die 124 can be inspected and electrically tested for identification of KGD post singulation.

Figure 4A:
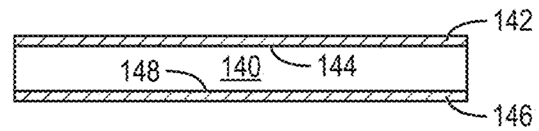
FIGS. 4*a*-4*h* illustrate a process of forming PWB modular units with vertical interconnect structures for a Fo-PoP.

FIGS. 4*a*-4*h* and 5*a*-5*i* illustrate, in relation to FIGS. 1 and 2*a*-2*c*, a process of forming a Fo-PoP with PWB modular vertical interconnect units. FIG. 4*a* shows a cross-sectional view of a portion of laminate core 140. An optional conductive layer 142 is formed over surface 144 of core 140, and optional conductive layer 146 is formed over surface 148 of the core. Conductive layers 142 and 146 are formed using a metal deposition process such as Cu foil lamination, printing, PVD, CVD, sputtering, electrolytic plating, and electroless plating. Conductive layers 142 and 146 can be one or more layers of Al, Cu, Sn, Ni, Au, Ag, titanium (Ti), tungsten (W), or other suitable electrically conductive material. In one embodiment, conductive layers 142 and 146 are Cu foil having a thickness of 20-200 micrometers (μm). Conductive layers 142 and 146 can be thinned by a wet etching process.

Figure 4B:
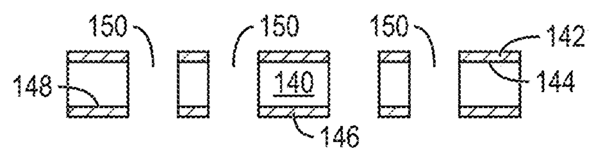

In FIG. 4*b*, a plurality of vias 150 is formed through laminate core 140 and conductive layers 142 and 146 using laser drilling, mechanical drilling, deep reactive ion etching (DRIE), or other suitable process. Vias 150 extend through laminate core 140. Vias 150 are cleaned by desmearing process.

Figure 4C:
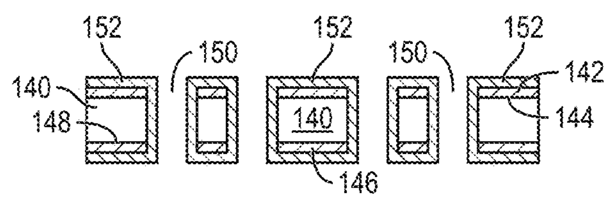

In FIG. 4*c*, a conductive layer 152 is formed over laminate core 140, conductive layers 142 and 146, and sidewalls of vias 150 using a metal deposition process such as printing, PVD, CVD, sputtering, electrolytic plating, and electroless plating. Conductive layer 152 can be one or more layers of Al, Cu, Sn, Ni, Au, Ag, Ti, W, or other suitable electrically conductive material. In one embodiment, conductive layer 152 includes a first Cu layer formed by electroless plating, followed by a second Cu layer formed by electrolytic plating.

Figure 4D:
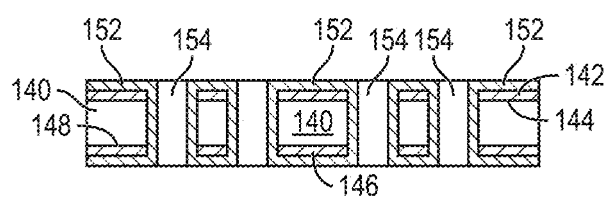

In FIG. 4*d*, the remaining portion of vias 150 is filled with an insulating or conductive material with filler material 154. The insulating material with insulating filler can be polymer dielectric material with filler and one or more layers of SiO2, Si3N4, SiON, Ta2O5, Al2O3, or other material having similar insulating and structural properties. The conductive filler material can be one or more layers of Al, Cu, Sn, Ni, Au, Ag, or other suitable electrically conductive material. In one embodiment, filler material 154 is a polymer plug. Alternatively, filler material 154 is Cu paste. Vias 150 can also be left as a void, i.e., without filler material. Filler material 154 is selected to be softer or more compliant than conductive layer 152. Vias 150 with filler material 154 reduce the incidence of cracking or delamination by allowing deformation or change of shape of conductive layer 152 under stress. Vias 150 can also be completely filled with conductive layer 152.

Figure 4E:
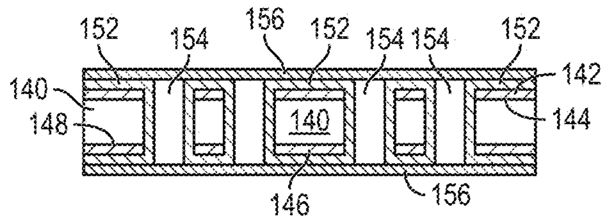

In FIG. 4*e*, a conductive layer 156 is formed over conductive layer 152 and filler material 154 using a metal deposition process such as printing, PVD, CVD, sputtering, electrolytic plating, and electroless plating. Conductive layer 156 can be one or more layers of Al, Cu, Sn, Ni, Au, Ag, Ti, W, or other suitable electrically conductive material. In one embodiment, conductive layer 156 includes a first Cu layer formed by electroless plating, followed by a second Cu layer formed by electrolytic plating.

Figure 4F:
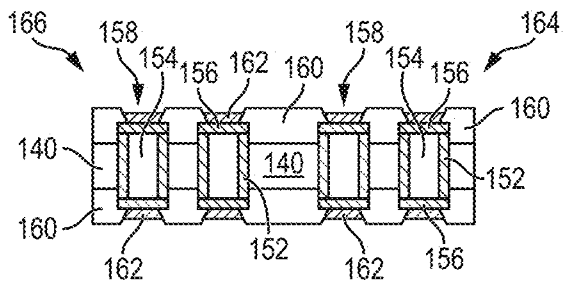

In FIG. 4*f*, a portion of conductive layers 142, 146, 152, and 156 is removed by a wet etching process through a patterned photoresist layer to expose laminate core 140 and leave conductive pillars or conductive vertical interconnect structures 158 through laminate core 140. An insulating or passivation layer 160 is formed over laminate core 140 and conductive vertical interconnect structures 158 using vacuum lamination, spin coating, spray coating, screen printing, or other printing process. The insulating layer 160 contains one or more layers of SiO2, Si3N4, SiON, Ta2O5, Al2O3, polymer dielectric material with or without insulating filler, or other material having similar insulating and structural properties. In one embodiment, insulating layer 160 is a solder mask. A portion of insulating layer 160 is removed by an etching process or LDA to expose conductive layer 156 and facilitate the formation of subsequent conductive layers.

An optional conductive layer 162 can be formed over the exposed conductive layer 156 using a metal deposition process such as electrolytic plating and electroless plating. Conductive layer 162 can be one or more layers of Al, Cu, Sn, Ni, Au, Ag, Ti, W, or other suitable electrically conductive material. In one embodiment, conductive layer 162 is a Cu protective layer.

Figure 4H:
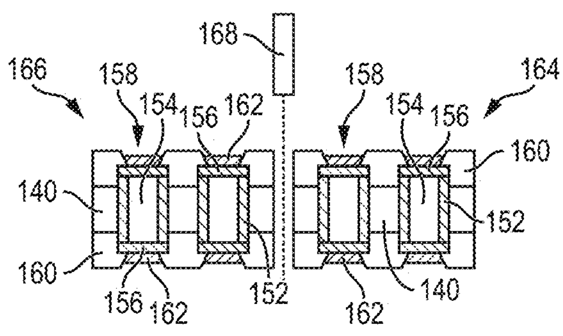
Figure 4G:
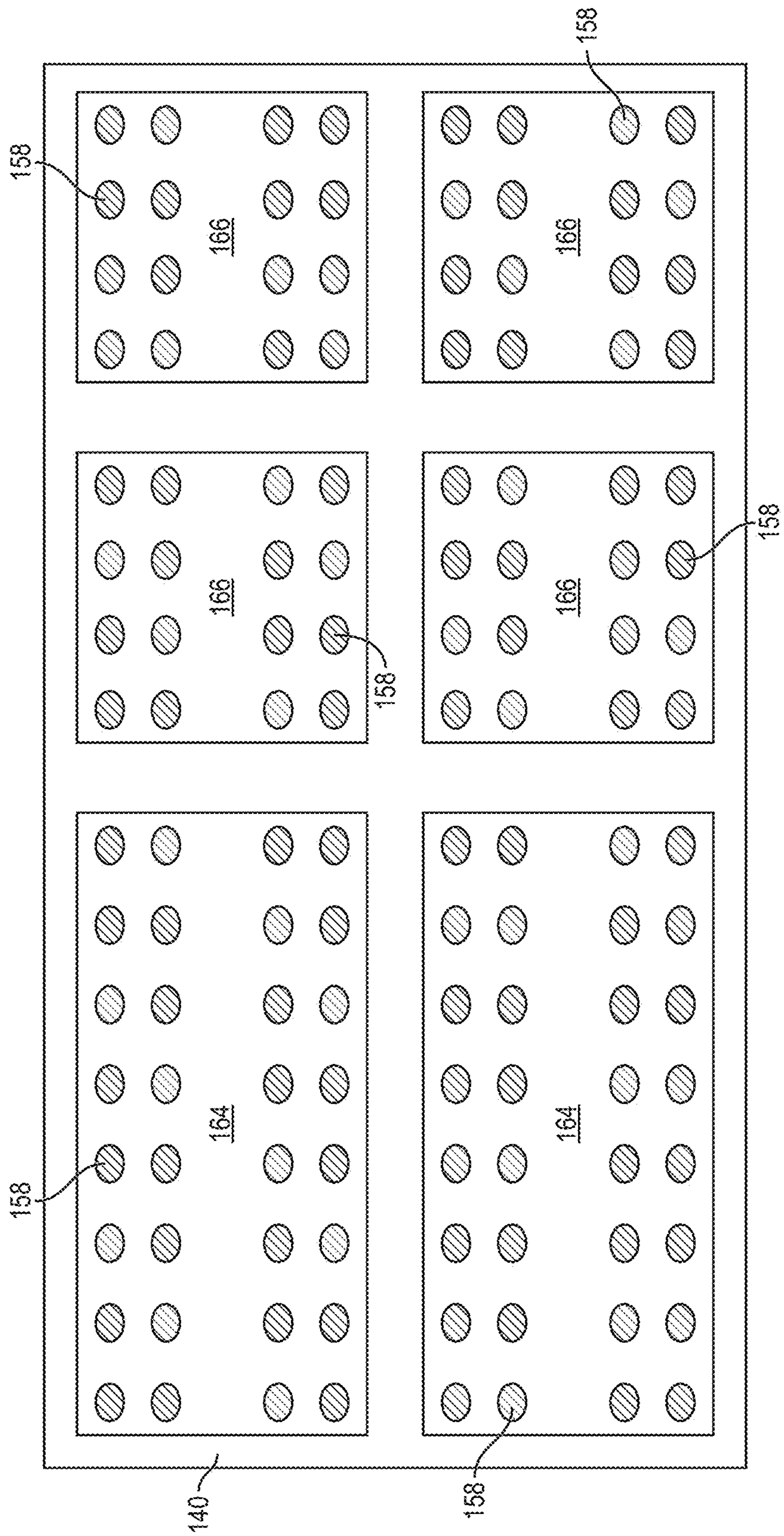

Laminate core 140 with vertical interconnect structures 158 constitute one or more PWB modular vertical interconnect units, which are disposed between semiconductor die or packages to facilitate electrical interconnect for a Fo-PoP. FIG. 4*g* shows a plan view of laminate core 140 organized into PWB modular units 164 and 166. PWB modular units 164 and 166 contain multiple rows of vertical interconnect structures 158 extending between opposing surfaces of the PWB units. PWB units 164 and 166 are configured for integration into Fo-PoP, and as such, differ in size one from another according to a final device configuration as discussed in more detail below. While PWB units 164 and 166 are illustrated in FIG. 4*g* as including square or rectangular footprints, alternatively, the PWB units can include cross-shaped (+), angled or "L-shaped," circular, oval, hexagonal, octagonal, star shaped, or any geometrically shaped footprint. FIG. 4*h* shows laminate core 140 singulated into individual PWB modular units 164 and 166 using saw blade or laser cutting tool 168.

Figure 5A:
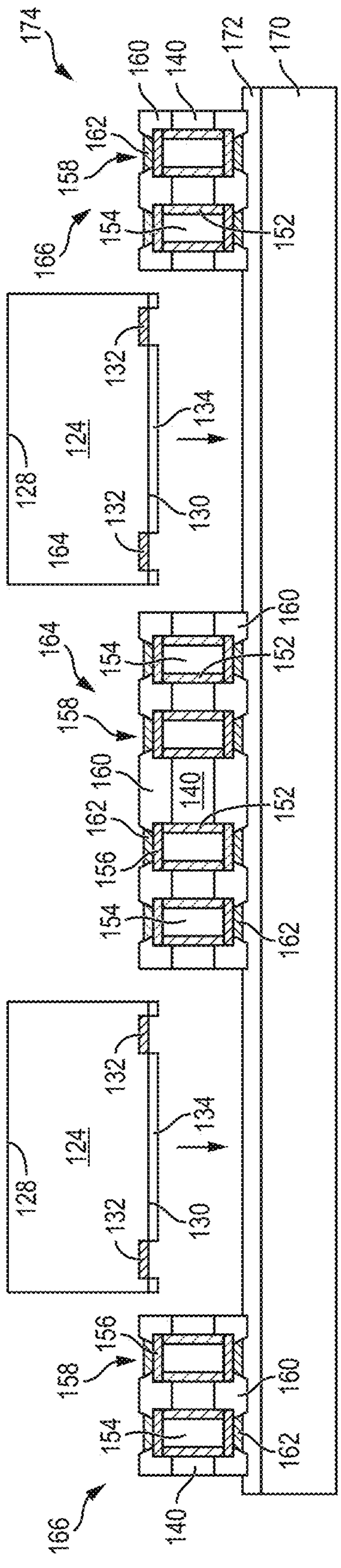
FIGS. 5*a*-5*i* illustrate a process of forming a Fo-PoP with semiconductor die interconnected by PWB modular units having vertical interconnect structures.

FIG. 5*a* shows a cross-sectional view of a portion of a carrier or temporary substrate 170 containing sacrificial base material such as silicon, polymer, beryllium oxide, glass, or other suitable low-cost, rigid material for structural support. An interface layer or double-sided tape 172 is formed over carrier 170 as a temporary adhesive bonding film, etch-stop layer, or thermal release layer.

Carrier 170 can be a round or rectangular panel (greater than 300 mm) with capacity for multiple semiconductor die 124. Carrier 170 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 170 is selected independent of the size of semiconductor die 124 or size of semiconductor wafer 120. That is, carrier 170 has a fixed or standardized size, which can accommodate various size semiconductor die 124 singulated from one or more semiconductor wafers 120. In one embodiment, carrier 170 is circular with a diameter of 330 mm. In another embodiment, carrier 170 is rectangular with a width of 560 mm and length of 600 mm. Semiconductor die 124 may have dimensions of 10 mm by 10 mm, which are placed on the standardized carrier 170. Alternatively, semiconductor die 124 may have dimensions of 20 mm by 20 mm, which are placed on the same standardized carrier 170. Accordingly, standardized carrier 170 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 170 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

Figure 5B:
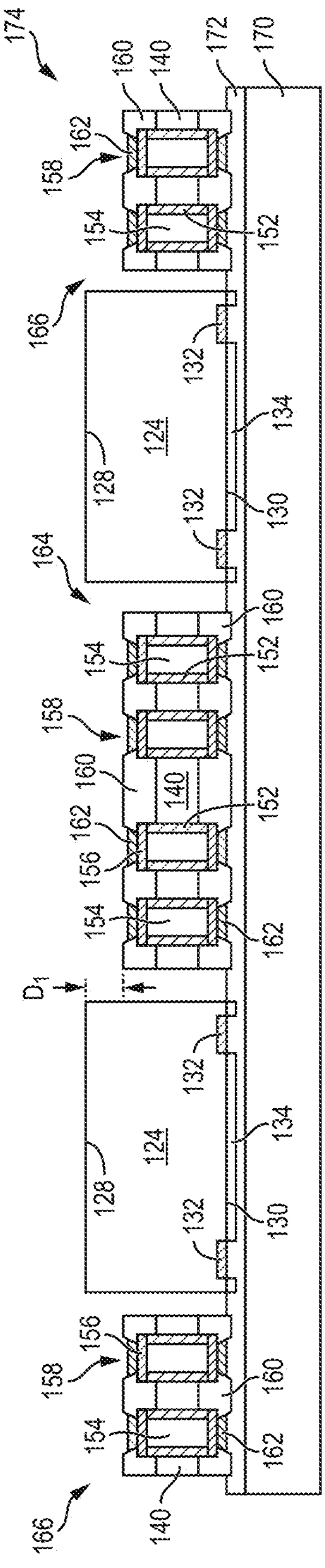

PWB modular units 164 and 166 from FIG. 4*h* are mounted to interface layer 172 and carrier 170 using a pick and place operation. After placing PWB units 164 and 166, semiconductor die 124 from FIG. 3*c* are mounted to interface layer 172 and carrier 170 using a pick and place operation with active surface 130 oriented toward the carrier. FIG. 5*b* shows semiconductor die 124 and PWB units 164 and 166 mounted to carrier 170 as a reconstituted wafer 174. Semiconductor die 124 extend above PWB units 164 and 166 by a distance D1 of greater than 1 μm, e.g., 1-150 μm. The offset between PWB units 164 and 166 and semiconductor die 124 reduces contamination during a subsequent backgrinding step.

Figure 5C:
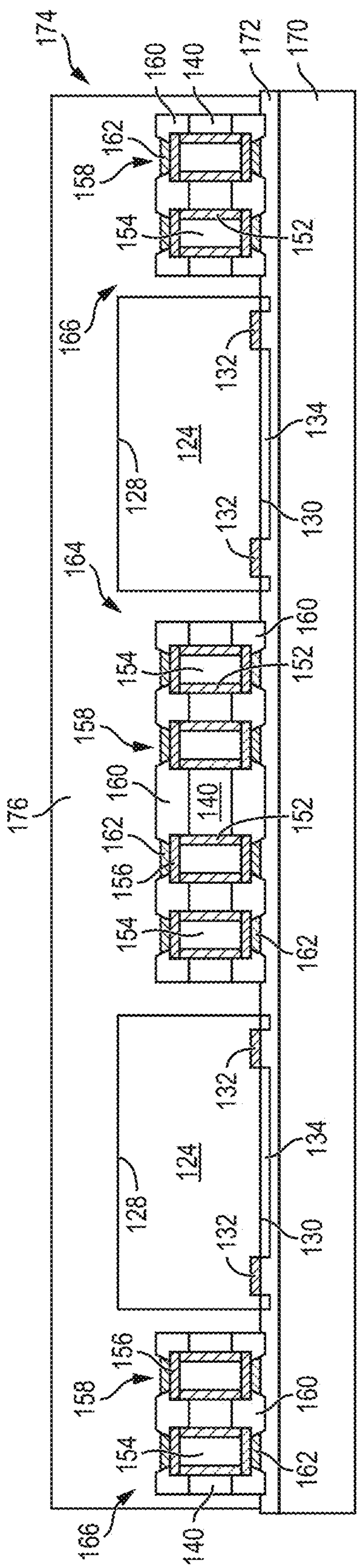

In FIG. 5*c*, an encapsulant or molding compound 176 is deposited over semiconductor die 124, PWB units 164 and 166, and carrier 170 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 is non-conductive and environmentally protects the semiconductor device from external elements and contaminants. Encapsulant 176 also protects semiconductor die 124 from degradation due to exposure to light.

Figure 5D:
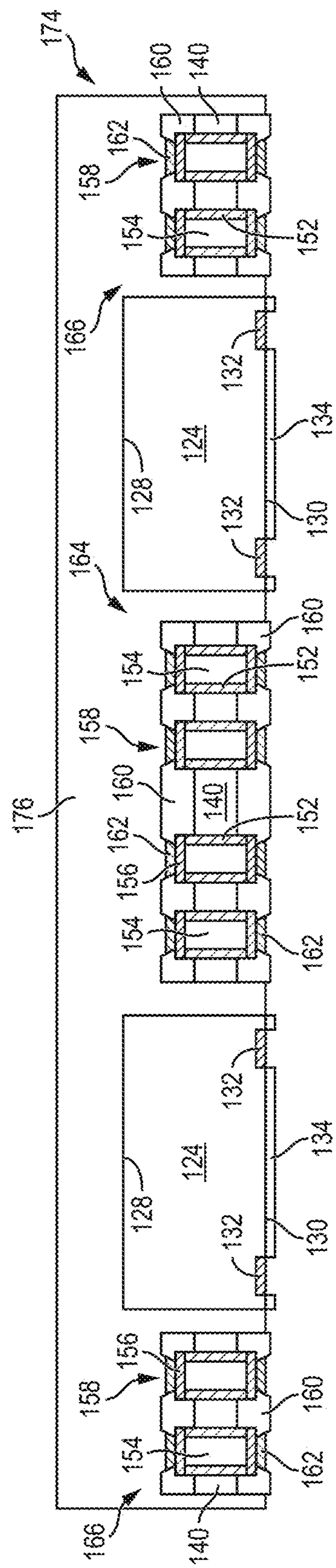

In FIG. 5*d*, carrier 170 and interface layer 172 are removed by chemical etching, mechanical peeling, chemical mechanical polishing (CMP,) mechanical grinding, thermal bake, UV light, laser scanning, or wet stripping to expose insulating layer 134 of semiconductor die 124, PWB units 164 and 166, and encapsulant 176.

Figure 5E:
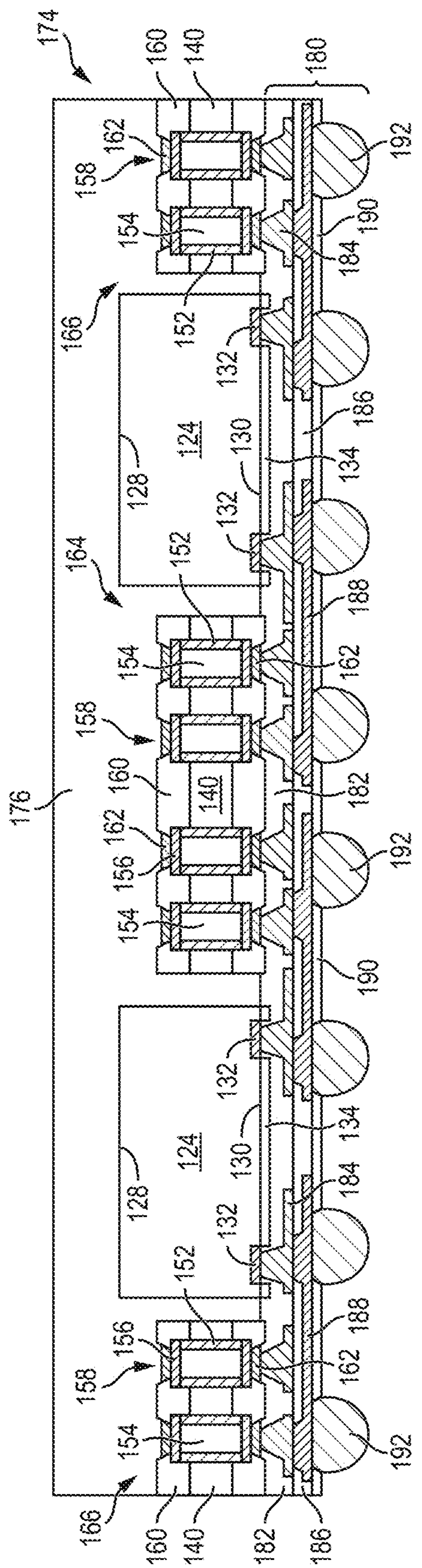
Figure 5F:
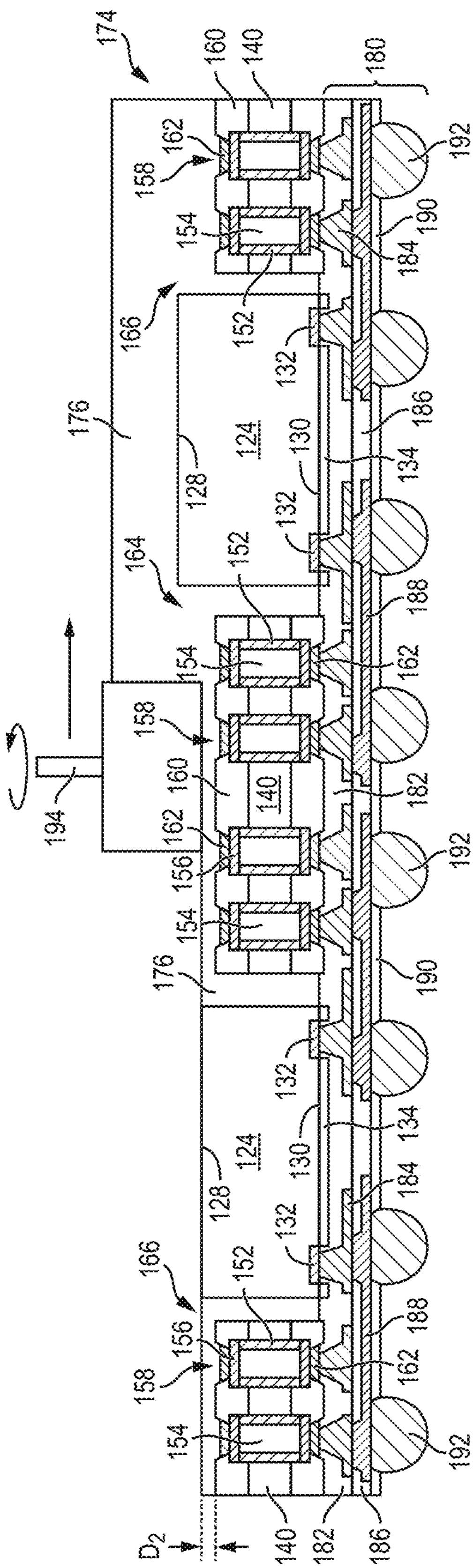

In FIG. 5*e*, a build-up interconnect structure 180 is formed over semiconductor die 124, PWB units 164 and 166, and encapsulant 176. An insulating or passivation layer 182 is formed over semiconductor die 124, PWB units 164 and 166, and encapsulant 176 using PVD, CVD, lamination, printing, spin coating, or spray coating. The insulating layer 182 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 182 is removed by an etching process or LDA to expose vertical interconnect structures 158 of PWB units 164 and 166 and conductive layer 132 of semiconductor die 124.

An electrically conductive layer or RDL 184 is formed over insulating layer 182 using a patterning and metal deposition process such as sputtering, electrolytic plating, and electroless plating. Conductive layer 184 can be one or more layers of Al, Cu, Sn, Ni, Au, Ag, or other suitable electrically conductive material. In one embodiment, conductive layer 184 contains Ti/Cu, TiW/Cu, or Ti/NiV/Cu. One portion of conductive layer 184 is electrically connected to contact pads 132 of semiconductor die 124. Another portion of conductive layer 184 is electrically connected to vertical interconnect structures 158 of PWB units 164 and 166. Other portions of conductive layer 184 can be electrically common or electrically isolated depending on the design and function of semiconductor die 124.

An insulating or passivation layer 186 is formed over insulating layer 182 and conductive layer 184 using PVD, CVD, lamination, printing, spin coating, or spray coating. The insulating layer 186 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 186 is removed by an etching process or LDA to expose conductive layer 184.

An electrically conductive layer or RDL 188 is formed over conductive layer 184 and insulating layer 186 using a patterning and metal deposition process such as sputtering, electrolytic plating, and electroless plating. Conductive layer 188 can be one or more layers of Al, Cu, Sn, Ni, Au, Ag, or other suitable electrically conductive material. In one embodiment, conductive layer 188 contains Ti/Cu, TiW/Cu, or Ti/NiV/Cu. One portion of conductive layer 188 is electrically connected to conductive layer 184. Other portions of conductive layer 188 can be electrically common or electrically isolated depending on the design and function of semiconductor die 124.

An insulating or passivation layer 190 is formed over insulating layer 186 and conductive layer 188 using PVD, CVD, printing, spin coating, or spray coating. The insulating layer 190 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 190 is removed by an etching process or LDA to expose conductive layer 188.

The number of insulating and conductive layers included within build-up interconnect structure 180 depends on, and varies with, the complexity of the circuit routing design. Accordingly, build-up interconnect structure 180 can include any number of insulating and conductive layers to facilitate electrical interconnect with respect to semiconductor die 124.

An electrically conductive bump material is deposited over build-up interconnect structure 180 and electrically connected to the exposed portion of conductive layer 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 188 using a suitable attachment or bonding process. In one embodiment, the bump material is reflowed by heating the material above the material's melting point to form spherical balls or bumps 192. In some applications, bumps 192 are reflowed a second time to improve electrical contact to conductive layer 188. In one embodiment, bumps 192 are formed over an under bump metallization (UBM) layer. Bumps 192 can also be compression bonded or thermocompression bonded to conductive layer 188. Bumps 192 represent one type of interconnect structure that can be formed over conductive layer 188. The interconnect structure can also use bond wire, conductive paste, stud bump, micro bump, or other electrical interconnect.

In FIG. **5*f*, a portion of encapsulant 176 and semiconductor die 124 is removed by a grinding operation with grinder 194 to planarize the surface and reduce a thickness of the encapsulant. Encapsulant 176 remains over PWB units 164 and 166. A thickness D2 between back surface 128 of semiconductor die and PWB units 164 and 166 is 1-150 μm. In one embodiment, D2 is 100 μm. A chemical etch, CMP, or plasma dry etch can also be used to remove back grinding damage and residue stress on semiconductor die 124 and encapsulant 176** to enhance the package strength.

In FIG. **5*g*, a backside balance layer 196 is applied over encapsulant 176, PWB units 164 and 166, and semiconductor die 124. Backside balance layer 196 balances the coefficient of thermal expansion (CTE), e.g., 30-150 ppm/K, of conductive layers 184 and 188 and reduces warpage in the package. In one embodiment, backside balance layer 196 has a thickness of 10-100 μm. Backside balance layer 196** can be any suitable balance layer with suitable thermal and structural properties, such as resin coated copper (RCC) tape.

In FIG. **5*h*, a portion of backside balance layer 196 and encapsulant 176 is removed to expose vertical interconnect structure 158. Reconstituted wafer 174 is singulated through PWB modular unit 164 using saw blade or laser cutting tool 202 into separate Fo-PoP 204**.

FIG. **5*i* shows Fo-PoP 210 with bumps 198 formed over the exposed vertical interconnect structures 158. Bumps 198 are disposed at least 1 μm below back surface 128 of semiconductor die 124. Alternatively, bumps 198 extend above backside balance layer 196 and can have a height of 25-67% of the thickness of semiconductor die 124**.

PWB modular units 164 and 166 disposed within Fo-PoP 204 can differ in size and shape while still providing through vertical interconnect in the Fo-PoP. PWB modular units 164 and 166 include interlocking footprints having square and rectangular shapes, a cross-shape (+), an angled or "L-shape," a circular or oval shape, a hexagonal shape, an octagonal shape, a star shape, or any other geometric shape. At the wafer level, i.e., before singulation, PWB modular units 164 and 166 are disposed around semiconductor die 124 in an interlocking pattern such that different sides of the semiconductor die are aligned with, and correspond to, a number of different sides of the PWB units in a repeating pattern. PWB units 164 and 166 may include additional metal layers to facilitate design integration and increased routing flexibility.

PWB modular units 164 and 166 provide a cost effective alternative to using standard laser drilling processes for vertical interconnection in Fo-PoP 204 for a number of reasons. First, PWB units 164 and 166 can be made with low cost manufacturing technology such as substrate manufacturing technology. Second, standard laser drilling includes high equipment cost and requires drilling through an entire package thickness, which increases cycle time and decrease manufacturing throughput. Furthermore, the use of PWB units 164 and 166 for vertical interconnection provides an advantage of improved control for vertical interconnection with respect to vertical interconnections formed exclusively by a laser drilling process.

Figure 6A:
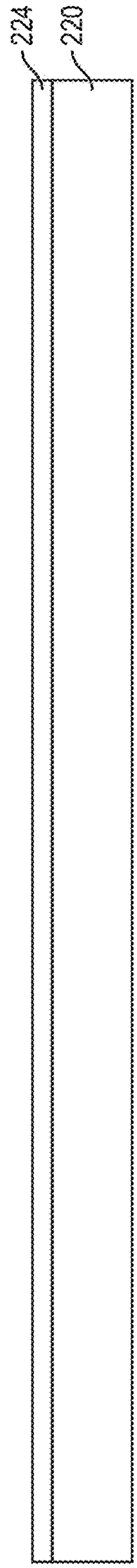
FIGS. 6*a*-6*r* illustrate another process of forming a Fo-PoP with semiconductor die interconnected by PWB modular units having vertical interconnect structures.

In another embodiment, FIG. 6*a* shows a cross-sectional view of a portion of a carrier or temporary substrate 220 containing sacrificial base material such as silicon, polymer, beryllium oxide, glass, or other suitable low-cost, rigid material for structural support. An interface layer or double-sided tape 224 is formed over carrier 220 as a temporary adhesive bonding film, etch-stop layer, or thermal release layer.

Figure 6B:
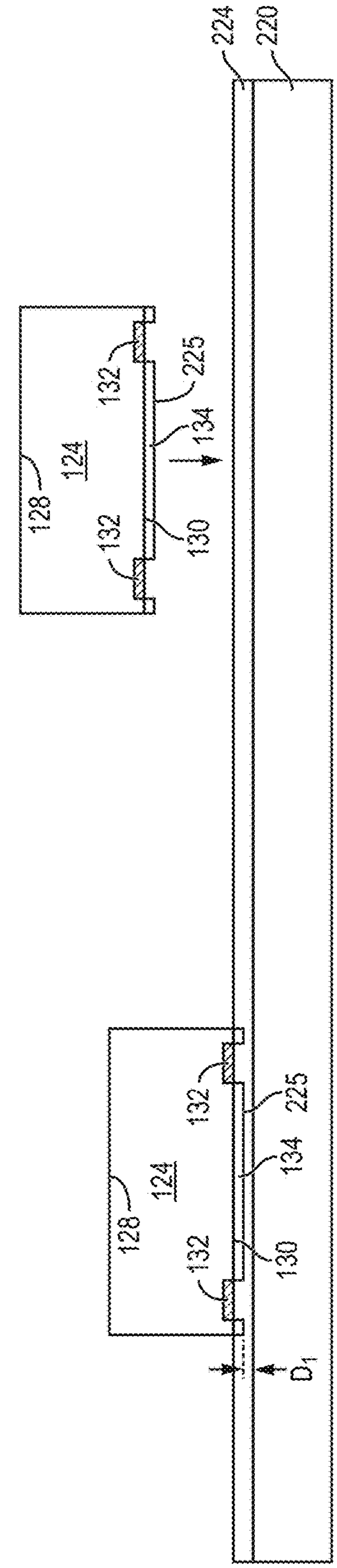

In FIG. 6*b*, semiconductor die 124 from FIG. 3*c* are mounted to interface layer 224 and carrier 220 using a pick and place operation with active surface 130 oriented toward the carrier. Semiconductor die 124 are pressed into interface layer 224 such that insulating layer 134 is disposed into the interface layer. When semiconductor die 124 is mounted to interface layer 224, a surface 225 of insulating layer 134 is separated by a distance D1 from carrier 220.

Figure 6C:
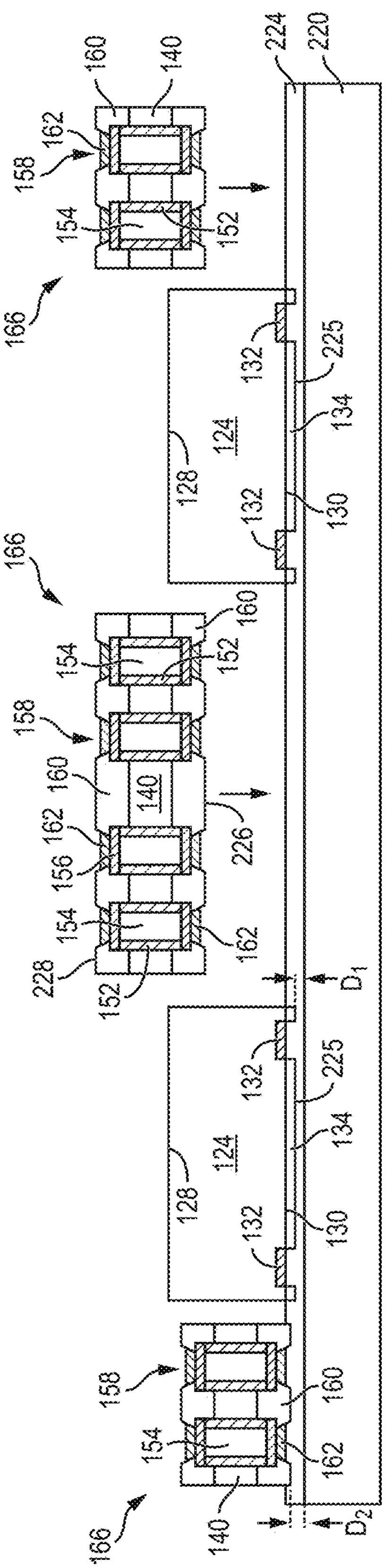

In FIG. 6*c*, PWB modular units 164 and 166 from FIG. 4*h* are mounted to interface layer 224 and carrier 220 using a pick and place operation. PWB units 164 and 166 are pressed into interface layer 224 such that contacting surface 226 is disposed into the interface layer. When PWB units 164 and 166 are mounted to interface layer 224, surface 226 is separated by a distance D2 from carrier 220. D2 may be greater than D1 such that surface 226 of PWB units 164 and 166 is vertically offset with respect to surface 225 of insulating layer 134.

Figure 6D:
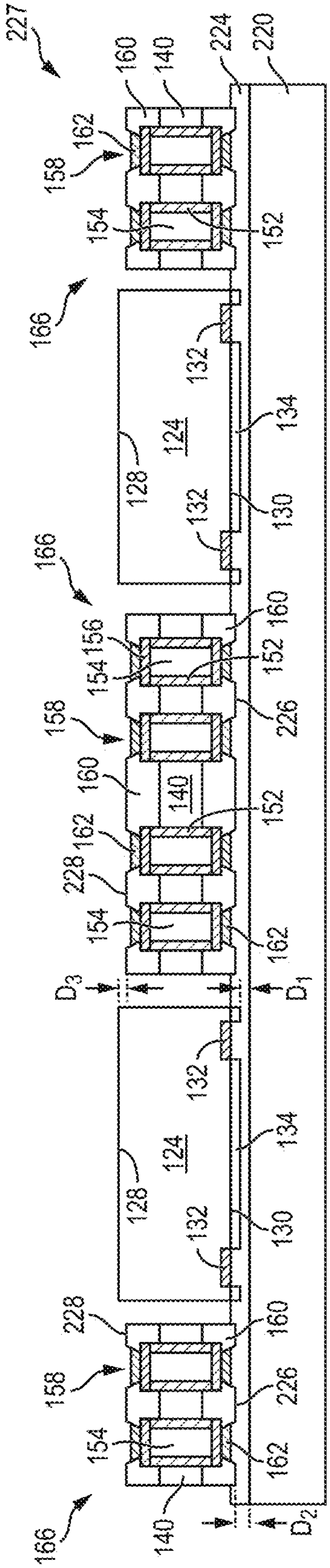

FIG. 6*d* shows semiconductor die 124 and PWB modular units 164 and 166 mounted to carrier 220 as a reconstituted wafer 227. A surface 228 of PWB units 164 and 166, opposite surface 226, is vertically offset with respect to back surface 128 of semiconductor die 124 by a distance of D3, e.g., 1-150 μm. By separating surface 228 of PWB units 166 and back surface 128 of semiconductor die 124, material from vertical interconnect structures 158, such as Cu, is prevented from contaminating a material of semiconductor die 124, such as Si, during a subsequent backgrinding step.

Figure 6E:
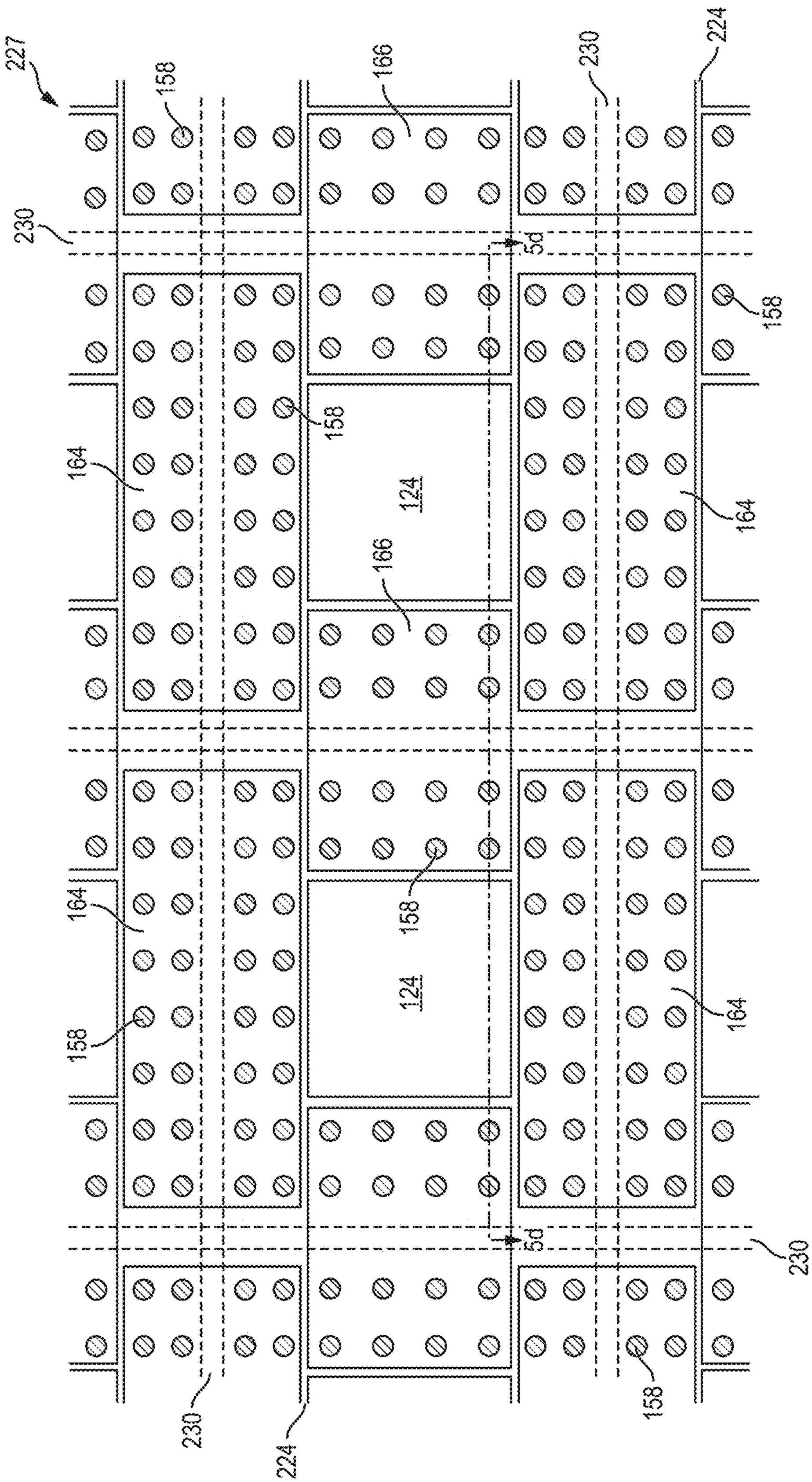

FIG. 6*e* shows a plan view of a portion of reconstituted wafer 227 having PWB modular units 164 and 166 mounted over interface layer 224. PWB units 164 and 166 contain multiple rows of vertical interconnect structures 158 that provide through vertical interconnection between opposing sides of the PWB units. PWB units 164 and 166 are disposed around semiconductor die 124 in an interlocking pattern. PWB units 164 and 166 are disposed around semiconductor die 124 in such a way that different sides of the semiconductor die are aligned with, and correspond to, a number of different sides of the PWB units in a repeating pattern across reconstituted wafer 227. A plurality of saw streets 230 is aligned with respect to semiconductor die 124 and extend across PWB units 164 and 166 such that when reconstituted wafer 227 is singulated along the saw streets, each semiconductor die 124 has a plurality of vertical interconnect structures 158 from singulated PWB units 164 and 166 that are disposed around, or in a peripheral region around, the semiconductor die. While PWB units 164 and 166 are illustrated with interlocking square and rectangular footprints, the PWB units disposed around semiconductor die 124 can include PWB units having footprints with a cross-shape (+), an angled or "L-shape," a circular or oval shape, a hexagonal shape, an octagonal shape, a star shape, or any other geometric shape.

Figure 6F:
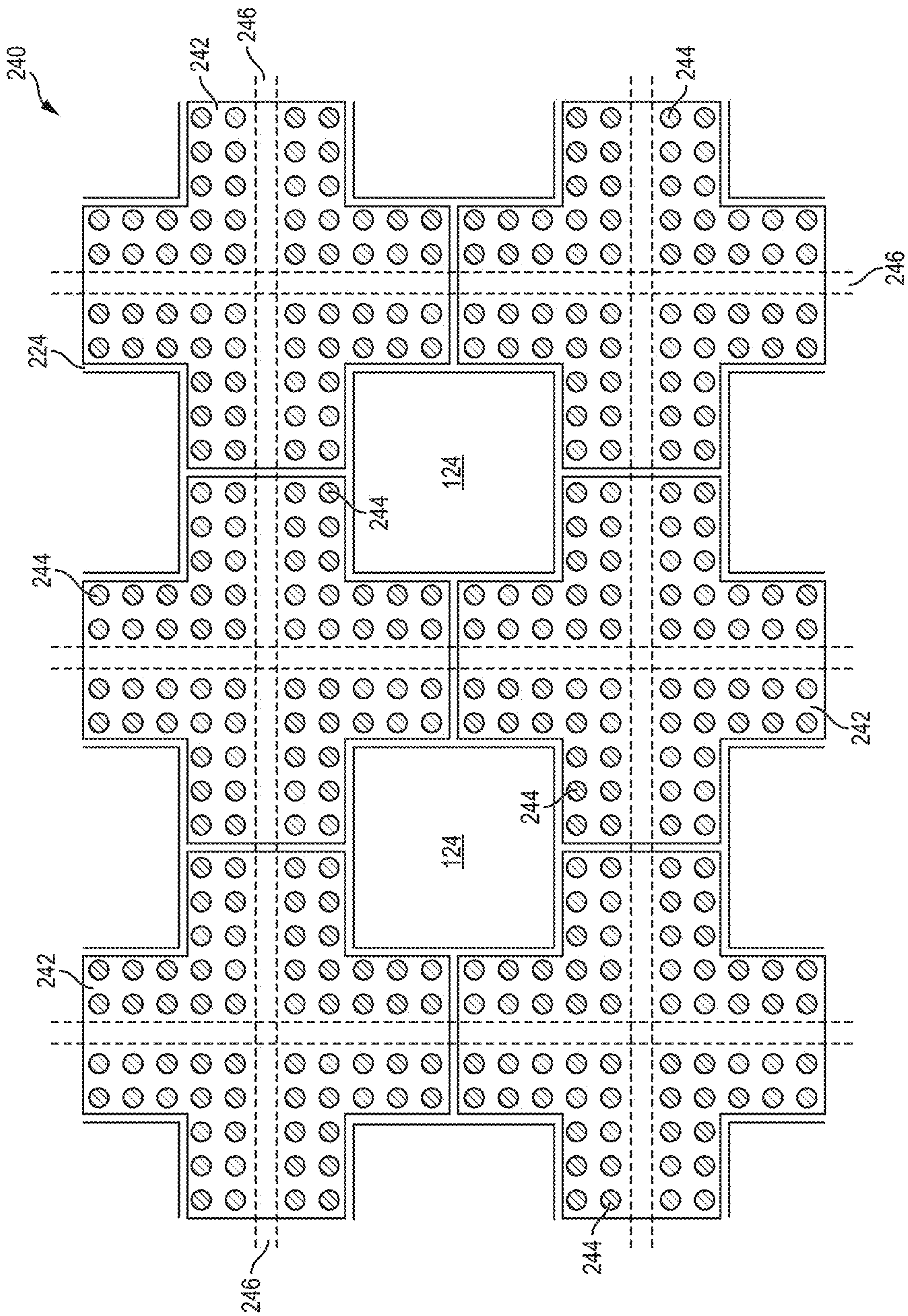

FIG. 6*f* shows a plan view of a portion of a reconstituted wafer 240 having cross-shaped (+) PWB modular units 242 mounted over interface layer 224. PWB units 242 are formed in a process similar to PWB units 164 and 166 as shown in FIGS. 4*a*-4*h*. PWB units 242 contain multiple rows of vertical interconnect structures 244 that are similar to vertical interconnect structures 158, and provide through vertical interconnection between opposing sides of the PWB units. PWB units 242 are disposed around semiconductor die 124 in an interlocking pattern. PWB units 242 are disposed around semiconductor die 124 in such a way that different sides of the semiconductor die are aligned with, and correspond to, a number of different sides of the PWB units in a repeating pattern across reconstituted wafer 240. A plurality of saw streets 246 is aligned with respect to semiconductor die 124 and extend across PWB units 242 such that when reconstituted wafer 240 is singulated along the saw streets, each semiconductor die 124 has a plurality of vertical interconnect structures 244 from singulated PWB units 242 disposed around, or in a peripheral region around, the semiconductor die. Vertical interconnect structures 244 are disposed in one or more rows offset from a perimeter of the semiconductor die after singulation through saw streets 246.

Figure 6G:
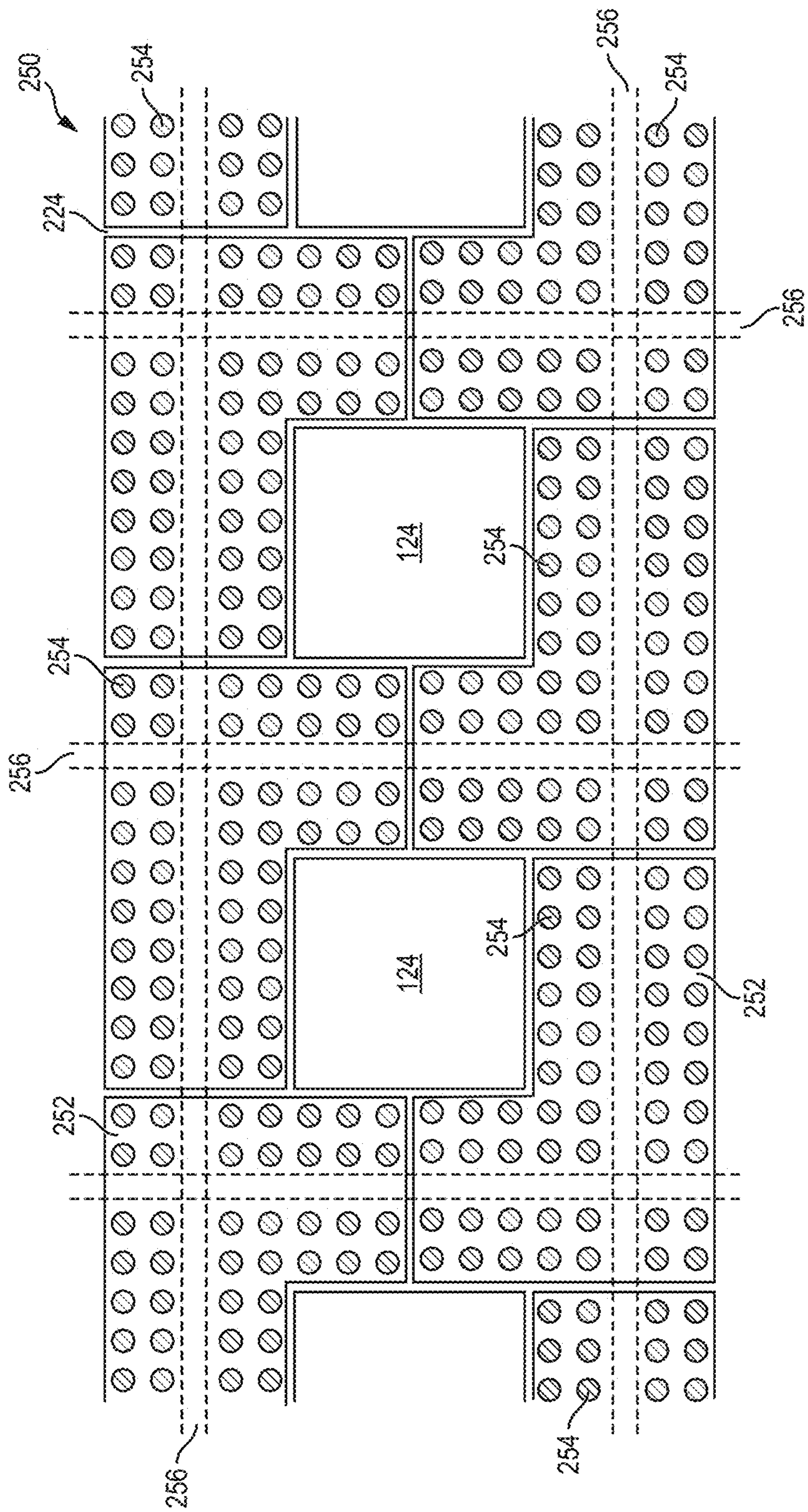

FIG. 6*g* shows a plan view of a portion of a reconstituted wafer 250 having angled or "L-shaped" PWB modular units 252 mounted over interface layer 224. PWB units 252 are formed in a process similar to PWB units 164 and 166 as shown in FIGS. 4*a*-4*h*. PWB units 252 contain multiple rows of vertical interconnect structures 254 that are similar to vertical interconnect structures 158, and provide through vertical interconnection between opposing sides of the PWB units. PWB units 252 are disposed around semiconductor die 124 in an interlocking pattern. PWB units 252 are disposed around semiconductor die 124 in such a way that different sides of the semiconductor die are aligned with, and correspond to, a number of different sides of the PWB units in a repeating pattern across reconstituted wafer 250. A plurality of saw streets 256 is aligned with respect to semiconductor die 124 and extend across PWB units 252 such that when reconstituted wafer 250 is singulated along the saw streets, each semiconductor die 124 has a plurality of vertical interconnect structures 254 from singulated PWB units 252 disposed around, or in a peripheral region around, the semiconductor die. Vertical interconnect structures 254 are disposed in one or more rows offset from a perimeter of the semiconductor die after singulation through saw streets 256.

Figure 6H:
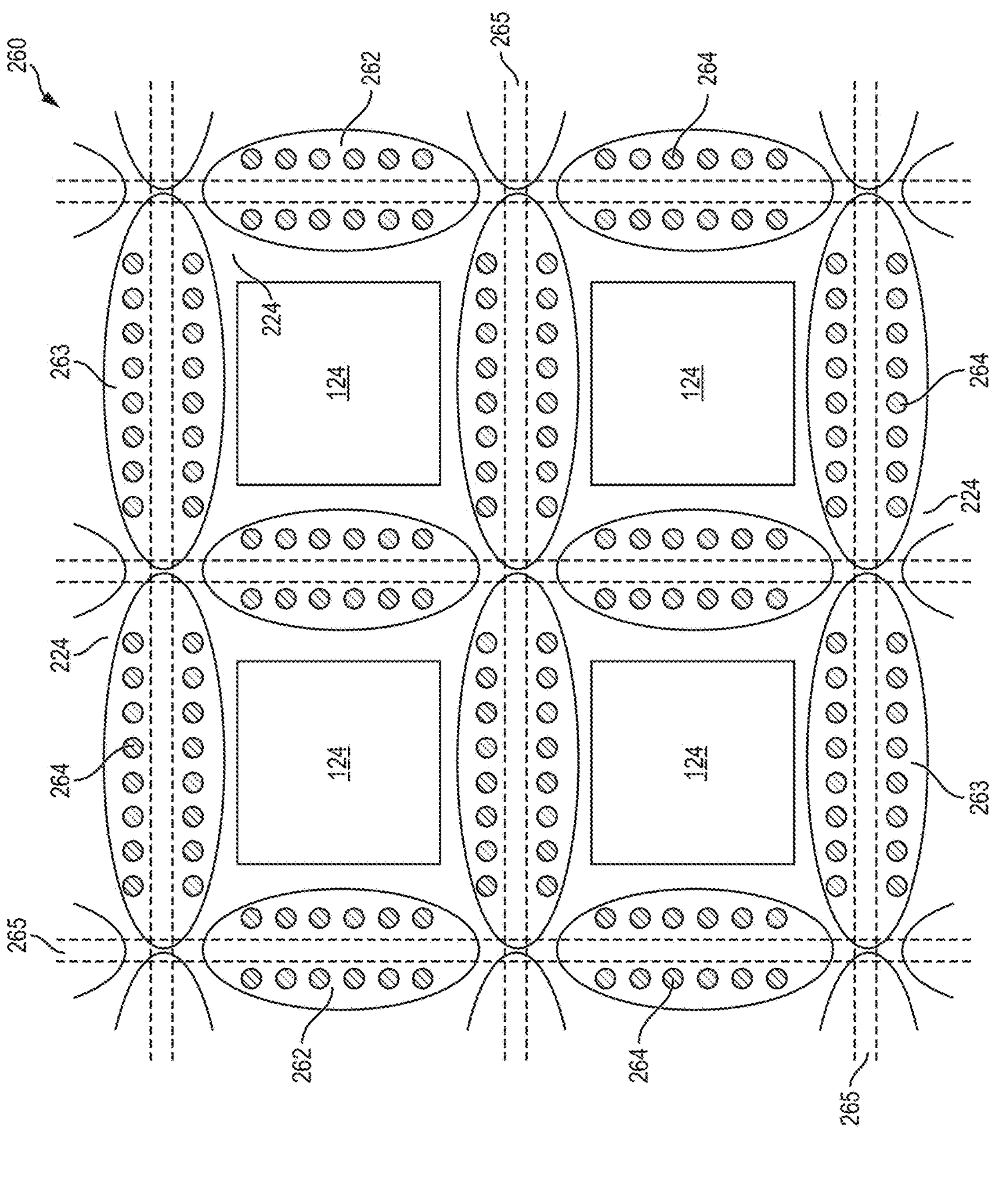

FIG. 6*h* shows a plan view of a portion of a reconstituted wafer 260 having circular or oval shaped PWB modular units 262 and 263 mounted over interface layer 224. PWB units 262 and 263 are formed in a process similar to PWB units 164 and 166 as shown in FIGS. 4*a*-4*h*. PWB units 262 and 263 contain multiple rows of vertical interconnect structures 264 that are similar to vertical interconnect structures 158, and provide through vertical interconnection between opposing sides of the PWB units. PWB units 262 and 263 are disposed around semiconductor die 124 in an interlocking pattern. PWB units 262 and 263 are disposed around semiconductor die 124 in such a way that different sides of the semiconductor die are aligned with, and correspond to, a number of different portions of the PWB units in a repeating pattern across reconstituted wafer 260. A plurality of saw streets 265 is aligned with respect to semiconductor die 124 and extend across PWB units 262 and 263 such that when reconstituted wafer 260 is singulated along the saw streets, each semiconductor die 124 has a plurality of vertical interconnect structures 264 from singulated PWB units 262 and 263 disposed around, or in a peripheral region around, the semiconductor die. Vertical interconnect structures 264 are disposed in one or more rows offset from a perimeter of the semiconductor die after singulation through saw streets 265.

Figure 6I:
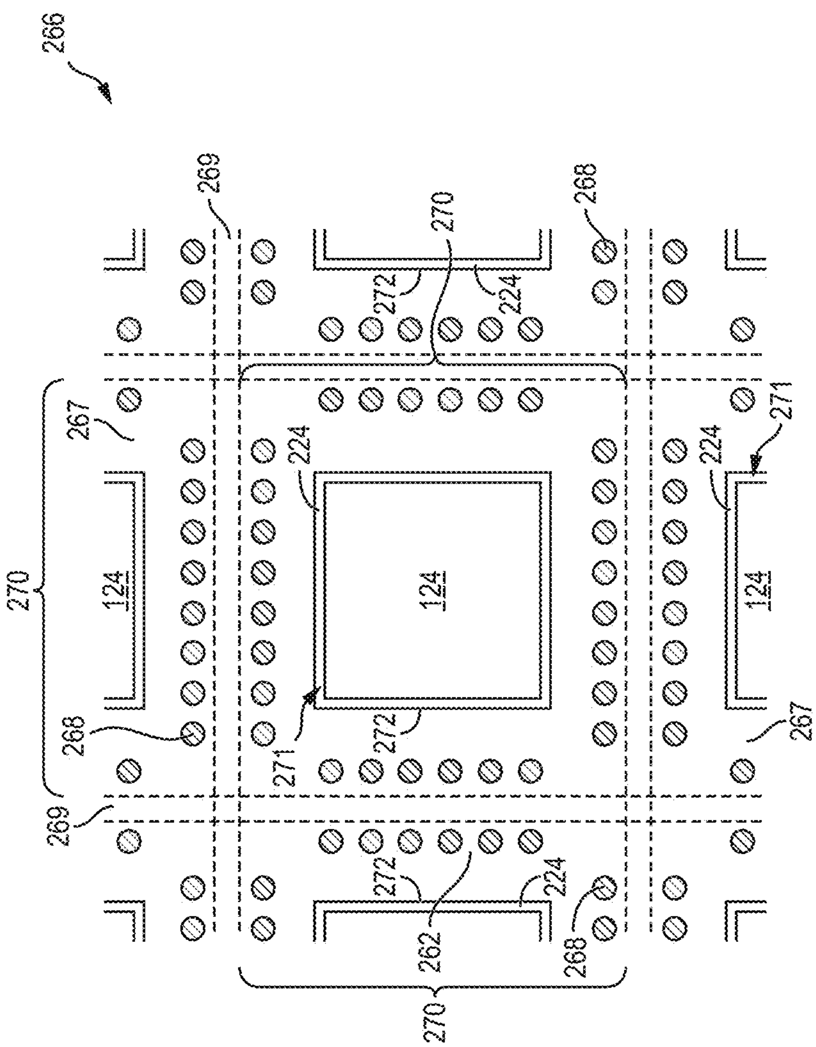

FIG. 6*i* shows a plan view of a portion of a reconstituted wafer 266 having a continuous PWB or PCB panel 267 mounted over interface layer 224. PWB panel 267 is aligned with and laminated on interface layer 224 on temporary carrier 220. PWB panel 267 is formed in a process similar to PWB units 164 and 166 as shown in FIGS. 4*a*-4*h*, and is formed at panel scale, for example as a 300-325 mm round panel or 470 mm×370 mm rectangular panel. The final panel size is about 5 mm to 15 mm smaller than final fan-out panel substrate size in either diameter or length or width. PWB panel 267 has a thickness ranging from 50-250 μm. In one embodiment, PWB panel 267 has a thickness of 80 μm. Multiple rows of vertical interconnect structures 268 that are similar to vertical interconnect structures 158 are formed through PWB panel 267. A plurality of saw streets 265 separates PWB panel 267 into individual PWB units 270. Vertical interconnect structures 268 are formed around a peripheral area of PWB unit 270.

A central portion of each PWB unit 270 is removed by punching, etching, LDA, or other suitable process to form openings 271. Openings 271 are formed centrally with respect to the vertical interconnect structures 268 of each PWB unit 270 and are formed through PWB units 270 to expose interface layer 224. Openings 271 have a generally square footprint and are formed large enough to accommodate semiconductor die 124 from FIG. 3*c*. Semiconductor die 124 are mounted to interface layer 224 within openings 271 using a pick and place operation with active surface 130 of semiconductor die 124 oriented toward interface layer 224. The clearance or distance between the edge 272 of opening 271 and semiconductor die 124 is at least 50 μm. PWB panel 267 is singulated along saw streets 269 into individual PWB units 270, and each semiconductor die 124 has a plurality of vertical interconnect structures 268 disposed around or in a peripheral region of the semiconductor die. Vertical interconnect structures 268 can be disposed in the peripheral region of semiconductor 124 as one or more rows offset from a perimeter of the semiconductor die after singulation through saw streets 269.

Figure 6J:
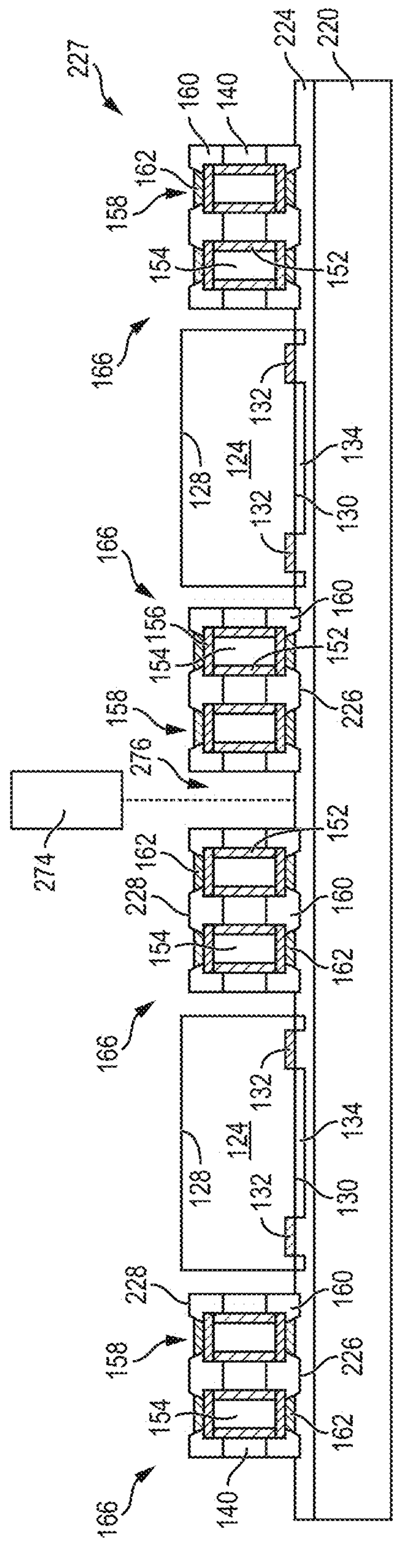

Continuing from FIG. 6*d*, FIG. 6*j* shows that after semiconductor die 124 and PWB modular units 164 and 166 are mounted to interface layer 224, reconstituted wafer 227 is partially singulated through saw street 230 using a saw blade or laser cutting tool 274 to form channels or openings 276. Channel 276 extends through PWB units 164 and 166, and additionally may extend through interface layer 224 and partially but not completely through carrier 220. Channel 276 forms a separation among vertical interconnect structures 158 and the semiconductor die 124 to which the conductive vias will be subsequently joined in a Fo-PoP.

Figure 6K:
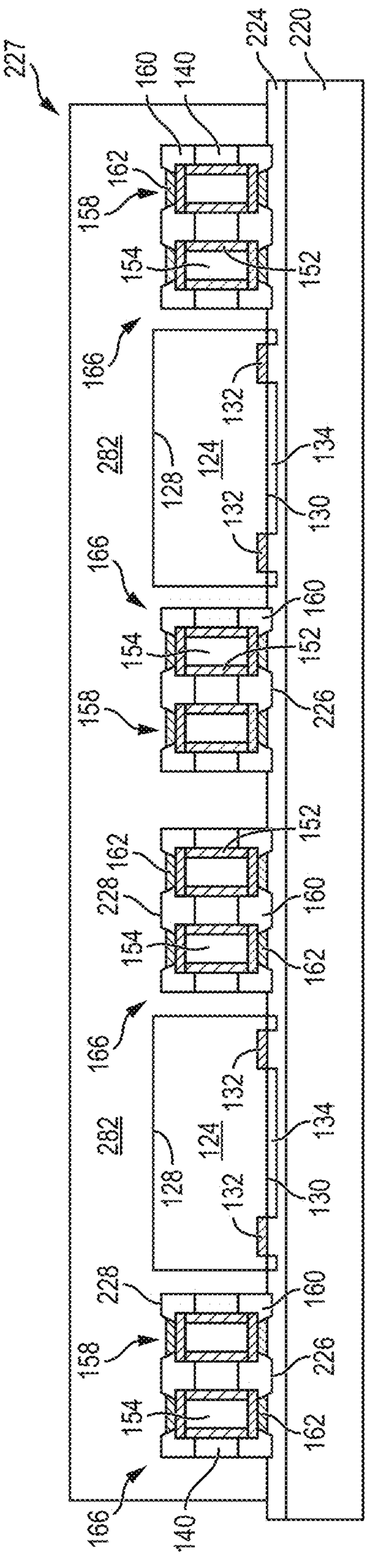

In FIG. 6*k*, an encapsulant or molding compound 282 is deposited over semiconductor die 124, PWB units 164 and 166, and carrier 220 using a paste printing, compressive molding, transfer molding, liquid encapsulant molding, vacuum lamination, spin coating, or other suitable applicator. Encapsulant 282 can be polymer composite material, such as epoxy resin with filler, epoxy acrylate with filler, or polymer with proper filler. Encapsulant 282 is non-conductive and environmentally protects the semiconductor device from external elements and contaminants. Encapsulant 282 also protects semiconductor die 124 from degradation due to exposure to light.

Figure 6L:
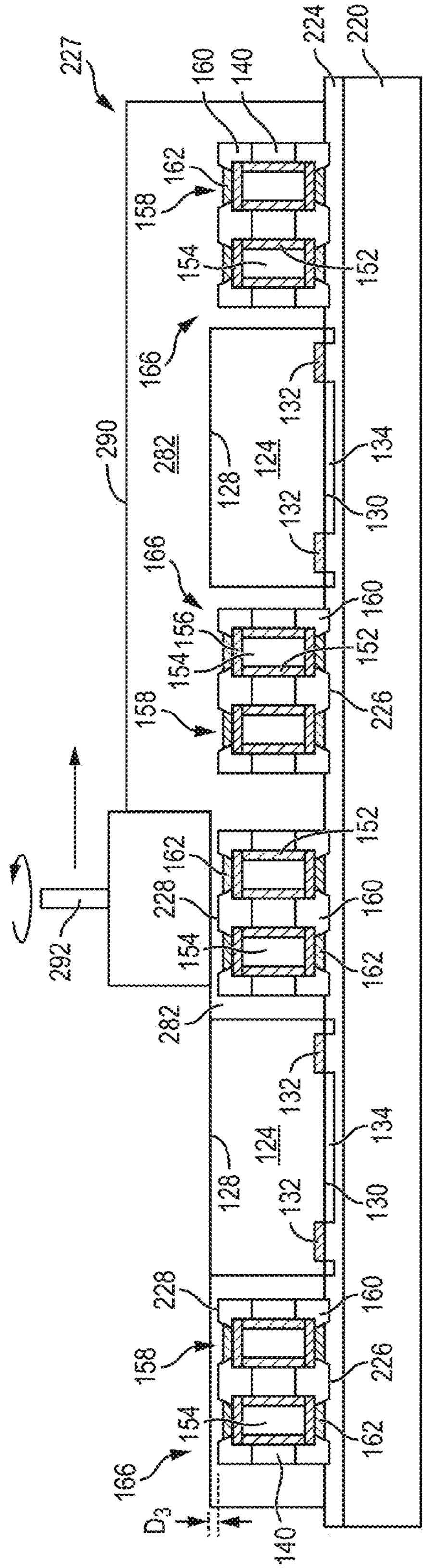

In FIG. 6*l*, surface 290 of encapsulant 282 undergoes a grinding operation with grinder 292 to planarize the surface and reduce a thickness of the encapsulant. The grinding operation removes a portion of encapsulant material down to back surface 128 of semiconductor die 124. A chemical etch can also be used to remove and planarize encapsulant 282. Because surface 228 of PWB units 166 is vertically offset with respect to back surface 128 of semiconductor die 124 by distance D3, the removal of encapsulant 282 can be achieved without removing, and incidentally transferring, material from vertical interconnect structures 158, such as Cu, to semiconductor die 124, such as Si. Preventing the transfer of conductive material from vertical interconnect structures 158 to semiconductor die 124 reduces a risk of contaminating a material of the semiconductor die.

Figure 6M:
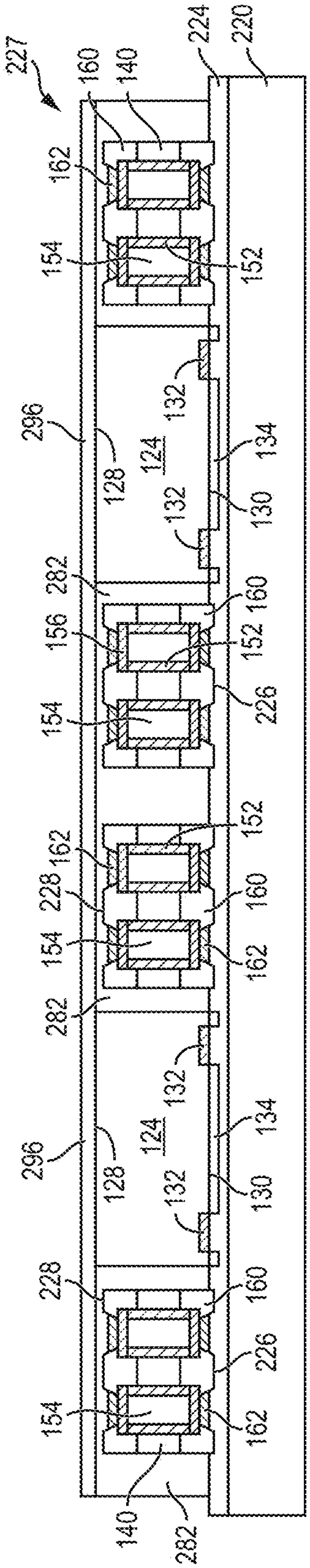

In FIG. 6*m*, an insulating or passivation layer 296 is conformally applied over encapsulant 282 and semiconductor die 124 using PVD, CVD, screen printing, spin coating, or spray coating. The insulating layer 296 contains one or more layers of SiO2, Si3N4, SiON, Ta2O5, Al2O3, or other material having similar insulating and structural properties. The insulating layer 296 uniformly covers encapsulant 282 and semiconductor die 124 and is formed over PWB units 164 and 166. The insulating layer 296 is formed after the removal of a first portion of encapsulant 282 and contacts the exposed back surface 128 of semiconductor die 124. The insulating layer 296 is formed before a second portion of encapsulant 282 is removed to expose PWB units 164 and 166. In one embodiment, properties of insulating layer 296 are selected to help control warping of the subsequently formed Fo-PoP.

Figure 6N:
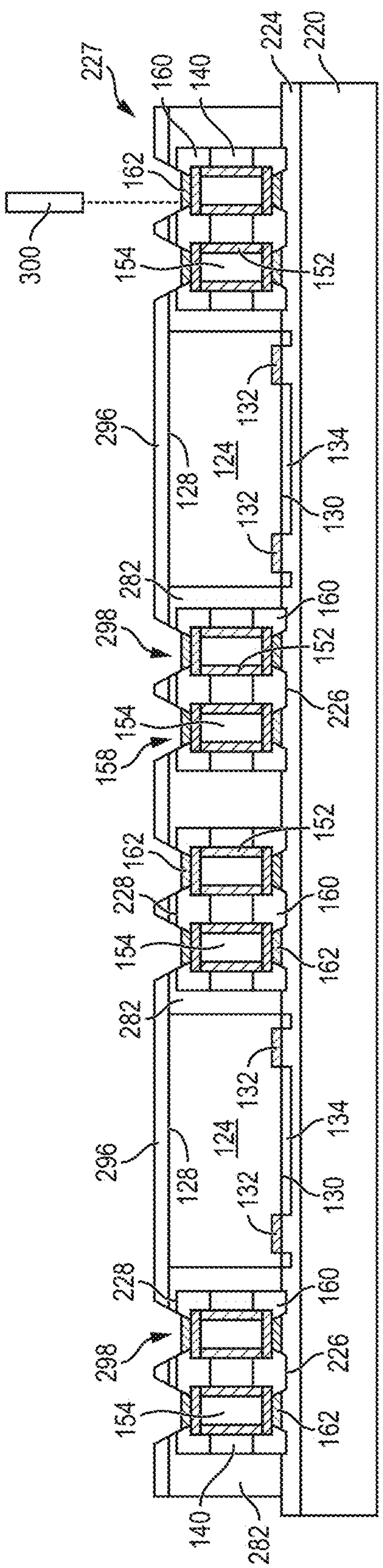

In FIG. 6*n*, a portion of insulating layer 296 and encapsulant 282 is removed to form openings 298 and expose vertical interconnect structures 158. Openings 298 are formed by etching, laser, or other suitable process. In one embodiment, openings 298 are formed by LDA using laser 300. Material from vertical interconnect structures 158 is prevented from contacting semiconductor die 124 during removal of encapsulant 282 because openings 298 are formed over vertical interconnect structures 158 around or in a peripheral region around semiconductor die 124, such that vertical interconnect structures 158 are offset with respect to semiconductor die 124 and do not extend to back surface 128. Furthermore, openings 298 are not formed at a time when encapsulant 282 is being removed from over back surface 128 and at a time when semiconductor die 124 is exposed and susceptible to contamination. Because openings 298 are formed after insulating layer 296 is disposed over semiconductor die 124, the insulating layer acts as a barrier to material from vertical interconnect structures 158 being transferred to semiconductor die 124.

Figure 6O:
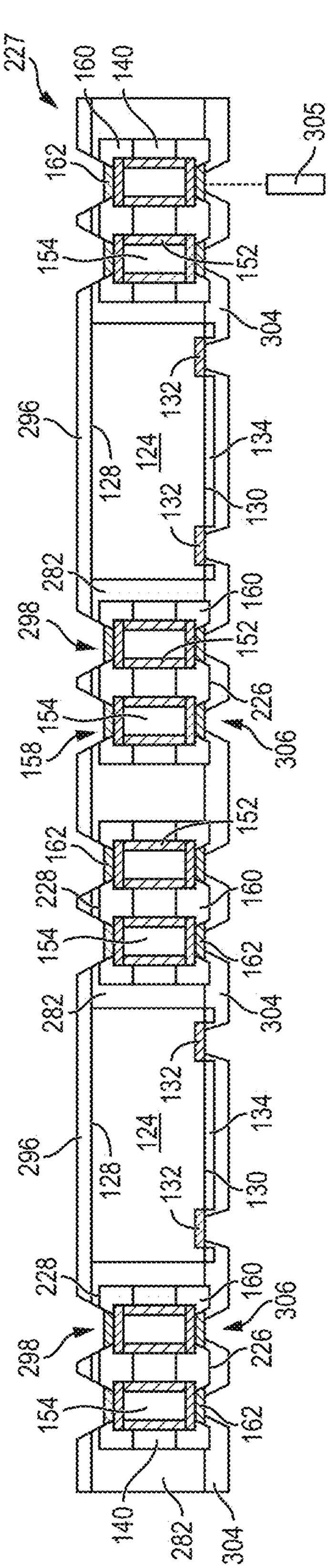

In FIG. 6*o*, carrier 220 and interface layer 224 are removed from reconstituted wafer 227 by chemical etching, mechanical peeling, CMP, mechanical grinding, thermal bake, UV light, laser scanning, or wet stripping to facilitate the formation of an interconnect structure over active surface 130 of semiconductor die 124 and vertical interconnect structures 158 of PWB units 164 and 166.

In FIG. 6*o* also shows a first portion of an interconnect or RDL is formed by the deposition and patterning of insulating or passivation layer 304. The insulating layer 304 is conformally applied to, and has a first surface that follows the contours of, encapsulant 282, PWB units 164 and 166, and semiconductor die 124. The insulating layer 304 has a second planar surface opposite the first surface. The insulating layer 304 contains one or more layers of SiO2, Si3N4, SiON, Ta2O5, Al2O3, low temperature (less than 250° C.) curing polymer dielectric with or without filler, or other material having similar insulating and structural properties.

Insulating layer 304 is deposited using PVD, CVD, lamination, printing, spin coating, spray coating, or other suitable process. A portion of insulating layer 304 is removed by LDA using laser 305, etching, or other suitable process to form openings 306 over vertical interconnect structures 158. Openings 306 expose vertical interconnect structures 158 and conductive layer 132 of semiconductor die 124 for subsequent electrical connection according to the configuration and design of semiconductor die 124.

Figure 6P:
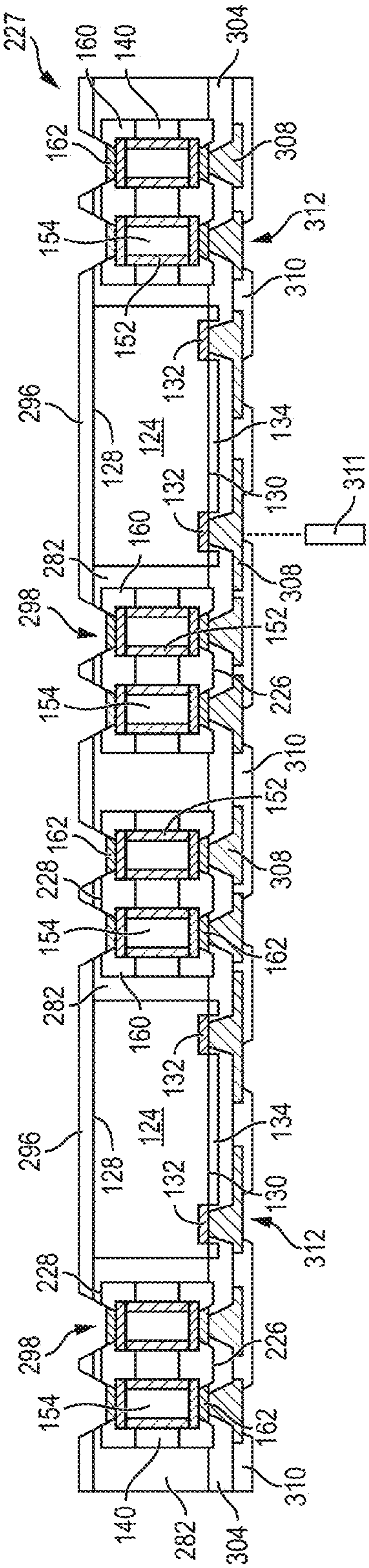

In FIG. 6*p*, an electrically conductive layer 308 is patterned and deposited over insulating layer 304, over semiconductor die 124, and disposed within openings 306 to fill the openings and contact conductive layer 162 of vertical interconnect structures 158 as well as contact conductive layer 132 of semiconductor die 124. Conductive layer 308 can be one or more layers of Al, Cu, Sn, Ni, Au, Ag, or other suitable electrically conductive material. The deposition of conductive layer 308 uses PVD, CVD, electrolytic plating, electroless plating, or other suitable process. Conductive layer 308 operates as an RDL to extend electrical connection from semiconductor die 124 to points external to semiconductor die 124.

FIG. 6*p* also shows an insulating or passivation layer 310 is conformally applied to, and follows the contours of, insulating layer 304 and conductive layer 308. Insulating layer 310 contains one or more layers of SiO2, Si3N4, SiON, Ta2O5, Al2O3, low temperature (less than 250° C.) curing polymer dielectric with or without filler, or other material having similar insulating and structural properties. Insulating layer 310 is deposited using PVD, CVD, printing, spin coating, spray coating, or other suitable process. A portion of insulating layer 310 is removed by LDA using laser 311, etching, or other suitable process to form openings 312. Openings 312 expose portions of conductive layer 308 for subsequent electrical interconnection.

Figure 6Q:
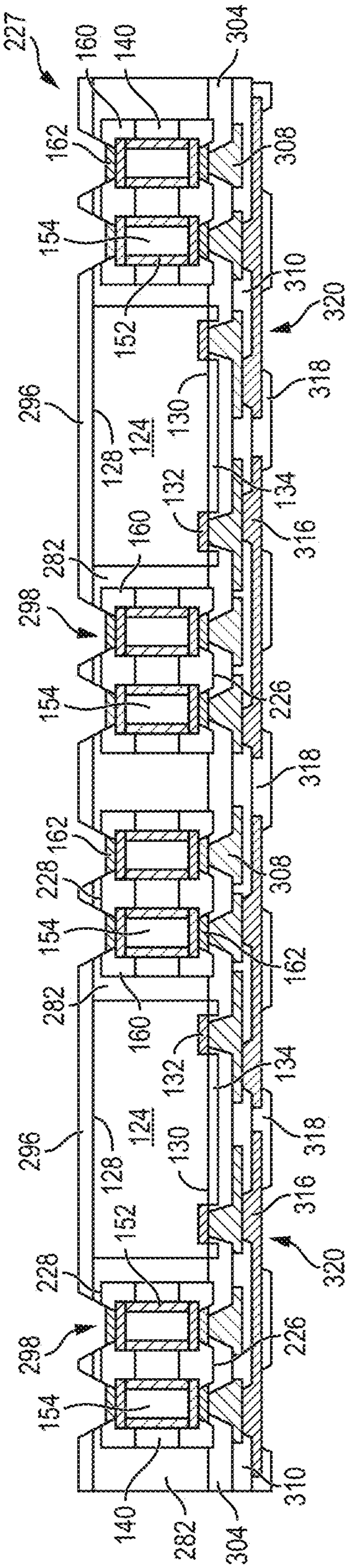

In FIG. 6*q*, an electrically conductive layer or RDL 316 is patterned and deposited over insulating layer 310, conductive layer 308, and within openings 312 to fill the openings and contact conductive layer 308. Conductive layer 316 can be one or more layers of Al, Cu, Sn, Ni, Au, Ag, or other suitable electrically conductive material. The deposition of conductive layer 316 uses PVD, CVD, electrolytic plating, electroless plating, or other suitable process. Conductive layer 316 operates as an RDL to extend electrical connection from semiconductor die 124 to points external to semiconductor die 124.

FIG. 6*q* also shows an insulating or passivation layer 318 is conformally applied to, and follows the contours of, insulating layer 310 and conductive layer 316. The insulating layer 318 contains one or more layers of SiO2, Si3N4, SiON, Ta2O5, Al2O3, low temperature (less than 250° C.) curing polymer dielectric with or without filler, or other material having similar insulating and structural properties. Insulating layer 318 is deposited using PVD, CVD, printing, spin coating, spray coating, or other suitable process. A portion of insulating layer 318 is removed by LDA, etching, or other suitable process to form openings 320. Openings 320 expose portions of conductive layer 316 for subsequent electrical interconnection.

Figure 6R:
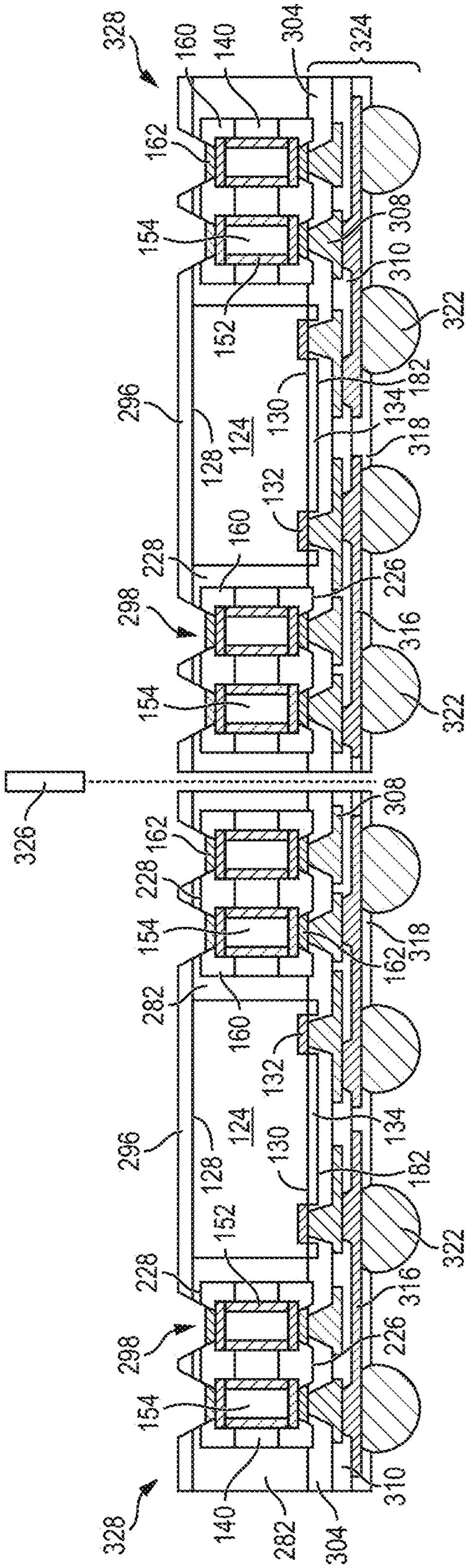

In FIG. 6*r*, an electrically conductive bump material is deposited over conductive layer 316 and within openings 320 of insulating layer 318 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 316 using a suitable attachment or bonding process. In one embodiment, the bump material is reflowed by heating the material above the material's melting point to form spherical balls or bumps 322. In some applications, bumps 322 are reflowed a second time to improve electrical contact to conductive layer 316. In one embodiment, bumps 322 are formed over a UBM. Bumps 322 can also be compression bonded or thermocompression bonded to conductive layer 316. Bumps 322 represent one type of interconnect structure that can be formed over conductive layer 316. The interconnect structure can also use bond wire, conductive paste, stud bump, micro bump, or other electrical interconnect.

Taken together, insulating layers 304, 310, and 318 as well as conductive layers 308, 316, and conductive bumps 322 form build-up interconnect structure 324. The number of insulating and conductive layers included within build-up interconnect structure 324 depends on, and varies with, the complexity of the circuit routing design. Accordingly, build-up interconnect structure 324 can include any number of insulating and conductive layers to facilitate electrical interconnect with respect to semiconductor die 124. Similarly, PWB units 164 and 166 may include additional metal layers to facilitate design integration and increased routing flexibility. Furthermore, elements that would otherwise be included in a backside interconnect structure or RDL can be integrated as part of build-up interconnect structure 324 to simplify manufacturing and reduce fabrication costs with respect to a package including both front side and backside interconnects or RDLs.

FIG. 6*r* further shows that reconstituted wafer 227 with build-up interconnect structure 324 is singulated using a saw blade or laser cutting tool 326 to form individual Fo-PoP 328. In one embodiment, Fo-PoP 328 has a height of less than 1 mm. PWB modular units 164 and 166 within Fo-PoP 328 provide a cost effective alternative to using standard laser drilling processes for vertical interconnection in Fo-PoP 328 for a number of reasons. First, PWB units 164 and 166 can be made with low cost manufacturing technology such as substrate manufacturing technology rather than standard laser drilling that includes high equipment cost and requires drilling through an entire package thickness, which increases cycle time and decreases manufacturing throughput. Furthermore, the use of PWB unites 164 and 166 for Fo-PoP vertical interconnection provides an advantage of improved control for vertical interconnection with respect to vertical interconnections formed exclusively by a laser drilling process.

PWB modular units 164 and 166 contain one or multiple rows of vertical interconnect structures 158 that provide through vertical interconnection between opposing sides of the PWB units and are configured to be integrated into subsequently formed Fo-PoP. Vertical interconnect structures 158 include vias 150 that are left void or alternatively filled with filler material 154, e.g., conductive material or insulating material. Filler material 154 is specially selected to be softer or more compliant than conductive layer 152. Filler material 154 reduces the incidence of cracking or delamination by allowing vertical interconnect structures 158 to deform or change shape under stress. In one embodiment, vertical interconnect structures 158 include conductive layer 162 that is a copper protection layer for preventing oxidation of the conductive via, thereby reducing yield loss in SMT applications.

PWB modular units 164 and 166 are disposed within Fo-PoP 328 such that surface 228 of PWB units 166 and a corresponding surface of PWB units 164 are vertically offset with respect to back surface 128 of semiconductor die 124 by a distance D3. The separation of D3 prevents material from vertical interconnect structures 158, such as Cu, from incidentally transferring to, and contaminating a material of, semiconductor die 124, such as Si. Preventing contamination of semiconductor die 124 from material of vertical interconnect structures 158 is further facilitated by exposing conductive layer 162 by LDA or another removal process separate from the grinding operation, shown in FIG. 6*l*, that exposes back surface 128 of semiconductor die 124. Furthermore, insulating layer 296 on back surface 128 of semiconductor die 124 serves as a barrier during the formation of openings 298 and prevents material from vertical interconnect structures 158 from reaching semiconductor die 124.

PWB modular units 164 and 166 disposed within Fo-PoP 328 can differ in size and shape from one another, while still providing through vertical interconnect for the Fo-PoP. PWB units 164 and 166 include interlocking footprints having square and rectangular shapes, a cross-shape (+), an angled or "L-shape," a circular or oval shape, a hexagonal shape, an octagonal shape, a star shape, or any other geometric shape. At the wafer level, and before singulation, PWB units 164 and 166 are disposed around semiconductor die 124 in an interlocking pattern such that different sides of semiconductor die 124 are aligned with, and correspond to, a number of different sides of the PWB units in a repeating pattern. PWB units 164 and 166 may include additional metal layers to facilitate design integration and increased routing flexibility.

PWB modular units 164 and 166 provide a cost effective alternative to using standard laser drilling processes for vertical interconnection in Fo-PoP for a number of reasons. First, PWB units 164 and 166 can be made with low cost manufacturing technology such as substrate manufacturing technology. Second, standard laser drilling includes high equipment cost and requires drilling through an entire package thickness, which increases cycle time and decrease manufacturing throughput. Furthermore, the use of PWB units 164 and 166 for vertical interconnection provides an advantage of improved control for vertical interconnection with respect to vertical interconnections formed exclusively by a laser drilling process.

Figure 7C:
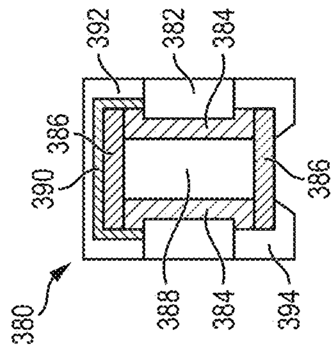
FIGS. 7*a*-7*i* illustrate various conductive vertical interconnect structures for PWB modular units.
Figure 7B:
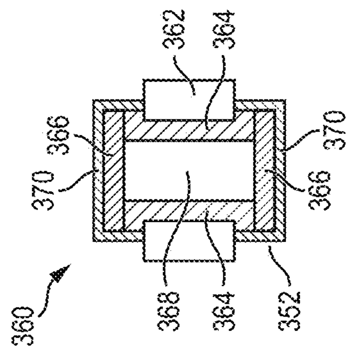
Figure 7A:
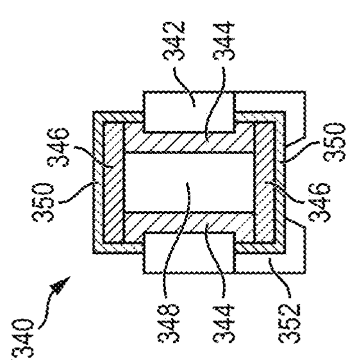

FIG. 7*a* shows an embodiment of conductive pillar or conductive vertical interconnect structure 340 with laminate core 342, conductive layers 344 and 346, and filler material 348. Filler material 348 can be conductive material or insulating material. Conductive layer 344 overlaps laminate core 342 by 0-200 μm. A Cu protective layer 350 is formed over conductive layer 346. An insulating layer 352 is formed over one surface of laminate core 342. A portion of insulating layer 352 is removed to expose Cu protective layer 350.

FIG. 7*b* shows an embodiment of conductive pillar or conductive vertical interconnect structure 360 with laminate core 362, conductive layers 364 and 366, and filler material 368. Filler material 368 can be conductive material or insulating material. Conductive layer 364 overlaps laminate core 362 by 0-200 μm. A Cu protective layer 370 is formed over conductive layer 366.

FIG. 7*c* shows an embodiment of conductive pillar or conductive vertical interconnect structure 380 with laminate core 382, conductive layers 384 and 386, and filler material 388. Filler material 388 can be conductive material or insulating material. Conductive layer 384 overlaps laminate core 382 by 0-200 μm. A Cu protective layer 390 is formed over conductive layer 346. An insulating layer 392 is formed over one surface of laminate core 382. An insulating layer 394 is formed over an opposite surface of laminate core 382. A portion of insulating layer 394 is removed to expose conductive layer 386.

Figures 7D, 7E, 7F, 7G, 7H, 7I:
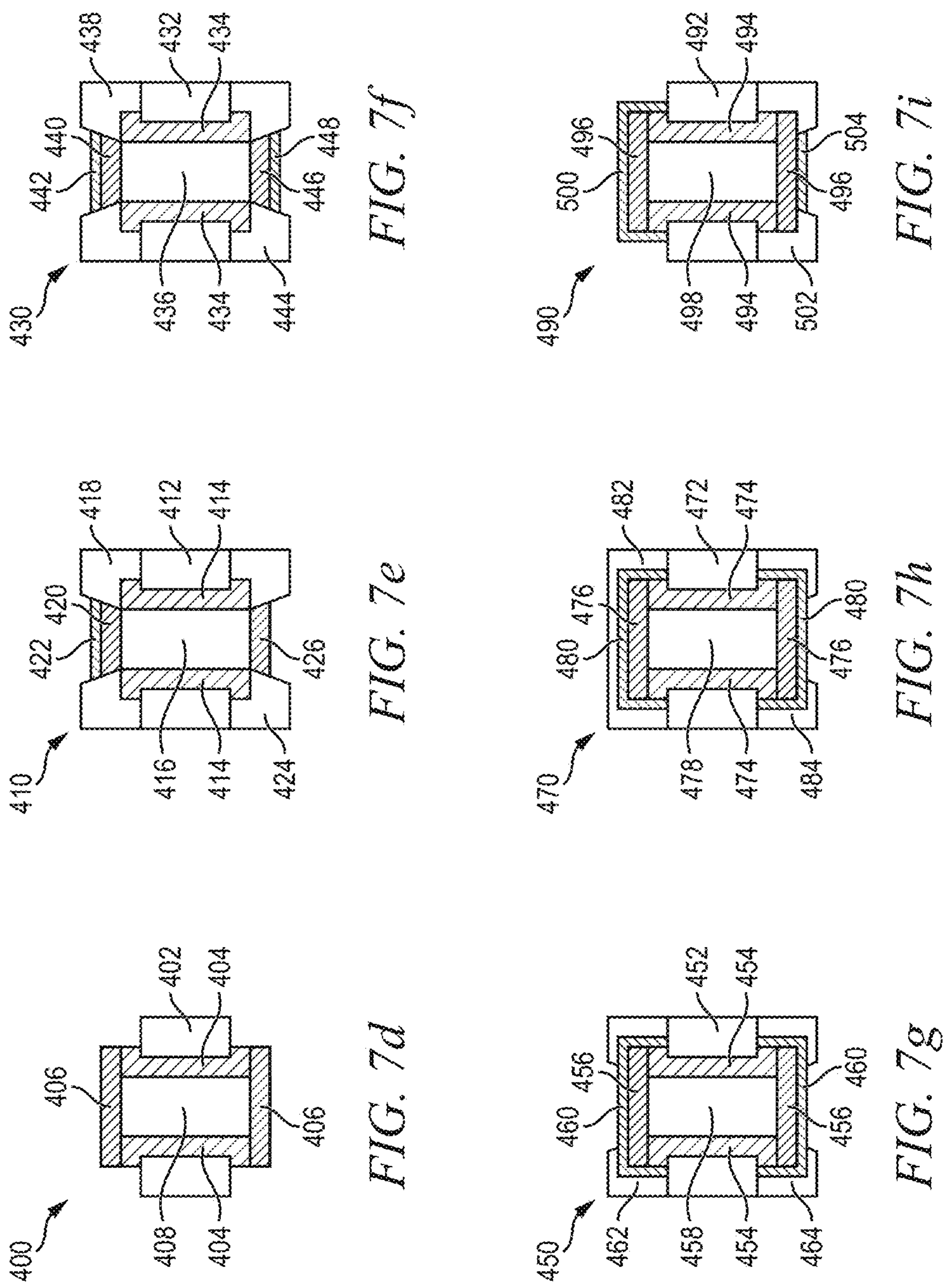

FIG. 7*d* shows an embodiment of conductive pillar or conductive vertical interconnect structure 400 with laminate core 402, conductive layers 404 and 406, and filler material 408. Filler material 408 can be conductive material or insulating material. Conductive layer 404 overlaps laminate core 402 by 0-200 μm.

FIG. 7*e* shows an embodiment of conductive pillar or conductive vertical interconnect structure 410 with laminate core 412, conductive layer 414, and filler material 416. Filler material 416 can be conductive material or insulating material. Conductive layer 414 overlaps laminate core 412 by 0-200 μm. An insulating layer 418 is formed over one surface of laminate core 412. A portion of insulating layer 418 is removed to expose conductive layer 414. A conductive layer 420 is formed over the exposed portion of conductive layer 414. A Cu protective layer 422 is formed over conductive layer 420. An insulating layer 424 is formed over a surface of laminate core 412 opposite insulating layer 418. A portion of insulating layer 424 is removed to expose a portion of conductive layer 414. A conductive layer 426 is formed over the exposed portion of conductive layer 414.

FIG. 7*f* shows an embodiment of conductive pillar or conductive vertical interconnect structure 430 with laminate core 432, conductive layer 434, and filler material 436. Filler material 436 can be conductive material or insulating material. Conductive layer 434 overlaps laminate core 432 by 0-200 μm. An insulating layer 438 is formed over one surface of laminate core 432. A portion of insulating layer 438 is removed to expose conductive layer 434. A conductive layer 440 is formed over the expose conductive layer 434. A Cu protective layer 442 is formed over conductive layer 420. An insulating layer 444 is formed over an opposite surface of laminate core 432. A conductive layer 446 is formed over the expose conductive layer 434. A Cu protective layer 446 is formed over conductive layer 446.

FIG. 7*g* shows an embodiment of conductive pillar or conductive vertical interconnect structure 450 with laminate core 452, conductive layers 454 and 456, and filler material 458. Filler material 458 can be conductive material or insulating material. Conductive layer 454 overlaps laminate core 452 by 0-200 μm. A Cu protective layer 460 is formed over conductive layer 456. An insulating layer 462 is formed over one surface of laminate core 452. A portion of insulating layer 462 is removed to expose Cu protective layer 460. An insulating layer 464 is formed over an opposite surface of laminate core 452. A portion of insulating layer 464 is removed to expose Cu protective layer 460.

FIG. 7*h* shows an embodiment of conductive pillar or conductive vertical interconnect structure 470 with laminate core 472, conductive layers 474 and 476, and filler material 478. Filler material 478 can be conductive material or insulating material. Conductive layer 474 overlaps laminate core 472 by 0-200 μm. A Cu protective layer 480 is formed over conductive layer 476. An insulating layer 482 is formed over one surface of laminate core 472. An insulating layer 484 is formed over an opposite surface of laminate core 472. A portion of insulating layer 484 is removed to expose Cu protective layer 480.

FIG. 7*i* shows an embodiment of conductive pillar or conductive vertical interconnect structure 490 with laminate core 492, conductive layers 494 and 496, and filler material 498. Filler material 498 can be conductive material or insulating material. Conductive layer 494 overlaps laminate core 492 by 0-200 μm. A Cu protective layer 500 is formed over conductive layer 496. An insulating layer 502 is formed over an opposite surface of laminate core 492. A portion of insulating layer 502 is removed to expose Cu protective layer 480. A Cu protective layer 504 is formed over the exposed conductive layer 496.

Figure 8A:
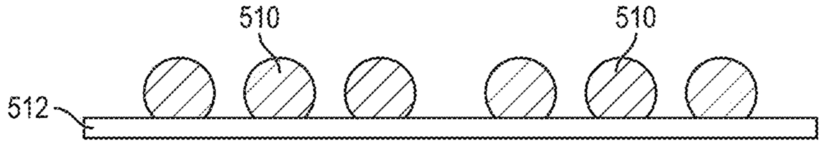
FIGS. 8*a*-8*c* illustrate a process of forming a PWB modular unit with a vertical interconnect structures containing bumps.
Figure 8B:
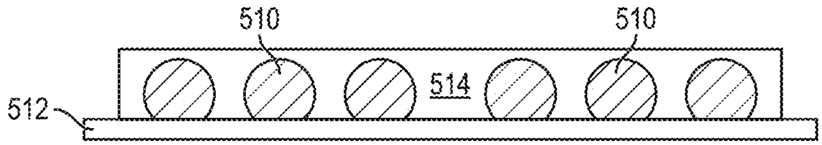
Figure 8C:
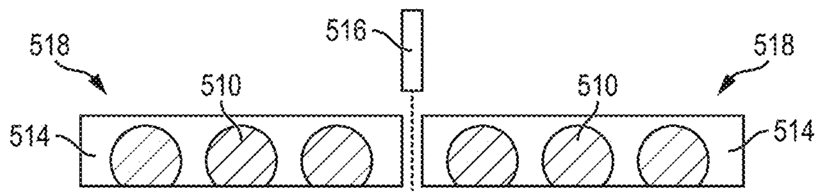

In FIG. 8*a*, a plurality of bumps 510 is formed over Cu foil 512, or other foil or carrier with thin patterned Cu or other wetting material layer. The foil or supporting layer can be evenly bonded to temporary carrier with thermal releasing tape, which can stand reflow temperature. In FIG. 8*b*, an encapsulant 514 is formed over bumps 510 and Cu foil 512. In FIG. 8*c*, Cu foil 512 is removed and bumps 510 embedded in encapsulant 514 is singulated using saw blade or laser cutting tool 516 into PWB vertical interconnect units 518.

Figure 9:
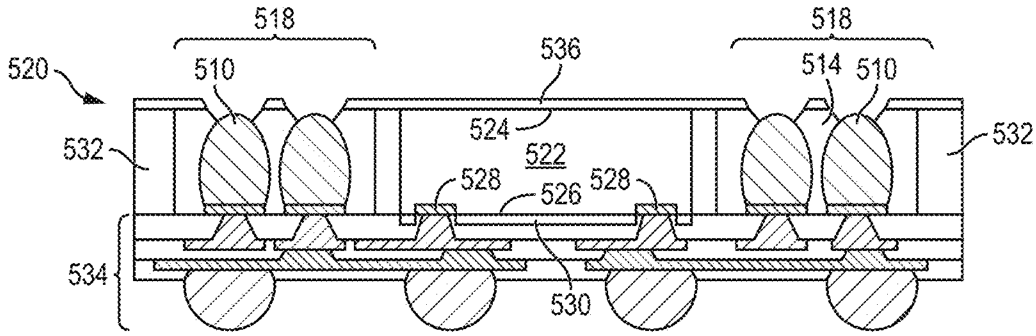
FIG. 9 illustrates a Fo-PoP with semiconductor die interconnected by PWB modular units having vertical interconnect structures containing bumps.

FIG. 9 shows a Fo-PoP 520 including semiconductor die 522, which is similar to semiconductor die 124 from FIG. 3*c*. Semiconductor die 522 has a back surface 524 and active surface 526 opposite back surface 524 containing analog or digital circuits implemented as active devices, passive devices, conductive layers, and dielectric layers formed within the die and electrically interconnected according to the electrical design and function of the die. An electrically conductive layer 528 is formed over active surface 526 and operates as contact pads that are electrically connected to the circuits on active surface 526. An insulating or passivation layer 530 is conformally applied over active surface 526.

FIG. 9 also shows PWB modular units 518 from FIGS. 8*a*-8*c* laterally offset from, and disposed around or in a peripheral region around semiconductor die 522. Back surface 524 of semiconductor die 522 is offset from PWB modular units 518 by at least 1 μm, similar to FIG. 5*b*. Encapsulant 532 is deposited around PWB units 518. A build-up interconnect structure 534, similar to build-up interconnect structure 180 in FIG. 5*e*, is formed over encapsulant 532, PWB units 518, and semiconductor die 522. An insulating or passivation layer 536 is formed over encapsulant 532, PWB units 518, and semiconductor die 522. A portion of encapsulant 514 and insulating layer 536 is removed to expose bumps 510. Bumps 510 are offset from back surface 524 of semiconductor die 522 by at least 1 μm.

Figure 5G:
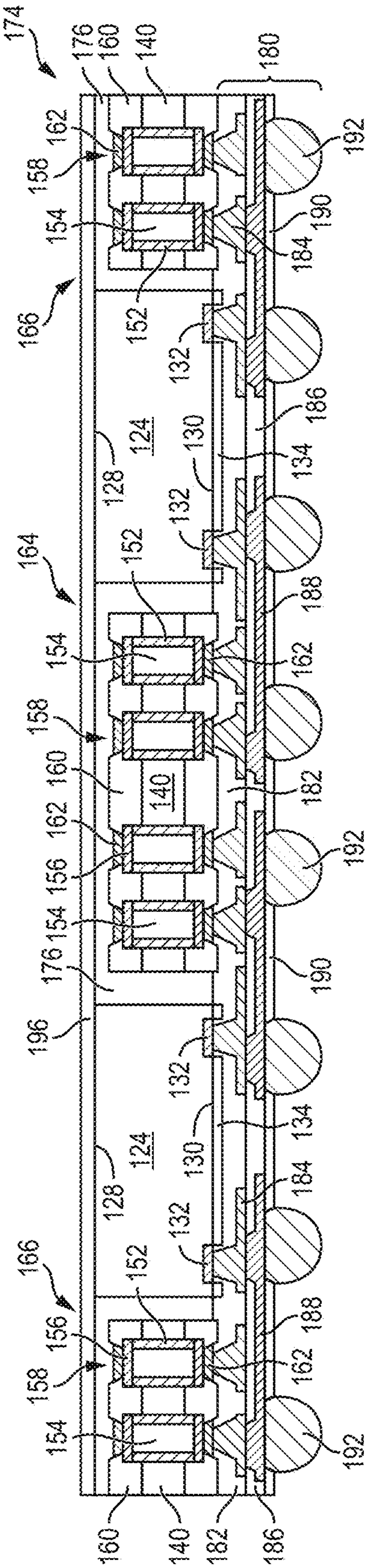
Figure 5H:
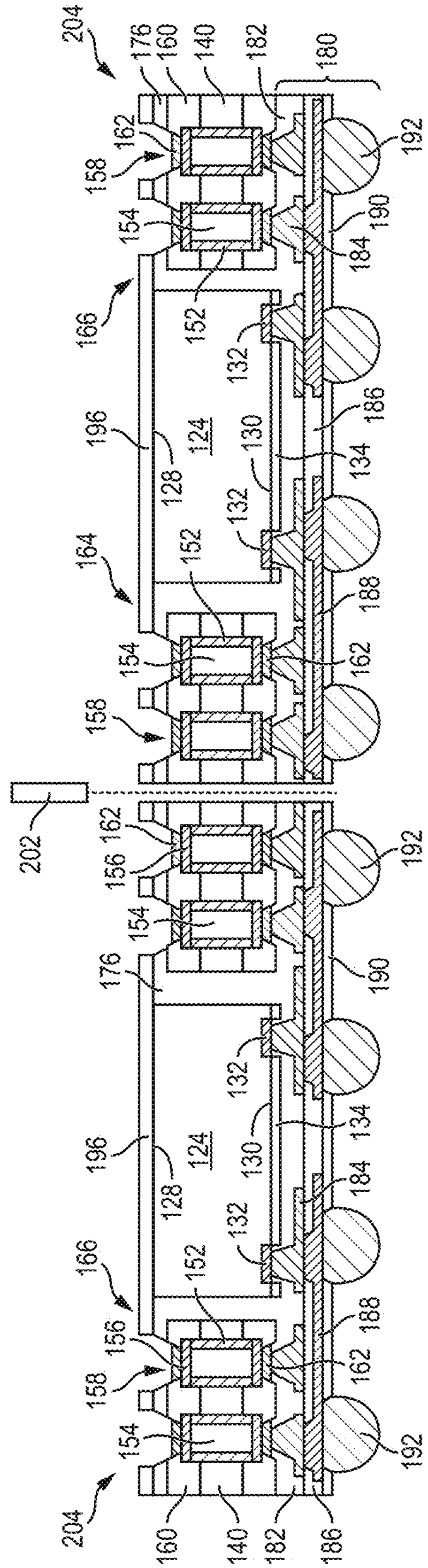
Figure 5I:
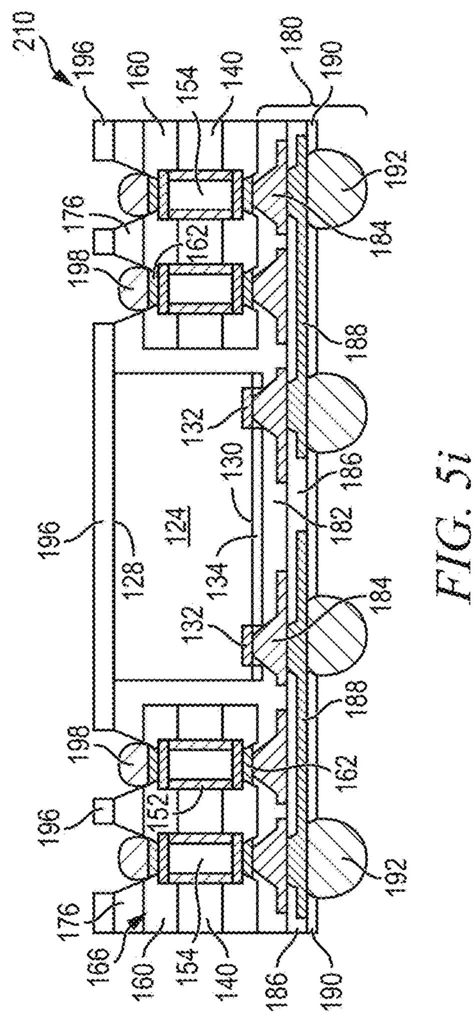
Figure 10:
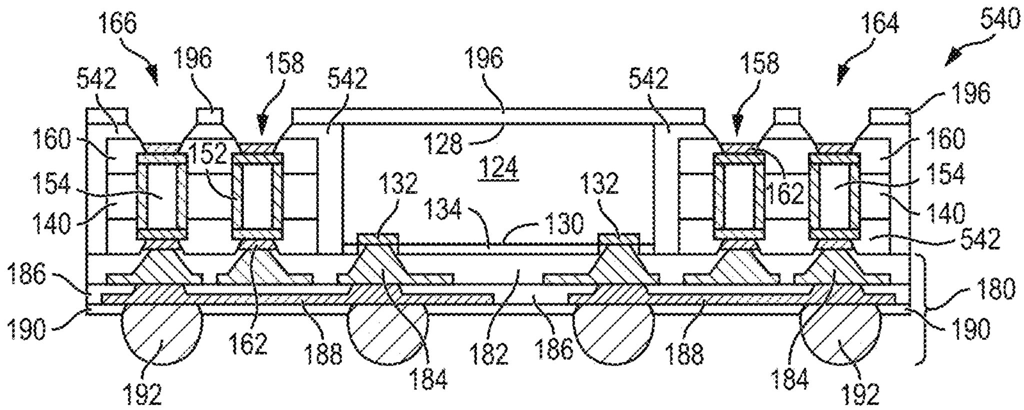
FIG. 10 illustrates another Fo-PoP with semiconductor die interconnected by PWB modular units having vertical interconnect structures.

FIG. 10 shows an embodiment of Fo-PoP 540, similar to FIG. 5*h*, with encapsulant 542 disposed around PWB units 164 and 166.

Figure 11A:
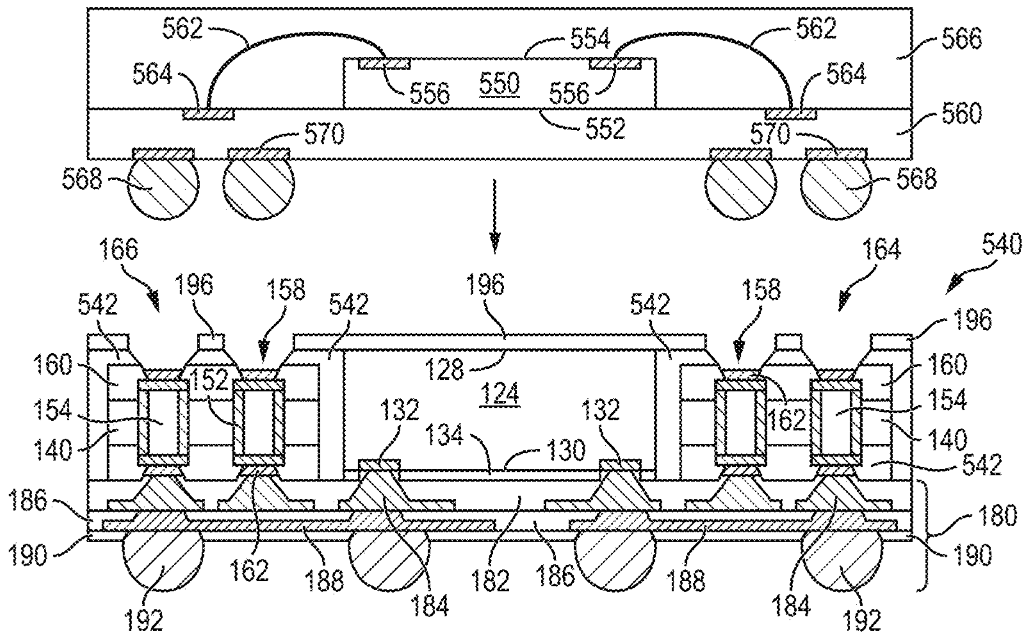
FIGS. 11*a*-11*b* illustrate mounting a second semiconductor die to the PWB modular unit.

In FIG. 11*a*, semiconductor die 550 has a back surface 552 and active surface 554 containing analog or digital circuits implemented as active devices, passive devices, conductive layers, and dielectric layers formed within the die and electrically interconnected according to the electrical design and function of the die. An electrically conductive layer 556 is formed over active surface 554 and operates as contact pads that are electrically connected to the circuits on active surface 554.

Semiconductor die 550 is mounted back surface 552 oriented to substrate 560. Substrate 560 can be a PCB. A plurality of bond wires 562 is formed between conductive layer 556 and trace lines or contact pads 564 formed on substrate 560. An encapsulant 566 is deposited over semiconductor die 550, substrate 560, and bond wires 562. Bumps 568 are formed over contact pads 570 on substrate 560.

Figure 11B:
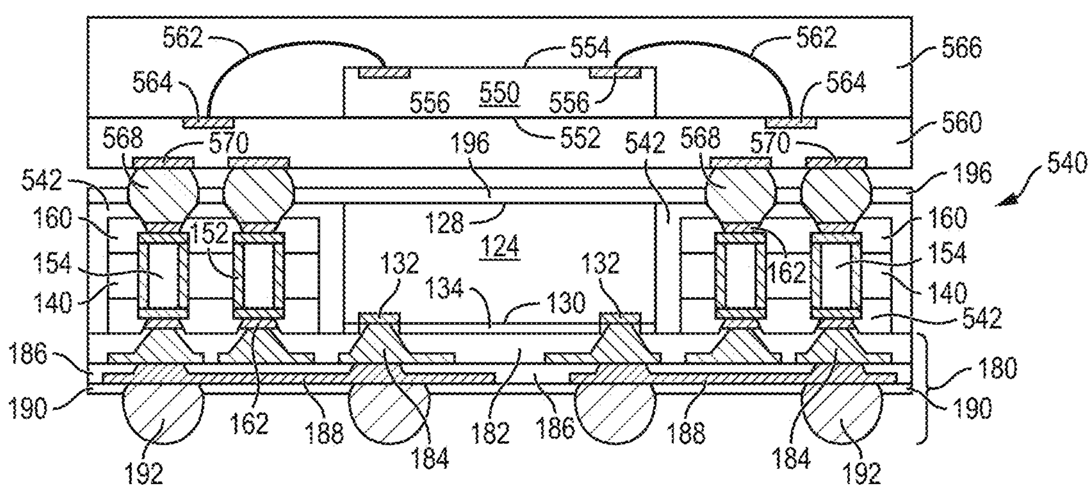

FIG. 11*b* shows Fo-PoP 540 from FIG. 10 with PWB modular units 164 and 166 laterally offset and disposed around or in a peripheral region around semiconductor die 124. Substrate 560 using semiconductor die 550 is mounted to Fo-PoP 540 with bumps 568 metallically and electrically connected to PWB modular units 164 and 166. Semiconductor die 124 of Fo-PoP 540 is electrically connected through bond wires 562, substrate 560, bumps 568, and PWB modular units 164 and 166 to build-up interconnect structure 180 for vertical interconnect.

Figure 12A:
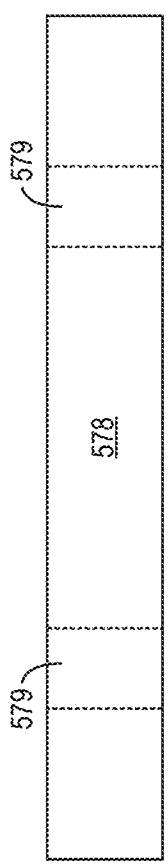
FIGS. 12*a*-12*b* illustrate a process of forming modular units from an encapsulant panel with fine filler.
Figure 12B:
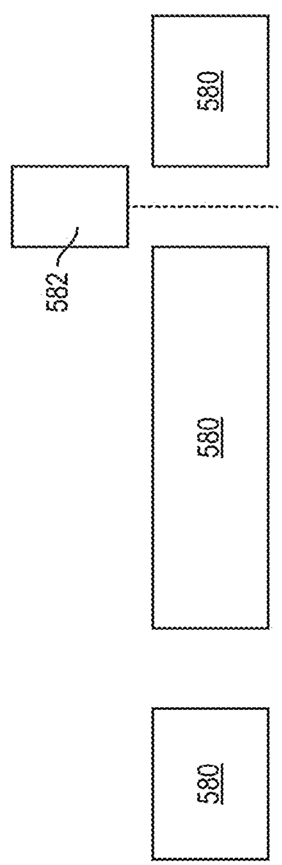

FIGS. 12*a*-12*b* illustrate a process of forming modular units from an encapsulant panel with fine filler. FIG. 12*a* shows a cross-sectional view of a portion of encapsulant panel 578. Encapsulant panel 578 includes a polymer composite material, such as epoxy resin, epoxy acrylate, or polymer, with a suitable fine filler material (i.e., less than 45 μm) deposited within the polymer composite material. The fine filler material enables the CTE of encapsulant panel 578 to be adjusted such that the CTE of encapsulant panel 578 is greater than subsequently deposited package encapsulant material. Encapsulant panel 578 has a plurality of saw streets 579 for singulating encapsulant panel 578 into individual modular units.

In FIG. 12*b*, encapsulant panel 578 is singulated through saw streets 579 into individual modular units 580 using saw blade or laser cutting tool 582. Modular units 580 have a shape or footprint similar to PWB modular units 164 and 166 shown in FIGS. 6*e*-6*i*, but do not have embedded conductive pillars or conductive bumps. The CTE of modular units 580 is greater than the CTE of subsequently deposited encapsulant material to reduce the incidence of warpage under thermal stress. The fine filler within the encapsulant material of modular units 580 also enables improved laser drilling for subsequently formed openings, which are formed through modular units 580.

FIGS. 13*a*-13*i* illustrate another process of forming a Fo-PoP with a modular unit formed from an encapsulant panel without embedded conductive pillars or bumps. Continuing from FIG. 6*b*, modular units 580 from FIG. 12*b* are mounted to interface layer 224 over carrier 220 using a pick and place operation. In another embodiment, encapsulant panel 578 from FIG. 12*a* is mounted to interface layer 224, prior to mounting semiconductor die 124, as a 300-325 mm round panel or 470 mm×370 mm rectangular panel, and openings are punched through encapsulant panel 578 to accommodate semiconductor die 124, and encapsulant panel 578 is singulated into individual modular units 580, similar to FIG. 6*i*.

When modular units 580 are mounted to interface layer 224, surface 583 of modular units 580 is coplanar with exposed surface 584 of interface layer 224, such that surface 583 is not embedded within interface layer 224. Thus, surface 583 of modular units 580 is vertically offset with respect to surface 225 of insulating layer 134.

Figure 13A:
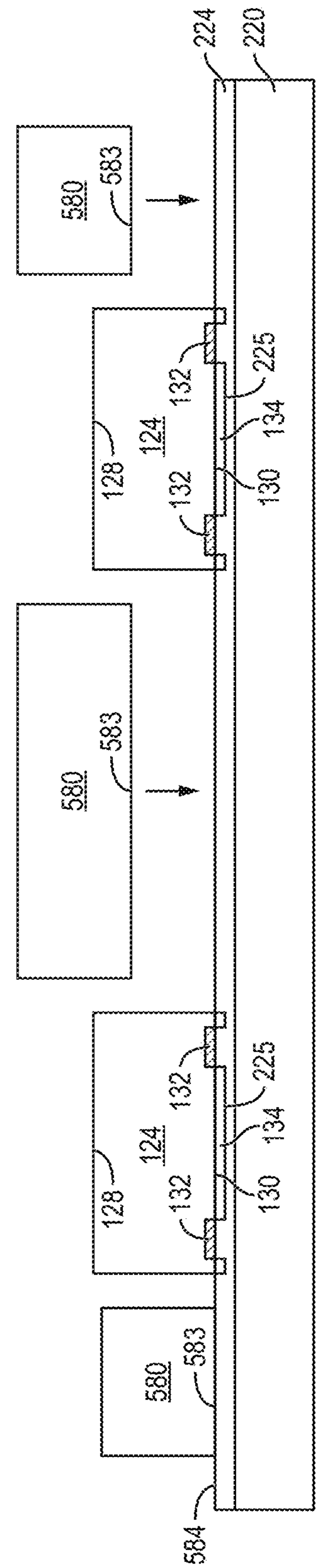
FIGS. 13*a*-13*i* illustrate another process of forming a Fo-PoP with a modular unit formed from an encapsulant panel without embedded conductive pillars or bumps.
Figure 13B:
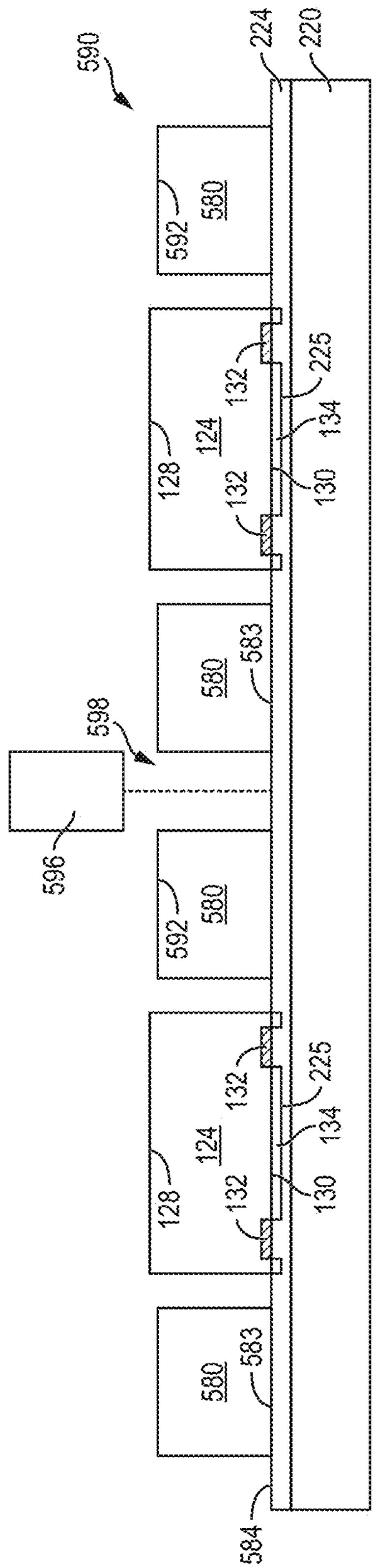

FIG. 13*b* shows semiconductor die 124 and modular units 580 mounted over carrier 220 as a reconstituted wafer 590. A surface 592 of modular units 580 is vertically offset with respect to back surface 128 of semiconductor die 124. Reconstituted wafer 590 is partially singulated through modular units 580 between semiconductor die 124 using a saw blade or laser cutting tool 596 to form channel or opening 598. Channel 598 extends through modular units 580, and additionally may extend through interface layer 224 and partially but not completely through carrier 220. Channel 598 forms a separation among modular units 580 and semiconductor die 124.

Figure 13C:
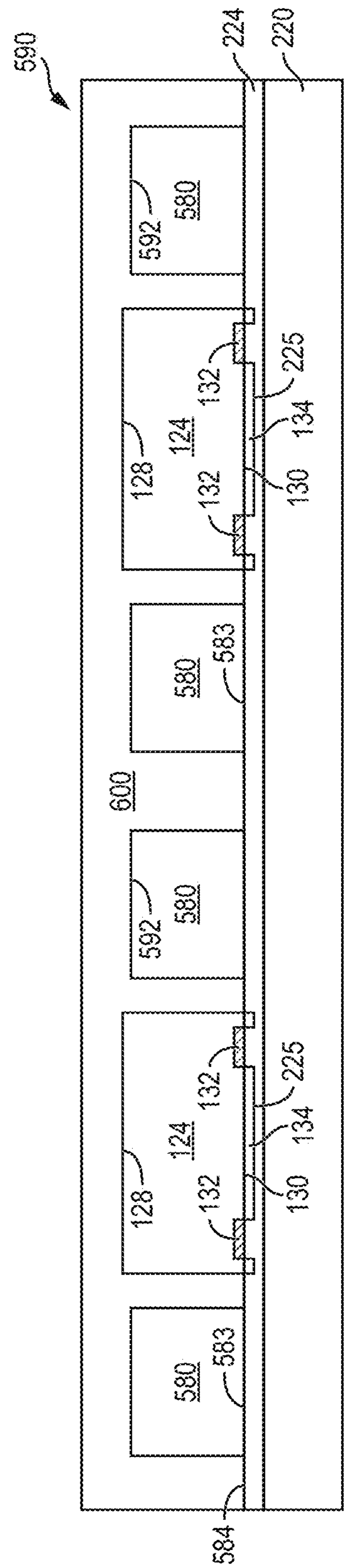

In FIG. 13*c*, an encapsulant or molding compound 600 is deposited over semiconductor die 124, modular units 580, and carrier 220 using a paste printing, compressive molding, transfer molding, liquid encapsulant molding, vacuum lamination, spin coating, or other suitable applicator. Encapsulant 600 can be polymer composite material, such as epoxy resin with filler, epoxy acrylate with filler, or polymer with proper filler. Encapsulant 600 is non-conductive and environmentally protects the semiconductor device from external elements and contaminants. Encapsulant 600 has a lower CTE than modular units 580.

Figure 13D:
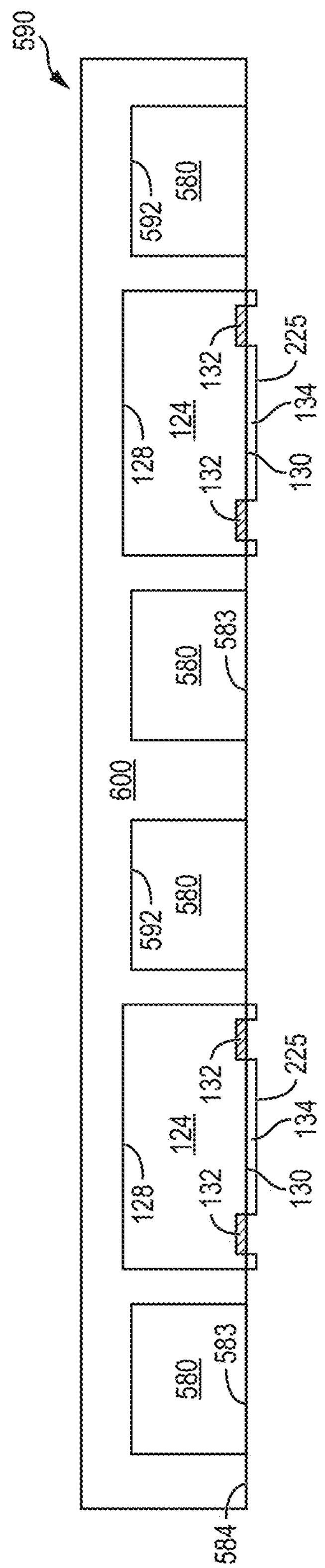

In FIG. 13*d*, carrier 220 and interface layer 224 are removed from reconstituted wafer by chemical etching, mechanical peeling, CMP, mechanical grinding, thermal bake, UV light, laser scanning, or wet stripping to facilitate the formation of an interconnect structure over active surface 130 of semiconductor die 124 and modular units 580.

Figure 13E:
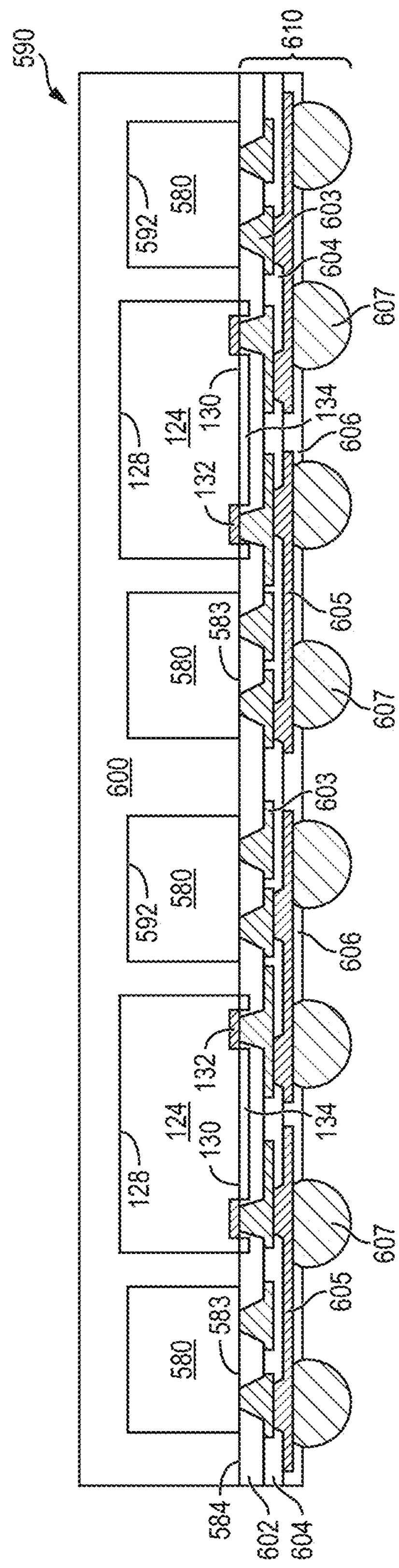

In FIG. 13*e*, an insulating or passivation layer 602 is formed over encapsulant 600, modular units 580, and semiconductor die 124. Insulating layer 602 contains one or more layers of $SiO_2$, $Si_3N_4$, SiON, $Ta_2O_5$, $Al_2O_3$, or other material having similar insulating and structural properties. Insulating layer 602 is deposited using PVD, CVD, printing, spin coating, spray coating, or other suitable process. A portion of insulating layer 602 is removed by LDA, etching, or other suitable process to expose conductive layer 132 and surface 583 of modular units 580.

An electrically conductive layer 603 is patterned and deposited over insulating layer 602, over semiconductor die 124, and within the openings formed through insulating layer 602. Conductive layer 603 is electrically connected to conductive layer 132 of semiconductor die 124. Conductive layer 603 can be one or more layers of Al, Cu, Sn, Ni, Au, Ag, or other suitable electrically conductive material. In one embodiment, conductive layer 603 contains Ti/Cu, TiW/Cu, or Ti/NiV/Cu. The deposition of conductive layer 603 uses PVD, CVD, electrolytic plating, electroless plating, or other suitable process. Conductive layer 603 operates as an RDL to extend electrical connection from semiconductor die 124 to points external to semiconductor die 124 to laterally redistribute the electrical signals of semiconductor die 124 across the package. Portions of conductive layer 603 can be electrically common or electrically isolated according to the design and function of semiconductor die 124.

An insulating or passivation layer 604 is formed over conductive layer 603 and insulating layer 602. Insulating layer 604 contains one or more layers of $SiO_2$, $Si_3N_4$, SiON, $Ta_2O_5$, $Al_2O_3$, or other material having similar insulating and structural properties. Insulating layer 604 is deposited using PVD, CVD, printing, spin coating, spray coating, or other suitable process. A portion of insulating layer 604 is removed by LDA, etching, or other suitable process to expose portions of conductive layer 603 for subsequent electrical interconnection.

An electrically conductive layer 605 is patterned and deposited over insulating layer 604, within the openings formed through insulating layer 604, and is electrically connected to conductive layers 603 and 132. Conductive layer 605 can be one or more layers of Al, Cu, Sn, Ni, Au, Ag, or other suitable electrically conductive material. In one embodiment, conductive layer 605 contains Ti/Cu, TiW/Cu, or Ti/NiV/Cu. The deposition of conductive layer 605 uses PVD, CVD, electrolytic plating, electroless plating, or other suitable process. Conductive layer 605 operates as an RDL to extend electrical connection from semiconductor die 124 to points external to semiconductor die 124 to laterally redistribute the electrical signals of semiconductor die 124 across the package. Portions of conductive layer 605 can be electrically common or electrically isolated according to the design and function of semiconductor die 124.

An insulating layer 606 is formed over insulating layer 604 and conductive layer 605. Insulating layer 606 contains one or more layers of $SiO_2$, $Si_3N_4$, SiON, $Ta_2O_5$, $Al_2O_3$, or other material having similar insulating and structural properties. Insulating layer 606 is deposited using PVD, CVD, printing, spin coating, spray coating, or other suitable process. A portion of insulating layer 606 is removed by LDA, etching, or other suitable process to form openings to expose portions of conductive layer 605 for subsequent electrical interconnection.

An electrically conductive bump material is deposited over the exposed portion of conductive layer 605 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 605 using a suitable attachment or bonding process. In one embodiment, the bump material is reflowed by heating the material above its melting point to form spherical balls or bumps 607. In some applications, bumps 607 are reflowed a second time to improve electrical contact to conductive layer 605. In one embodiment, bumps 607 are formed over a UBM having a wetting layer, barrier layer, and adhesive layer. The bumps can also be compression bonded to conductive layer 605. Bumps 607 represent one type of interconnect structure that can be formed over conductive layer 605. The interconnect structure can also use bond wire, conductive paste, stud bump, micro bump, or other electrical interconnect.

Collectively, insulating layers 602, 604, and 606, conductive layers 603, 605, and conductive bumps 607 constitute a build-up interconnect structure 610. The number of insulating and conductive layers included within build-up interconnect structure 610 depends on, and varies with, the complexity of the circuit routing design. Accordingly, build-up interconnect structure 610 can include any number of insulating and conductive layers to facilitate electrical interconnect with respect to semiconductor die 124. Furthermore, elements that would otherwise be included in a backside interconnect structure or RDL can be integrated as part of build-up interconnect structure 610 to simplify manufacturing and reduce fabrication costs with respect to a package including both front side and backside interconnects or RDLs.

Figure 13F:
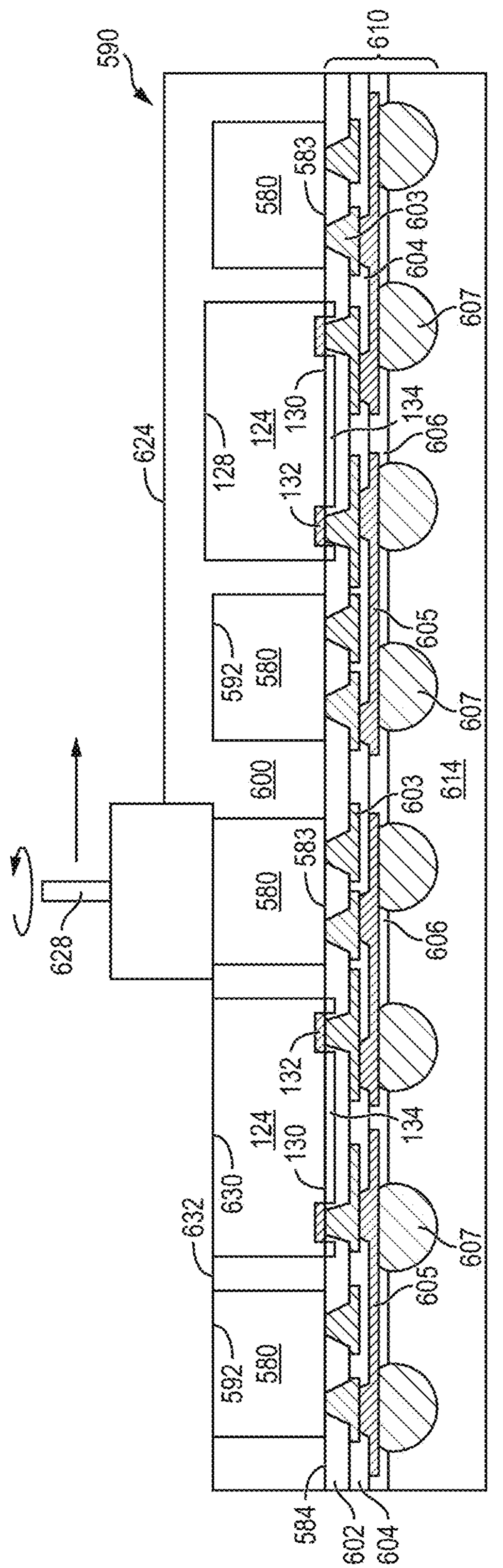

In FIG. 13*f*, back grinding tape 614 is applied over build-up interconnect structure 610 using lamination or other suitable application process. Back grinding tape 614 contacts insulating layer 606 and bumps 607 of build-up interconnect structure 610. Back grinding tape 614 follows the contours of a surface of bumps 607. Back grinding tape 614 includes tapes with thermal resistance up to 270° C. Back grinding tape 614 also includes tapes with a thermal release function. Examples of back grinding tape 614 include UV tape HT 440 and non-UV tape MY-595. Back grinding tape 614 provides structural support for subsequent back grinding and removal of a portion of encapsulant 600 from a backside surface 624 of encapsulant 600, opposite build-up interconnect structure 610.

Backside surface 624 of encapsulant 600 undergoes a grinding operation with grinder 628 to planarize and reduce a thickness of encapsulant 600 and semiconductor die 124. A chemical etch can also be used to planarize and remove a portion of encapsulant 600 and semiconductor die 124. After the grinding operation is completed, exposed back surface 630 of semiconductor die 124 is coplanar with surface 592 of modular units 580 and exposed surface 632 of encapsulant 600.

Figure 13G:
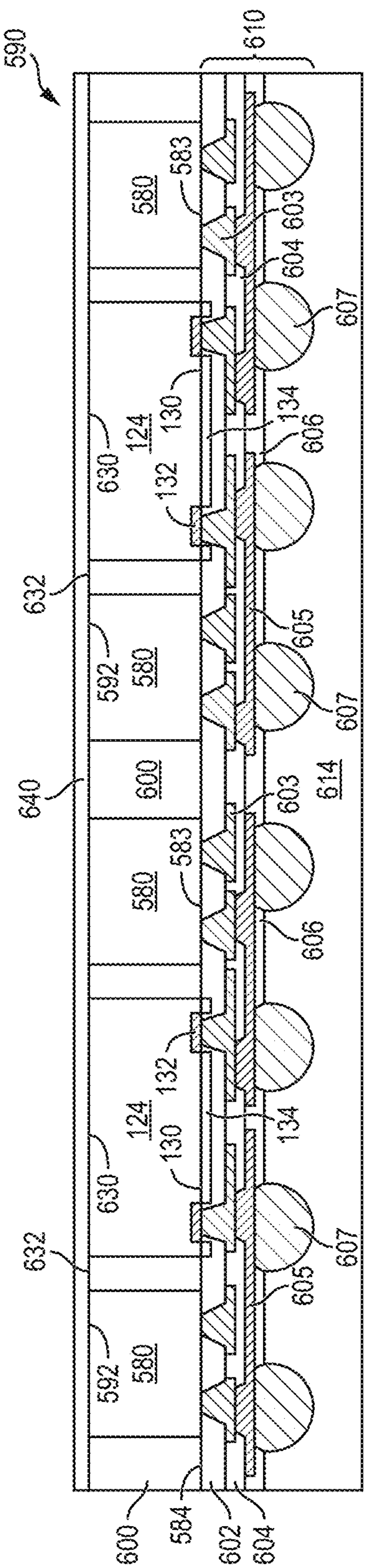

In FIG. 13*g*, a backside balance layer 640 is applied over encapsulant 600, modular units 580, and semiconductor die

124 with back grinding tape 614 providing structural support to reconstituted wafer 590. In another embodiment, back grinding tape 614 is removed prior to forming backside balance layer 640. The CTE of backside balance layer 640 can be adjusted to balance the CTE of build-up interconnect structure 610 in order to reduce warpage of the package. In one embodiment, backside balance layer 640 balances the CTE, e.g., 30-150 ppm/K, of build-up interconnect structure 610 and reduces warpage in the package. Backside balance layer 640 also provides structural support to the package. In one embodiment, backside balance layer 640 has a thickness of 10-100 μm. Backside balance layer 640 can also act as a heat sink to enhance thermal dissipation from semiconductor die 124. Backside balance layer 640 can be any suitable balance layer with suitable thermal and structural properties, such as RCC tape.

Figure 13H:
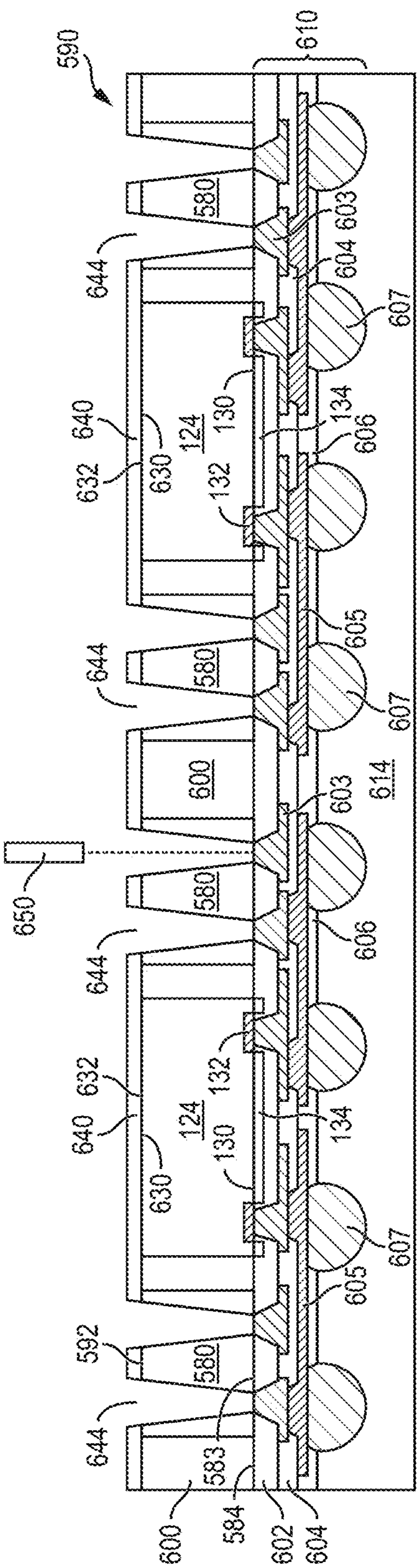

In FIG. 13*h*, a portion of backside balance layer 640 and modular units 580 is removed to form vias or openings 644 and expose conductive layer 603 of build-up interconnect structure 610 through modular units 580. Openings 644 are formed by etching, laser, or other suitable process, using proper clamping or a vacuum foam chuck with supporting tape for structural support. In one embodiment, openings 644 are formed by LDA using laser 650. The fine filler of modular units 580 enables improved laser drilling to form openings 644. Openings 644 can have vertical, sloped, or stepped sidewalls, and extend through backside balance layer 640 and surface 583 of modular units 580 to expose conductive layer 603. After forming openings 644, openings 644 undergo a desmearing or cleaning process, including a particle and organic residue wet clean, such as a single wafer pressure jetting clean with a suitable solvent, or alkali and carbon dioxide bubbled deionized water, in order to remove any particles or residue from the drilling process. A plasma clean is also performed to clean any contaminants from the exposed conductive layer 603, using reactive ion etching (RIE) or downstream/microwave plasma with O2 and one or more of tetrafluoromethane (CF4), nitrogen (N2), or hydrogen peroxide (H2O2). In embodiments where conductive layer 603 includes a TiW or Ti adhesive layer, the adhesive layers of conductive layer 603 is etched with a wet etchant in either a single wafer or batch process, and followed by a copper oxide clean.

Figure 13I:
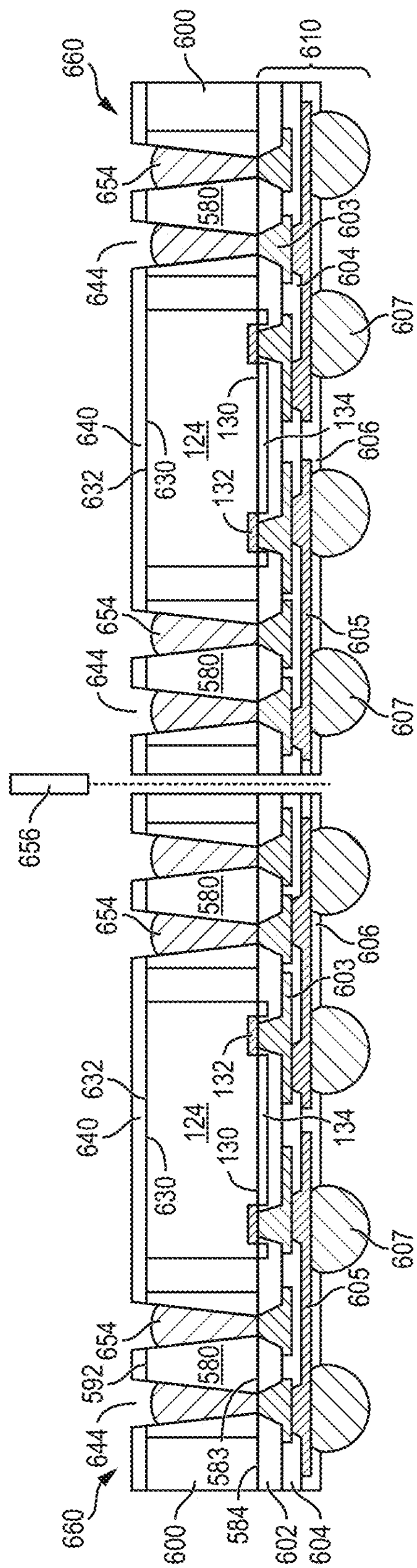

In FIG. 13*i*, an electrically conductive bump material is deposited over the exposed conductive layer 603 of build-up interconnect structure 610 within openings 644 using an evaporation, electrolytic plating, electroless plating, ball drop, screen printing, jetting, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 603 using a suitable attachment or bonding process. In one embodiment, the bump material is reflowed by heating the material above its melting point to form spherical balls or bumps 654. In some applications, bumps 654 are reflowed a second time to improve electrical contact to conductive layer 603. A UBM layer can be formed under bumps 654. The bumps can also be compression bonded to conductive layer 603. Bumps 654 represent one type of conductive interconnect structure that can be formed over conductive layer 603. The interconnect structure can also use bond wire, conductive paste, stud bump, micro bump, or other electrical interconnect. The assembly is singulated using a saw blade or laser cutting tool 656 to form individual Fo-PoP 660, and back grinding tape 614 is removed.

Figure 14:
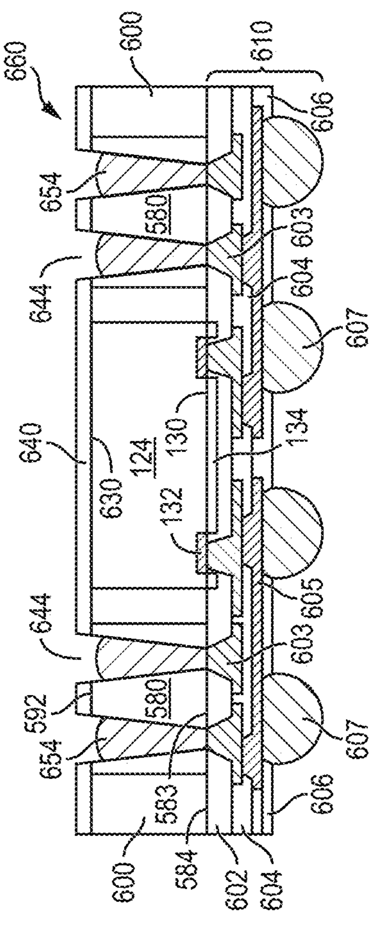
FIG. 14 illustrates another Fo-PoP with a modular unit formed from an encapsulant panel without embedded conductive pillars or bumps.

In FIG. 14 shows Fo-PoP 660 after singulation. Modular units 580 are embedded within encapsulant 600 around semiconductor die 124 to provide vertical interconnection in Fo-PoP 660. Modular units 580 are formed from an encapsulant panel with a fine filler, and modular units 580 have a higher CTE than encapsulant 600, which provides flexibility to adjust the overall CTE of Fo-PoP 660. Modular units 580 can have a shape or footprint similar to the modular units shown in FIGS. 6*e*-6*i*. After depositing encapsulant 600 over modular units 580 and semiconductor die 124, the package undergoes a back grinding process to remove a portion of encapsulant 600 and semiconductor die 124, such that modular units 580 have a thickness substantially equal to the thickness of semiconductor die 124. A backside balance layer 640 is formed over modular units 580, encapsulant 600, and semiconductor die 124 to provide additional structural support, and prevent warpage of Fo-PoP 660. Openings 644 are formed through backside balance layer 640 and modular units 580 to expose conductive layer 603 of build-up interconnect structure 610. Bumps 654 are formed within openings 644 to form a three-dimensional (3-D) vertical electrical interconnect structure through Fo-PoP 660. Thus, modular units 580 do not have embedded conductive pillars or bump material for vertical electrical interconnect. Forming openings 644 and bumps 654 through modular units 580 reduces the number of manufacturing steps, while still providing modular units for vertical electrical interconnect.

Figure 15A:
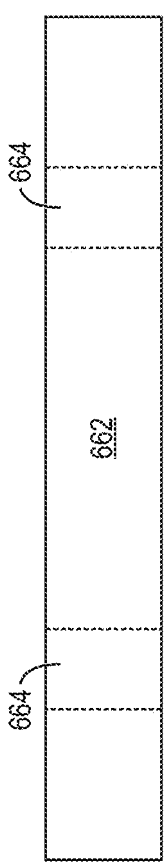
FIGS. 15*a*-15*b* illustrate a process of forming modular units from a PCB panel.
Figure 15B:
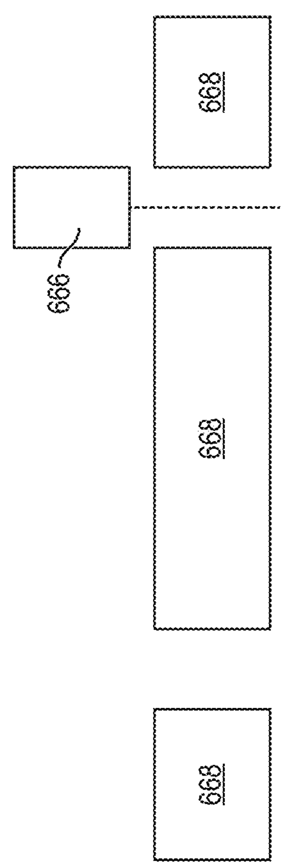

FIGS. 15*a*-15*b* illustrate a process of forming modular units from a PCB panel. FIG. 15*a* shows a cross-sectional view of a portion of PCB panel 662. PCB panel 662 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. PCB panel 662 has a plurality of saw streets 664 for singulating PCB panel 662 into individual modular units. In FIG. 15*b*, PCB panel 662 is singulated through saw streets 664 using saw blade or laser cutting tool 666 into individual modular units 668. Modular units 668 have a shape or footprint similar to PWB modular units 164 and 166 shown in FIGS. 6*e*-6*i*, but do not have embedded conductive pillars or conductive bumps. The CTE of modular units 668 is greater than the CTE of subsequently deposited encapsulant material to reduce the incidence of warpage under thermal stress.

Figure 16:
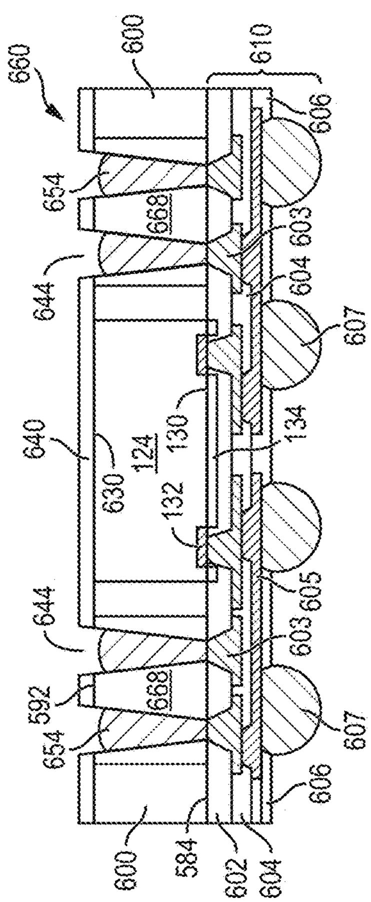
FIG. 16 illustrates another Fo-PoP with a modular unit formed from a PCB panel without embedded conductive pillars or bumps.

FIG. 16 shows an embodiment of Fo-PoP 660, similar to FIG. 14, with modular units 668 embedded within encapsulant 600 instead of modular units 580. Modular units 668 are embedded within encapsulant 600 around semiconductor die 124 to provide vertical interconnection in Fo-PoP 660. Modular units 668 are formed from a PCB panel, and modular units 668 have a higher CTE than encapsulant 600, which provides flexibility to adjust the overall CTE of Fo-PoP 660. Modular units 668 can have a shape or footprint similar to the PWB modular units shown in FIGS. 6*e*-6*i*. After depositing encapsulant 600 over modular units 668 and semiconductor die 124, the package undergoes a back grinding process to remove a portion of encapsulant 600 and semiconductor die 124, such that modular units 668 have a thickness substantially equal to the thickness of semiconductor die 124. A backside balance layer 640 is formed over modular units 668, encapsulant 600, and semiconductor die 124 to provide additional structural support, and prevent warpage of Fo-PoP 660. Openings 644 are formed through backside balance layer 640 and modular units 580 to expose conductive layer 603 of build-up interconnect structure 610. Bumps 654 are formed within openings 644 to form a 3-D vertical electrical interconnect structure through Fo-PoP 660. Thus, modular units 668 do not have embedded conductive pillars or bump material for vertical electrical interconnect. Forming openings 644 and bumps 654 through modular units 668 reduces the number of manufacturing steps, while still providing modular units for vertical electrical interconnect.

Figure 17A:
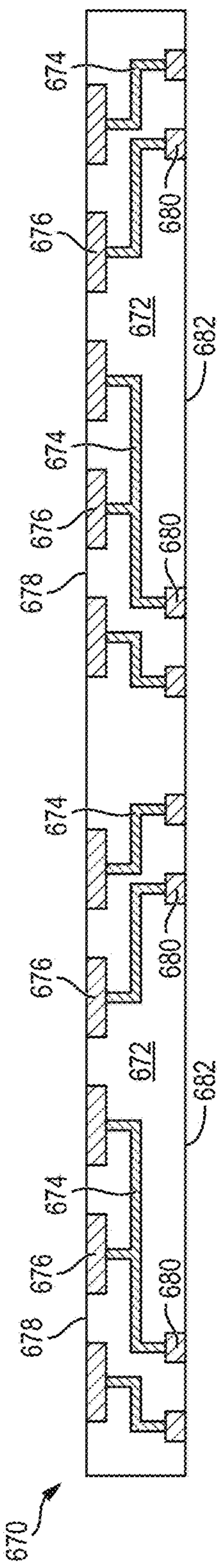
FIGS. 17*a*-17*e* illustrate a process of forming an interposer.

FIGS. 17*a*-17*e* and FIGS. 18*a*-18*i* illustrate, in relation to FIGS. 1 and 2*a*-2*c*, a process of forming a 3-D semiconductor package including a Fo-PoP with semiconductor die interconnected by PWB modular units having vertical interconnect structures. FIG. 17*a* shows substrate or interposer panel 670 containing insulating layers 672 and conductive layers 674. In one embodiment, interposer panel 670 contains one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Interposer panel 670 can be laminate based, thin flexible circuit based, ceramic, copper foil, glass, and may include a semiconductor wafer with an active surface containing one or more transistors, diodes, and other circuit elements to implement analog circuits or digital circuits.

Insulating layers 672 are formed using PVD, CVD, printing, lamination, spin coating, spray coating, sintering or thermal oxidation. Insulating layers 672 contain one or more layers of $SiO_2$, $Si_3N_4$, SiON, $Ta_2O_5$, $Al_2O_3$, or other material having similar insulating and structural properties. Conductive layers 674 are formed using a patterning and metal deposition process such as sputtering, electrolytic plating, and electroless plating. Conductive layers 674 can be one or more layers of Al, Cu, Sn, Ni, Au, Ag, Ti, W, or other suitable electrically conductive material. Conductive layers 674 include lateral RDL and vertical conductive vias to provide electrical interconnect through interposer panel 670.

A conductive layer or RDL 676 is formed in surface 678 of interposer panel 670 using a patterning and metal deposition process such as sputtering, electrolytic plating, or electroless plating. Conductive layer 676 can be one or more layers of Al, Cu, Sn, Ni, Au, Ag, or other suitable electrically conductive material. Conductive layer 676 operates as contact pads electrically connected to conductive layers 674 within interposer panel 670. In one embodiment, contact pads 676 have a pitch of 500 μm or less.

A conductive layer or RDL 680 is formed in surface 682 of interposer panel 670 using a patterning and metal deposition process such as sputtering, electrolytic plating, or electroless plating. Conductive layer 680 can be one or more layers of Al, Cu, Sn, Ni, Au, Ag, or other suitable electrically conductive material. Conductive layer 680 operates as contact pads electrically connected to conductive layers 674 within interposer panel 670. In one embodiment, contact pads 680 have a pitch of 300 μm or less and a diameter of approximately 200 μm. Conductive layer 680 is electrically connected to conductive layer 676 through conductive layers 674.

Figure 17B:
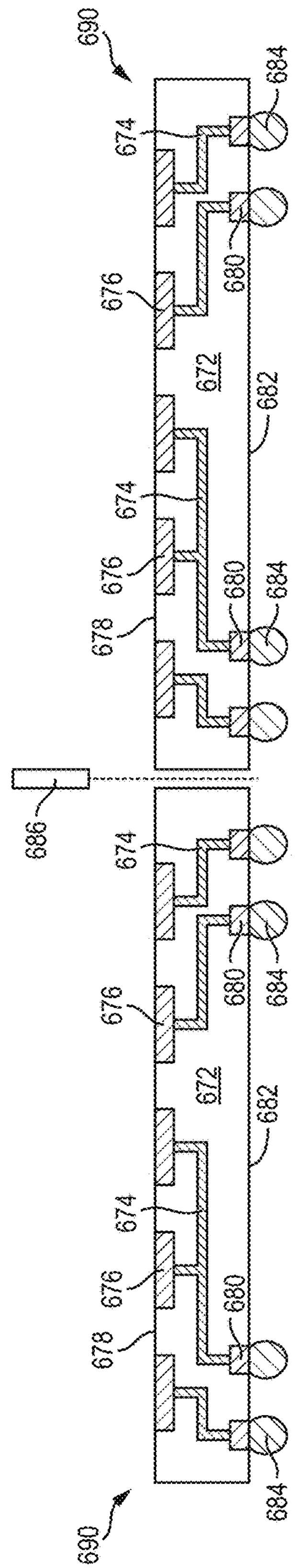

In FIG. 17*b*, an electrically conductive bump material is deposited over conductive layer 680 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 680 using a suitable attachment or bonding process. In one embodiment, the bump material is reflowed by heating the material above the material's melting point to form balls or bumps 684. In some applications, bumps 684 are reflowed a second time to improve electrical contact to conductive layer 680. In one embodiment, bumps 684 are formed over a UBM layer. Bumps 684 can also be compression bonded or thermocompression bonded to conductive layer 680. Bumps 684 represent one type of interconnect structure that can be formed over conductive layer 680. The interconnect structure can also use bond wire, conductive paste, stud bump, micro bump, conductive pillar, composite interconnect structure, or other electrical interconnect.

Figure 17C:
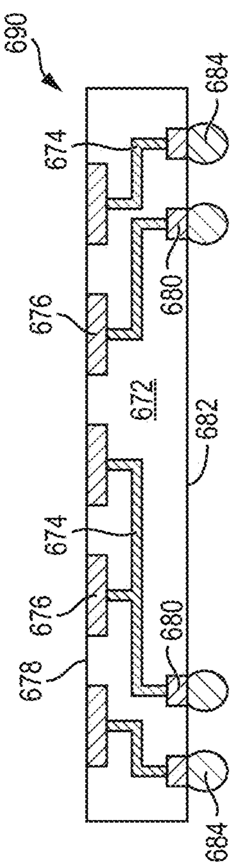

Interposer panel 670 is singulated through insulating material 672 using saw blade or laser cutting tool 686 into individual interposers 690. FIG. 17*c* shows interposer 690 after singulation. Interposer 690 provides structural support, and electrical interconnect through conductive layers 674, 676, and 680. Portions of conductive layers 674, 676, and 680 are electrically common or electrically isolated according to the design and function of the semiconductor die or packages that are subsequently mounted to interposer 690. Interposer 690 can be a laminate-based interposer, a PWB interposer, PCB interposer, or a thin flexible circuit based interposer. In one embodiment, interposer 690 is a ceramic interposer that provides RF and system in package (SiP) functions, e.g., interposer 690 may include an embedded thin film capacitor, inductor, and/or passive component, to increase the electrical performance and functionality of the semiconductor package.

Figure 17D:
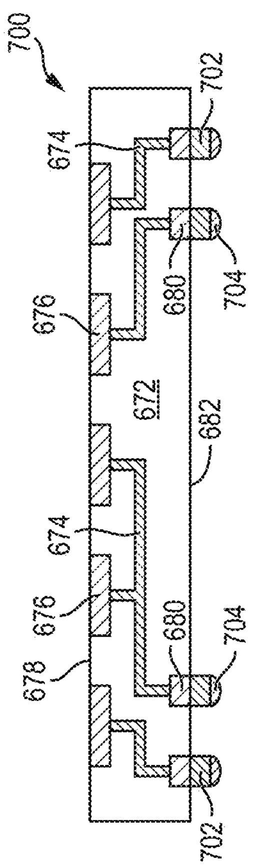

FIG. 17*d* shows an embodiment of interposer 700, similar to FIG. 17*c*, with conductive pillars 702 formed over conductive layer 680. Conductive pillars 702 are formed by depositing a patterning or photoresist layer over surface 682. A portion of the photoresist layer is removed by an etching process to form vias down to conductive layer 680. Alternatively, a portion of the photoresist layer is removed by LDA to form vias exposing conductive layer 680. An electrically conductive material is deposited within the vias over conductive layer 680 using an evaporation, sputtering, electrolytic plating, electroless plating, screen printing, or other suitable metal deposition process. The conductive material can be Cu, Al, W, Au, solder, or other suitable electrically conductive material. In one embodiment, the conductive material is deposited by plating Cu in the vias. The photoresist layer is removed to leave individual conductive pillars 702. Conductive pillars 702 can have a cylindrical shape with a circular or oval cross-section, or conductive pillars 702 can have a cubic shape with a rectangular cross-section. In another embodiment, conductive pillars 702 can be implemented with stacked bumps or stud bumps.

An electrically conductive bump material is deposited over conductive pillars 702 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded bump cap 704. The combination of conductive pillars 702 and bump cap 704 constitute a composite interconnect structure with a non-fusible portion (conductive pillar 702) and a fusible portion (bump cap 704). In one embodiment, the diameter of conductive pillars 702 ranges from 115 μm to 145 μm and the pitch between adjacent bump caps 704 is 300 μm or less.

Figure 17E:
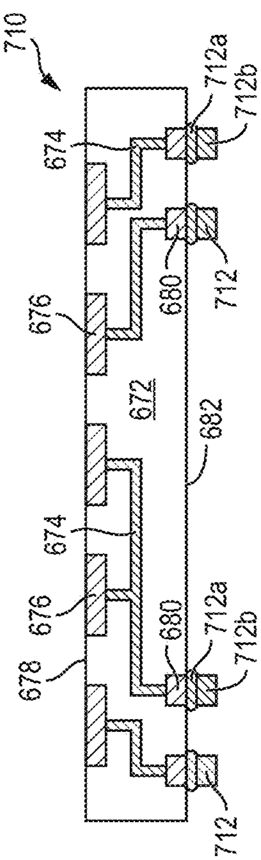

FIG. 17*e* shows an embodiment of interposer 710, similar to FIG. 17*c*, with stud bumps 712 formed over conductive layer 680. Stud bumps 712 include a base portion 712*a* and a stem portion 712*b*. Conductive material, such as Au, Ag, Cu, Al, or alloy thereof, is dispensed or extruded from an applicator over conductive layer 680 to form stud bumps 712. Stud bumps 712 are trimmed, cut, planarized, or otherwise leveled to a desired uniform height. In one embodiment, the pitch between adjacent stud bumps 112 is 300 μm or less.

Figure 18A:
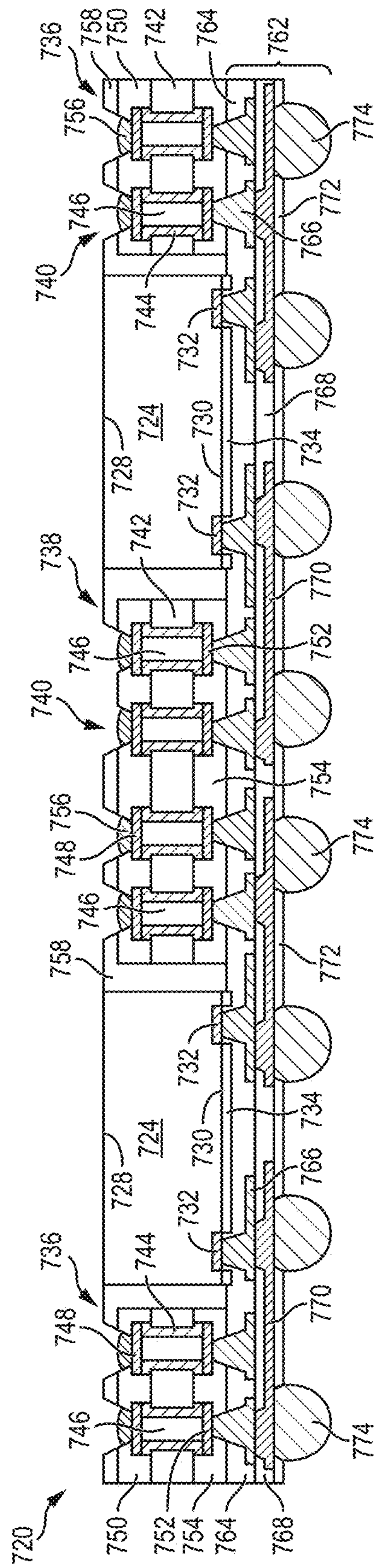
FIGS. 18*a*-18*i* illustrate a process of forming a 3-D semiconductor device including a Fo-PoP with semiconductor die interconnected by PWB modular units having vertical interconnect structures.

FIG. 18*a* shows a cross-sectional view of a reconstituted wafer 720. Reconstituted wafer 720 includes semiconductor die 724, PWB modular units 736 and 738, and build-up interconnect structure 762. Semiconductor die 724, similar to semiconductor die 124 from FIG. 3*c*, has a back surface 728 and an active surface 730 opposite back surface 728. Active surface 730 contains analog or digital circuits implemented as active devices, passive devices, conductive layers, and dielectric layers formed within the semiconductor die and electrically interconnected according to the electrical design and function of the semiconductor die. An electrically conductive layer 732 is formed over active surface 730. Conductive layer 732 operates as contact pads that are electrically connected to the circuits on active surface 730. An insulating or passivation layer 734 is conformally applied over active surface 730. A portion of insulating layer 734 is removed by LDA, etching, or other suitable process to expose portions of conductive layer 732.

PWB modular units 736 and 738 including vertical interconnect structures 740 are disposed around semiconductor die 724, similar to PWB modular units 164 and 166 in FIG. 5*g*. PWB modular units 736 and 738 include core substrate 742. Core substrate 742 of PWB units 736 and 738 includes one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Alternatively, core substrate 742 includes one or more insulating or passivation layers. A plurality of through vias is formed through core substrate 742 using laser drilling, mechanical drilling, or DRIE. A conductive layer 744 is formed over substrate 742 and the sidewalls of the vias using a metal deposition process such as printing, PVD, CVD, sputtering, electrolytic plating, and electroless plating. Conductive layer 744 can be one or more layers of Al, Cu, Sn, Ni, Au, Ag, Ti, W, or other suitable electrically conductive material. In one embodiment, conductive layer 744 includes a first Cu layer formed by electroless plating, followed by a second Cu layer formed by electrolytic plating.

The remaining space in the vias is filled with an insulating or conductive filler material 746. The insulating filler material can be polymer dielectric material with filler and one or more layers of SiO2, Si3N4, SiON, Ta2O5, Al2O3, or other material having similar insulating and structural properties. The conductive filler material can be one or more layers of Al, Cu, Sn, Ni, Au, Ag, or other suitable electrically conductive material. In one embodiment, filler material 746 is a polymer plug. Alternatively, filler material 746 is Cu paste. The vias can also be left void, i.e., without filler material. Filler material 746 is selected to be softer or more compliant than conductive layer 744. Filler material 746 reduces the incidence of cracking or delamination by allowing deformation or change of shape of conductive layer 744 under stress. Alternatively, the vias can be completely filled with conductive layer 744.

A conductive layer 748 is formed over conductive layer 744 and filler material 746 using a metal deposition process such as printing, PVD, CVD, sputtering, electrolytic plating, and electroless plating. Conductive layer 748 can be one or more layers of Al, Cu, Sn, Ni, Au, Ag, Ti, W, or other suitable electrically conductive material. In one embodiment, conductive layer 748 includes a first Cu layer formed by electroless plating, followed by a second Cu layer formed by electrolytic plating.

An insulating or passivation layer 750 is formed over the surface of core substrate 742 and conductive layer 748 using PVD, CVD, printing, spin coating, spray coating, slit coating, rolling coating, lamination, sintering, or thermal oxidation. Insulating layer 750 includes one or more layers of SiO2, Si3N4, SiON, Ta2O5, Al2O3, hafnium oxide (HfO2), benzocyclobutene (BCB), polyimide (PI), polybenzoxazoles (PBO), polymer dielectric resist with or without fillers or fibers, or other material having similar structural and dielectric properties. A portion of insulating layer 750 is removed by LDA, etching, or other suitable process to expose portions of conductive layer 748. In one embodiment, insulating layer 750 is a masking layer.

An electrically conductive layer 752 is formed over conductive layer 744 and filler material 746 opposite conductive layer 748 using a metal deposition process such as printing, PVD, CVD, sputtering, electrolytic plating, and electroless plating. Conductive layer 752 can be one or more layers of Al, Cu, Sn, Ni, Au, Ag, Ti, W, or other suitable electrically conductive material. In one embodiment, conductive layer 752 includes a first Cu layer formed by electroless plating, followed by a second Cu layer formed by electrolytic plating. Conductive layer 752 is electrically connected to conductive layer 748 through conductive layer 744. Conductive layers 744, 748, and 752 form vertical interconnects 740 through core substrate 742.

An insulating or passivation layer 754 is formed over the surface of core substrate 742 and conductive layer 752 using PVD, CVD, printing, spin coating, spray coating, slit coating, rolling coating, lamination, sintering, or thermal oxidation. Insulating layer 754 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 754 is removed by LDA, etching, or other suitable process to expose portions of conductive layer 752. In one embodiment, insulating layer 752 is a masking layer. An optional protection layer 756, e.g., a solder cap or Cu organic solderability preservative (OSP), is formed over conductive layer 748. Conductive layer 744, PWB units 736 and 738 may include additional metal layers to facilitate design integration and increased routing flexibility.

PWB modular units 736 and 738 disposed within reconstituted wafer 720 can differ in size and shape from one another, while still providing through vertical interconnect for the Fo-PoP. PWB units 736 and 738 include interlocking footprints having square and rectangular shapes, a cross-shape (+), an angled or "L-shape," a circular or oval shape, a hexagonal shape, an octagonal shape, a star shape, or any other geometric shape. PWB units 736 and 738 are disposed around semiconductor die 724 in an interlocking pattern such that different sides of semiconductor die 724 are aligned with, and correspond to, a number of different sides of the PWB units in a repeating pattern. PWB modular units 736 and 738 are laterally offset from semiconductor die 724. Back surface 728 of semiconductor die 724 is offset from PWB modular units 736 and 738 by at least 1 μm, similar to FIG. 5*g*. In one embodiment, a thickness between back surface 728 of semiconductor die and PWB units 736 and 738 is 1-150 μm. Encapsulant 758 is deposited over semiconductor die 724 and PWB units 736 and 738. A portion of encapsulant 758 is removed in a grinding operation. The grinding operation planarizes the surfaces of encapsulant and semiconductor die 724, and reduces a thickness of reconstituted wafer 720. A backside balance layer, similar to backside balance layer 196 in FIG. 5*g*, or an insulating layer, similar to insulating layer 296 in FIG. 6*m*, may be applied over encapsulant 758, PWB units 736 and 738, and semiconductor die 724 after the grinding operation. After the grinding operation, portions of encapsulant 758 are selectively removed by etching, LDA, or other suitable process to expose vertical interconnect structures 740. In one embodiment, encapsulant 758 and insulating layer 750 are removed at the same time, i.e., in the same manufacturing step.

A build-up interconnect structure 762, similar to build-up interconnect structure 180 in FIG. 5*e*, is formed over encapsulant 758, PWB units 736 and 738, and semiconductor die 724. Build-up interconnect structure 762 includes an insulating layer 764, electrically conductive layer 766, insulating layer 768, electrically conductive layer 770, and insulating layer 77.

Insulating or passivation layer 764 is formed over semiconductor die 724, PWB units 736 and 738, and encapsulant 758 using PVD, CVD, lamination, printing, spin coating, or spray coating. The insulating layer 764 contains one or more layers of $SiO_2$, $Si_3N_4$, SiON, $Ta_2O_5$, $Al_2O_3$, low temperature (less than 250° C.) curing polymer dielectric with or without filler, or other material having similar insulating and structural properties. A portion of insulating layer 764 is removed by LDA, etching, or other suitable process to expose portions of conductive layer 752 of PWB units 736 and 738, and conductive layer 732 of semiconductor die 724.

Conductive layer or RDL 766 is formed over insulating layer 764 using a patterning and metal deposition process such as sputtering, electrolytic plating, and electroless plating. Conductive layer 766 can be one or more layers of Al, Cu, Sn, Ni, Au, Ag, or other suitable electrically conductive material. In one embodiment, conductive layer 766 contains Ti/Cu, TiW/Cu, or Ti/NiV/Cu. One portion of conductive layer 766 is electrically connected to conductive layer 732 of semiconductor die 724. Another portion of conductive layer 766 is electrically connected to vertical interconnect structures 740 of PWB units 736 and 738. Other portions of conductive layer 766 can be electrically common or electrically isolated depending on the design and function of semiconductor die 724.

Insulating or passivation layer 768 is formed over insulating layer 764 and conductive layer 766 using PVD, CVD, lamination, printing, spin coating, or spray coating. The insulating layer 768 contains one or more layers of $SiO_2$, $Si_3N_4$, SiON, $Ta_2O_5$, $Al_2O_3$, low temperature (less than 250° C.) curing polymer dielectric with or without filler, or other material having similar insulating and structural properties. A portion of insulating layer 768 is removed by LDA, etching, or other suitable process to expose conductive layer 766.

Conductive layer or RDL 770 is formed over insulating layer 768 and conductive layer 766 using a patterning and metal deposition process such as sputtering, electrolytic plating, and electroless plating. Conductive layer 770 can be one or more layers of Al, Cu, Sn, Ni, Au, Ag, or other suitable electrically conductive material. In one embodiment, conductive layer 770 contains Ti/Cu, TiW/Cu, or Ti/NiV/Cu. One portion of conductive layer 770 is electrically connected to conductive layer 766. Other portions of conductive layer 770 can be electrically common or electrically isolated depending on the design and function of semiconductor die 724.

Insulating or passivation layer 772 is formed over insulating layer 768 and conductive layer 770 using PVD, CVD, printing, spin coating, or spray coating. The insulating layer 772 contains one or more layers of $SiO_2$, $Si_3N_4$, SiON, $Ta_2O_5$, $Al_2O_3$, low temperature (less than 250° C.) curing polymer dielectric with or without filler, or other material having similar insulating and structural properties. A portion of insulating layer 772 is removed by LDA, etching, or other suitable process to expose conductive layer 770.

The number of insulating and conductive layers included within build-up interconnect structure 762 depends on, and varies with, the complexity of the circuit routing design. Accordingly, build-up interconnect structure 762 can include any number of insulating and conductive layers to facilitate electrical interconnect with respect to semiconductor die 724.

An electrically conductive bump material is deposited over build-up interconnect structure 762 and electrically connected to the exposed portion of conductive layer 770 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 770 using a suitable attachment or bonding process. In one embodiment, the bump material is reflowed by heating the material above the material's melting point to form spherical balls or bumps 774. In some applications, bumps 774 are reflowed a second time to improve electrical contact to conductive layer 770. In one embodiment, bumps 774 are formed over a UBM layer. Bumps 774 can also be compression bonded or thermocompression bonded to conductive layer 770. Bumps 774 represent one type of interconnect structure that can be formed over conductive layer 770. The interconnect structure can also use bond wire, conductive paste, stud bump, micro bump, conductive pillar, composite interconnect structure, or other electrical interconnect. In one embodiment, the pitch between adjacent bumps 774 is 400 μm or less.

Figure 18B:
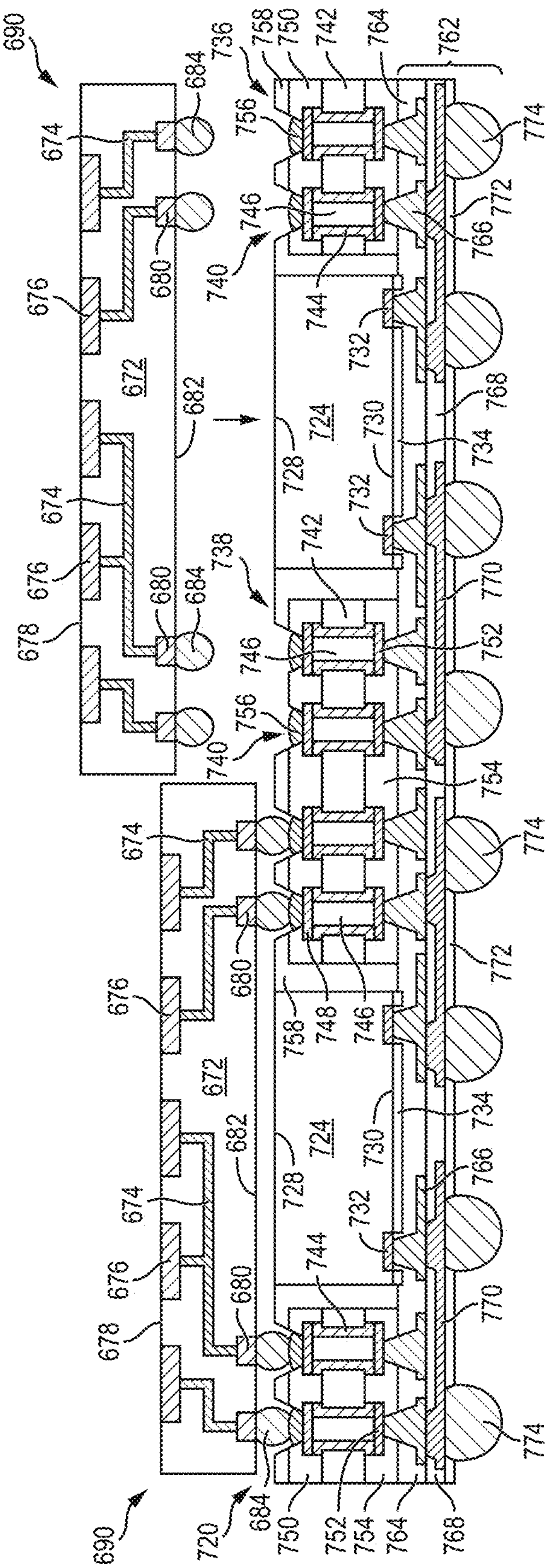

In FIG. 18*b*, interposers 690 from FIG. 17*c* are disposed over reconstituted wafer 720. Bumps 684 of interposer 690 are aligned with the exposed vertical interconnects 740 of PWB units 736 and 738. In one embodiment, the pitch between exposed vertical interconnects 740 is 300 μm or less. Interposers 690 are tested prior to mounting interposers 690 to reconstituted wafer 720 to assure that only known good interposers are mounted to reconstituted wafer 720.

Figure 18C:
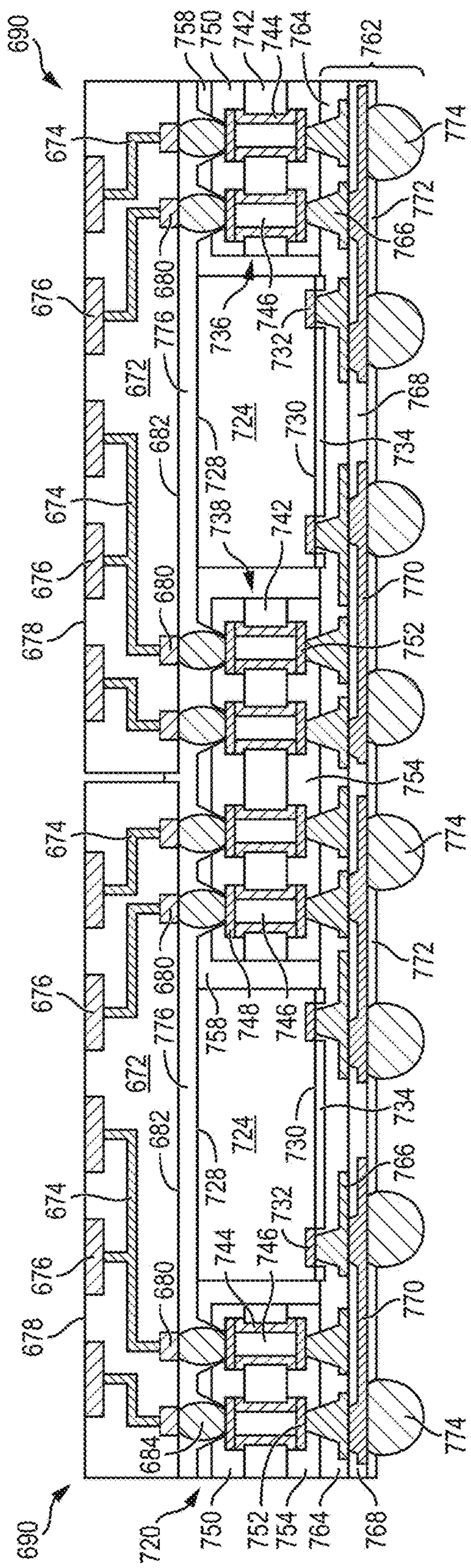

FIG. 18*c* shows interposers 690 mounted to reconstituted wafer 720. Bumps 684 are reflowed to metallurgically and electrically connect to conductive layer 748. In some applications, bumps 684 are reflowed a second time to improve electrical contact to conductive layer 748. Bumps 684 can also be compression bonded or thermocompression bonded to conductive layer 748. Bumps 684 represent one type of interconnect structure that can be formed between interposer 690 and conductive layer 748. The interconnect structure can also use bond wire, conductive paste, stud bump, micro bump, conductive pillar, composite interconnect structure, or other electrical interconnect.

An underfill material 776 is deposited between interposer 690 and reconstituted wafer 720 using a paste printing, jet dispense, compressive molding, transfer molding, liquid encapsulant molding, vacuum lamination, spin coating, mold underfill, or other suitable application process. Underfill 776 can be epoxy, epoxy-resin adhesive material, polymeric materials, films, or other non-conductive materials.

Underfill 776 is non-conductive and environmentally protects the semiconductor device from external elements and contaminants.

Figure 18D:
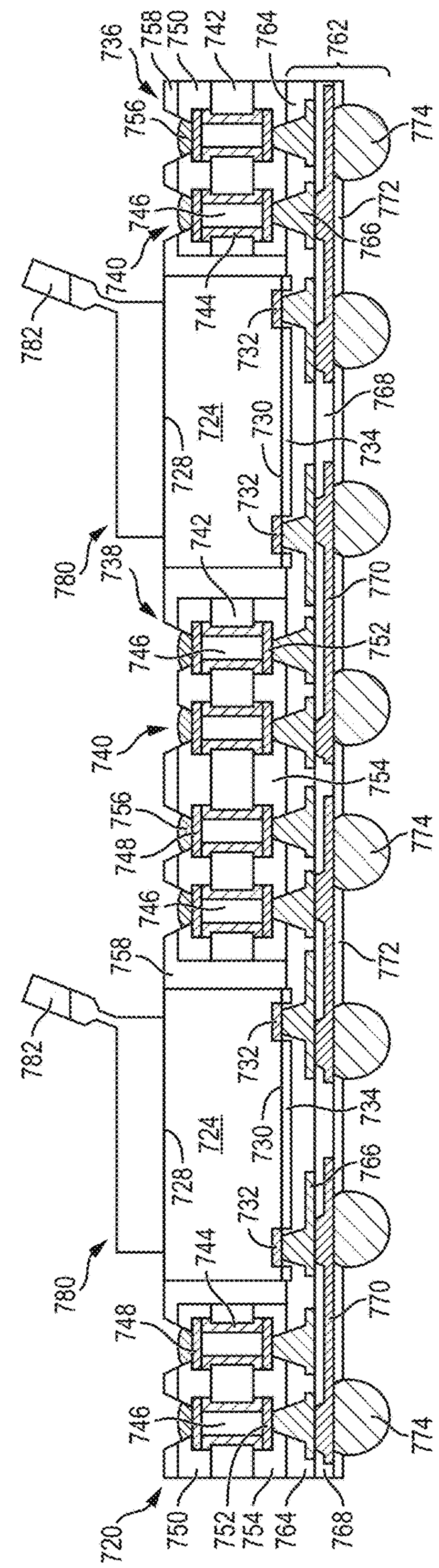

In another embodiment, continuing from FIG. 18*a*, adhesive 780 is dispensed over surface 728 of semiconductor die 724 using applicator 782, as shown in FIG. 18*d*. Adhesive 780 can include epoxy resin, thermoplastic resin, acrylate monomer, a hardening accelerator, organic filler, silica filler, or polymer filler.

Figure 18E:
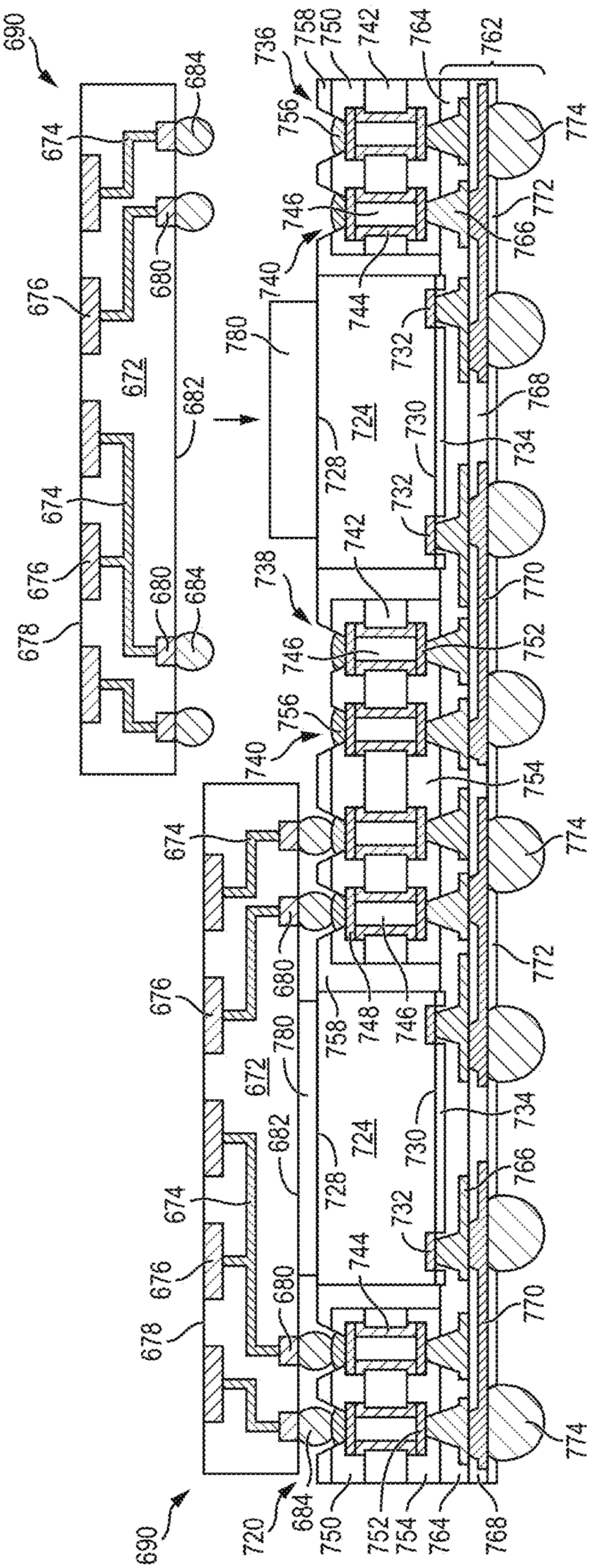
Figure 18F:
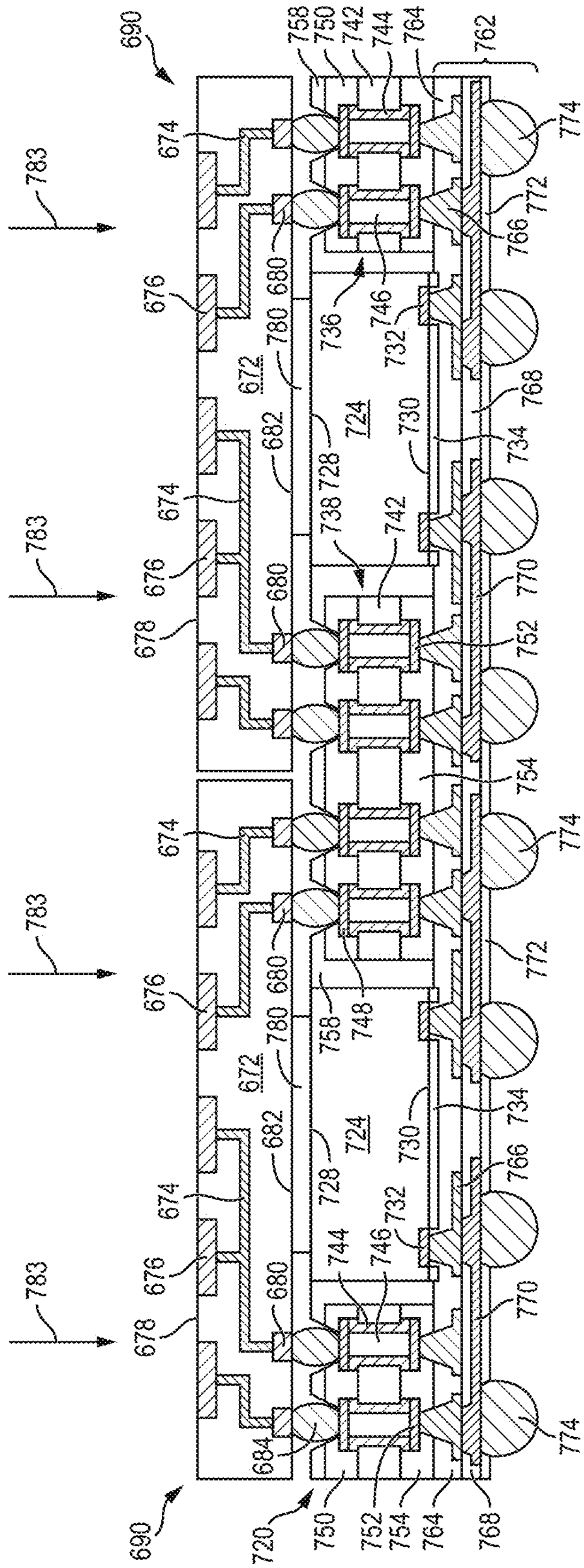

In FIG. 18*e*, interposers 690 are disposed over reconstituted wafer 720 and adhesive 780. Bumps 684 of interposer 690 are aligned with vertical interconnects 740 of PWB units 736 and 738. Interposer 690 is then pressed toward reconstituted wafer 720 in the direction of arrows 783, as shown in FIG. 18*f*. Bumps 684 are reflowed to metallurgically and electrically connect to conductive layer 748. In some applications, bumps 684 are reflowed a second time to improve electrical contact to conductive layer 748. Bumps 684 can also be compression bonded or thermocompression bonded to conductive layer 748. Adhesive 780 facilities in mounting interposer 690 to Fo-PoP 792 and reduces warpage.

Figure 18G:
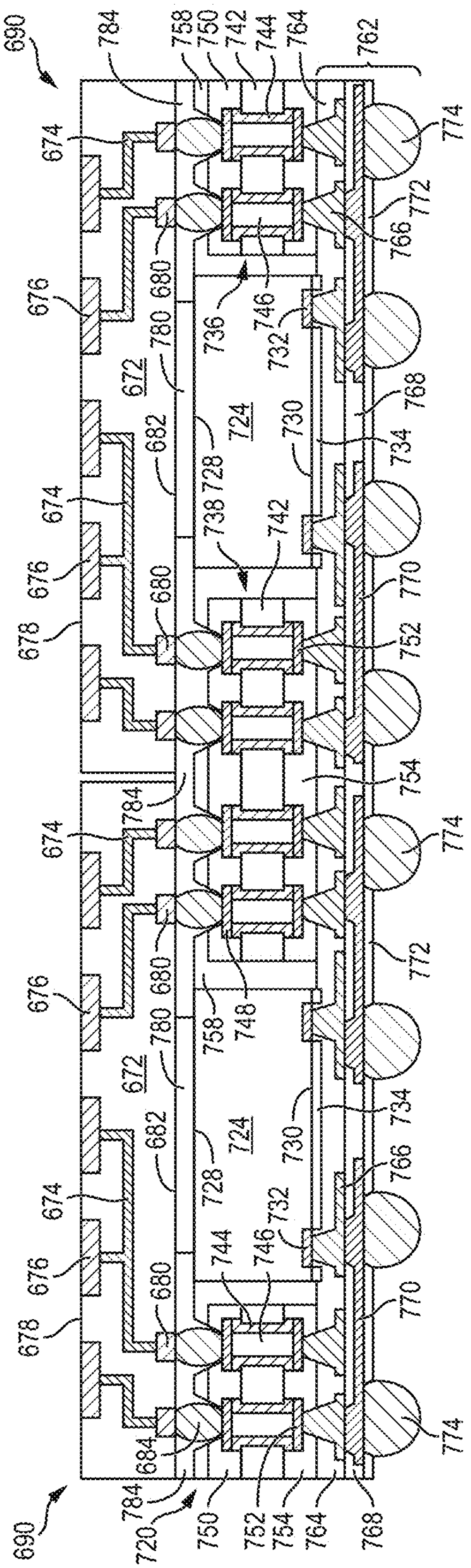

In FIG. 18*g*, an underfill material 784 is deposited between interposer 690 and reconstituted wafer 720 using a paste printing, jet dispense, compressive molding, transfer molding, liquid encapsulant molding, vacuum lamination, spin coating, mold underfill, or other suitable application process. Underfill 784 can be epoxy, epoxy-resin adhesive material, polymeric materials, films, or other non-conductive materials. Underfill 784 is non-conductive and environmentally protects the semiconductor device from external elements and contaminants.

Figure 18H:
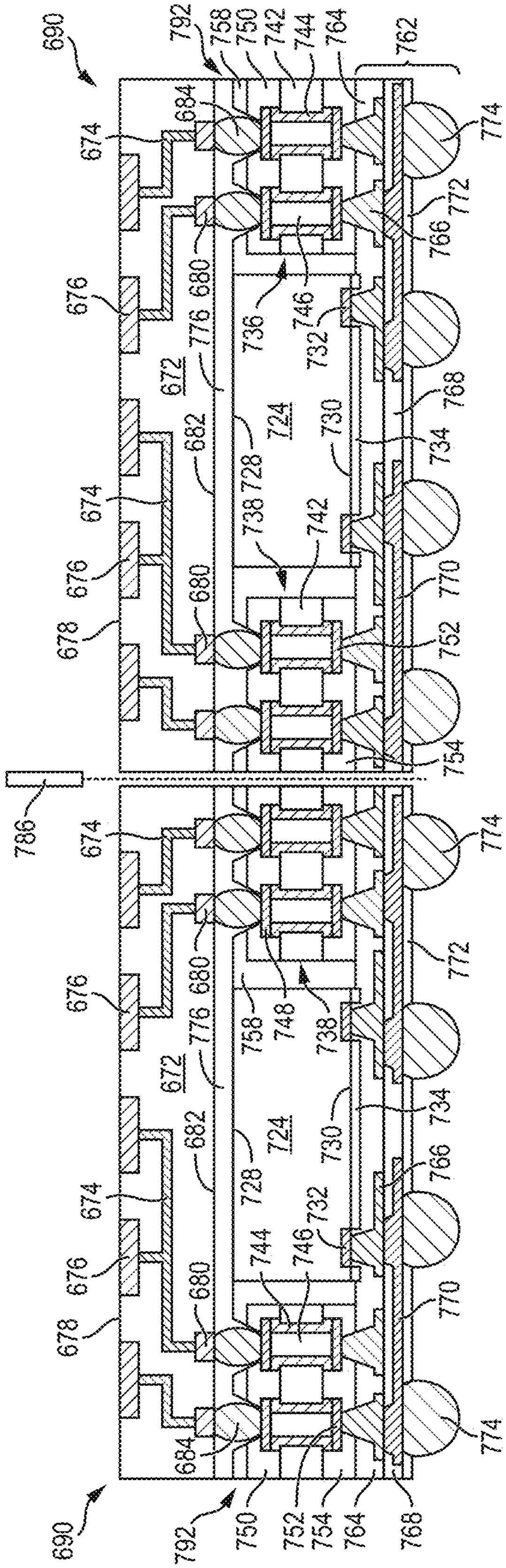

Continuing from FIG. 18*c*, FIG. 18*h* shows reconstituted wafer 720 being singulated through underfill material 776 and PWB unit 738 using saw blade or laser cutting tool 786 into individual Fo-PoP 792 with attached interposer 690. In one embodiment, reconstituted wafer 720 is singulated prior to mounting interposers 690, i.e., reconstituted wafer 720 is singulated into individual Fo-PoP 792 and each interposers 690 is then mounted to an individual Fo-PoP 792. When interposer 690 is mounted to individual Fo-PoP 792, as opposed to reconstituted wafer 720, the footprint of interposer 690 can be larger than the footprint of Fo-PoP 792. When interposer 690 is mounted to reconstituted wafer 720, i.e., pre-singulation, the footprint of interposer 690 may be the same as or smaller than the footprint of individual Fo-PoP 792.

Figure 18I:
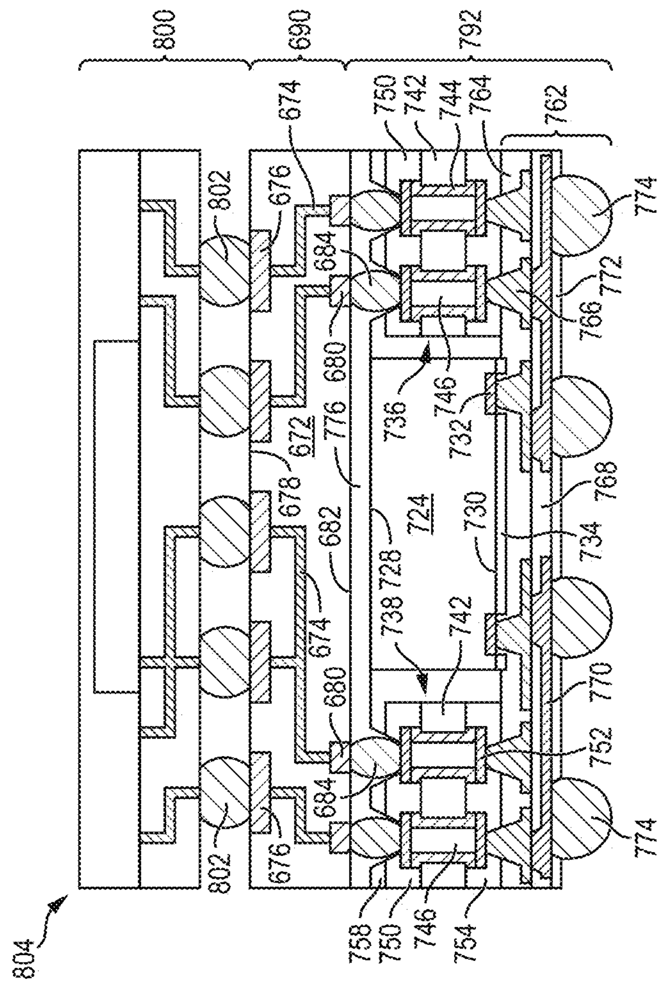

In FIG. 18*i*, a semiconductor die or device 800 is disposed over surface 678 of interposer 690. Semiconductor device 800 may include filter, memory, or other IC chips, processors, microcontrollers, known-good packages, or any other packaged device containing semiconductor die or other electronic devices or circuitry. In one embodiment, Fo-PoP 792 has an I/O count of 552 and semiconductor device 800 is a memory device with an I/O count of 504 and a bump pitch of approximately 500 μm.

Semiconductor device 800 is mounted to interposer 690 using pick and place or other suitable operation. Bumps 802 of semiconductor device 800 are aligned with conductive layer 676 of interposer 690. The pitch between bumps 802 coincides with the pitch of conductive layer 676 of interposer 690, e.g., the pitch of both bumps 802 and conductive layer 676 is 500 μm. Bumps 802 are reflowed to metallurgically and electrically connect to conductive layer 676. In some applications, bumps 802 are reflowed a second time to improve electrical contact to conductive layer 676. Bumps 802 are Al, Sn, Ni, Au, Ag, Pb, Bi, Cu, solder, and combinations thereof. Bumps 802 can be eutectic Sn/Pb, high-lead solder, or lead-free solder. Bumps 802 represent one type of interconnect structure that can be formed between semiconductor devices 800 and interposer 690. The interconnect structure can also use can also use bond wire, conductive paste, stud bump, micro bump, conductive pillar, composite interconnect structure, or other electrical interconnect. Semiconductor device 800 is electrically connected to semiconductor die 724 through interposer 690, PWB units 736 and 738, and build-up interconnect structure 762. Semiconductor device 800 is tested prior to mounting semiconductor device 800 to interposer 690 to assure that only known good devices are mounted to interposer 690.

Figure 19A:
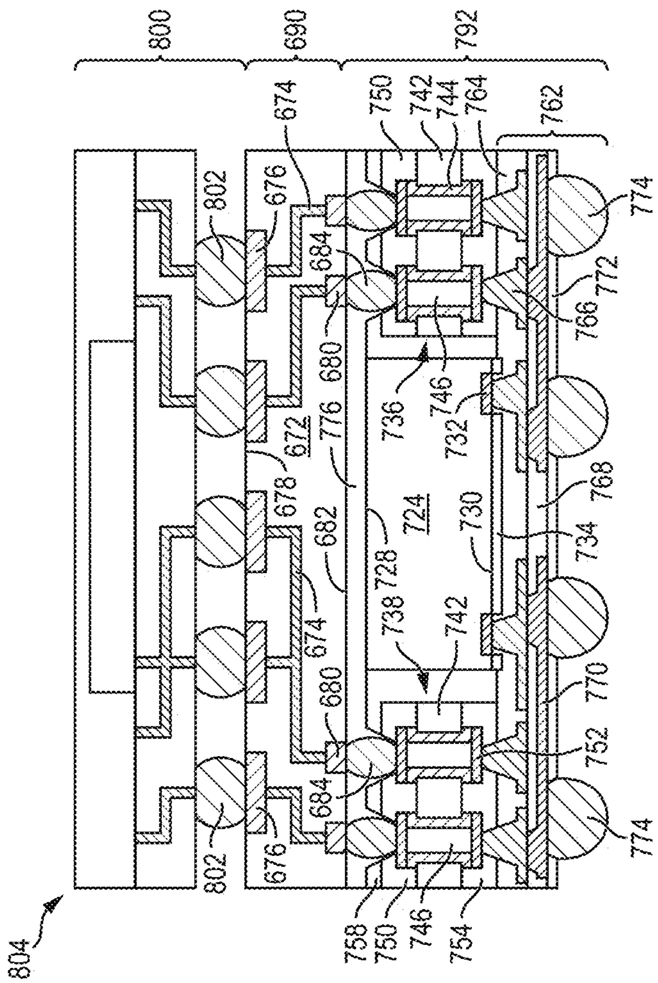
FIGS. 19*a*-19*c* illustrate 3-D semiconductor devices including a Fo-PoP with semiconductor die interconnected by PWB modular units having vertical interconnect structures.

Fo-PoP 792, interposer 690, and semiconductor device 800 form a 3-D semiconductor package 804 including a Fo-PoP with semiconductor die interconnected by PWB modular units having vertical interconnect structures. FIG. 19*a* shows 3-D semiconductor package 804. Semiconductor die 724 is electrically connected through build-up interconnect structure 762 to bumps 774 for connection to external devices. Semiconductor device 800 is electrically connected to semiconductor die 724 and external devices through interposer 690, PWB units 736 and 738, build-up interconnect structure 762, and bumps 774. The components of 3-D semiconductor package 804, i.e., Fo-PoP 792, interposer 690, and semiconductor device 800 are each fabricated separately. Forming Fo-PoP 792, interposer 690, and semiconductor device 800 separately allows each component to utilize a standardized infrastructure and fabrication process. For example, standardized materials and fabrication tools are employed to mass-produce reconstituted wafers 720 and Fo-PoP 792 for incorporation into 3-D semiconductor package 804 and a variety of other semiconductor packages. Incorporating standardized components within 3-D semiconductor package 804 lowers manufacturing costs, capital risk, and cycle time by reducing or eliminating the need for specialized semiconductor processing lines. Forming Fo-PoP 792, interposer 690, and semiconductor device 800 independent from one another also allows Fo-PoP 792, interposer 690, and semiconductor device 800 to be tested prior to incorporating each component into 3-D semiconductor package 804. Thus, only known good components are included in 3-D semiconductor package 804. By using only known good components, manufacturing steps and materials are not wasted making defective packages and the overall cost of 3-D semiconductor package 804 is reduced.

The thin profile of Fo-PoP 792 reduces the overall thickness of 3-D semiconductor package 804. In one embodiment, a thickness Fo-PoP 792 including bumps 774 is less than 0.4 mm. PWB modular units 736 and 738 are made with low cost manufacturing technology such as substrate manufacturing technology and provide a cost effective alternative to using standard laser drilling processes for vertical interconnection in Fo-PoP 792. Interposer 690 provides a cost effect, reliable electrical interconnection between Fo-PoP 792 and semiconductor device 800 without adding significant thickness to 3-D semiconductor package 804, e.g., interposer 690 has a thickness of 120 μm or less. In one embodiment, a thin flexible circuit sheet is provided for interposer 690 to further reduce the thickness of 3-D semiconductor package 804. Interposer 690 may also provide RF and SiP functions, e.g., interposer 690 may include an embedded thin film capacitor, inductor, and/or passive component, to increase the electrical performance and functionality of 3-D semiconductor package 804 without increasing the footprint of 3-D semiconductor package 804.

Figure 19B:
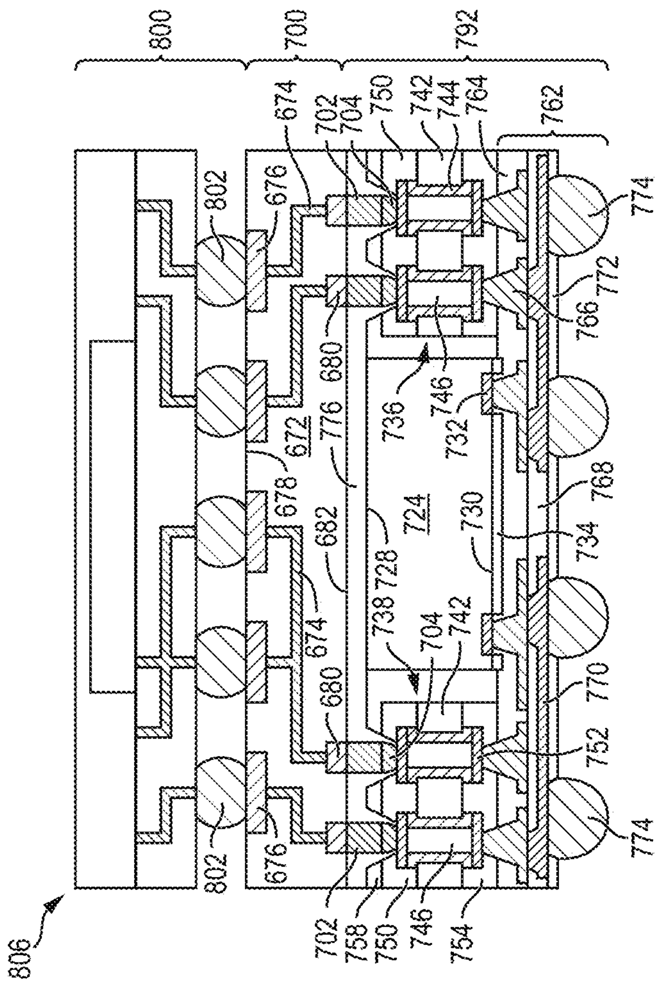

FIG. 19*b* shows 3-D semiconductor package 806, similar to FIG. 19*a*, with interposer 700, from FIG. 17*d* disposed between Fo-PoP 792 and semiconductor device 800. Bump caps 704 are reflowed to metallurgically and electrically connect interposer 700 to Fo-PoP 792.

Figure 19C:
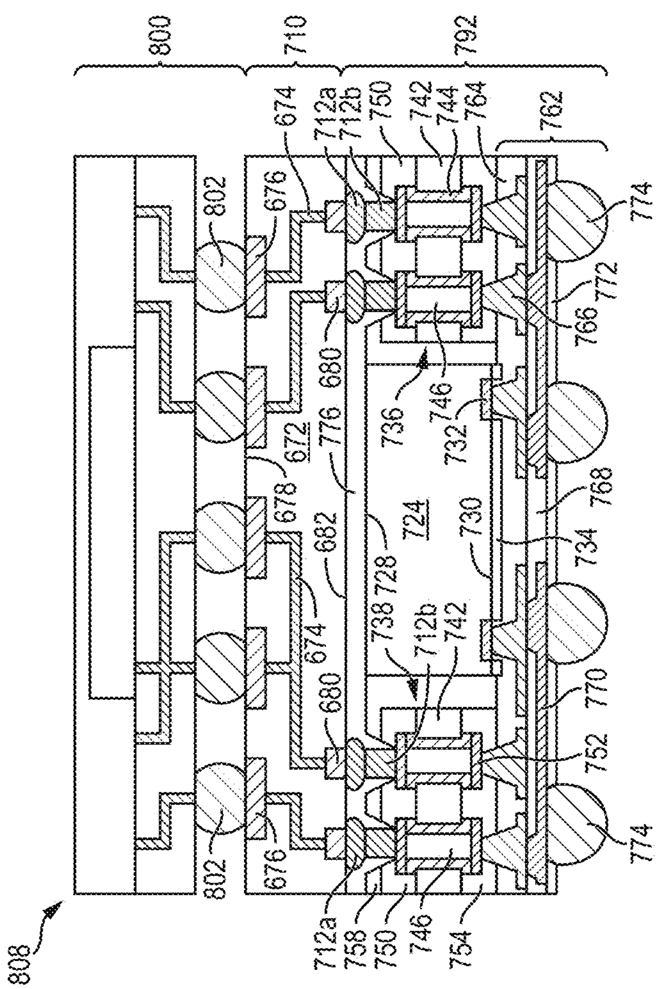

FIG. 19*c* shows 3-D semiconductor package 808, similar to FIG. 19*a*, with interposer 710, from FIG. 17*e* disposed between Fo-PoP 792 and semiconductor device 800. Stud bumps 712 are reflowed to metallurgically and electrically connect interposer 710 to Fo-PoP 792.

Figure 20A:
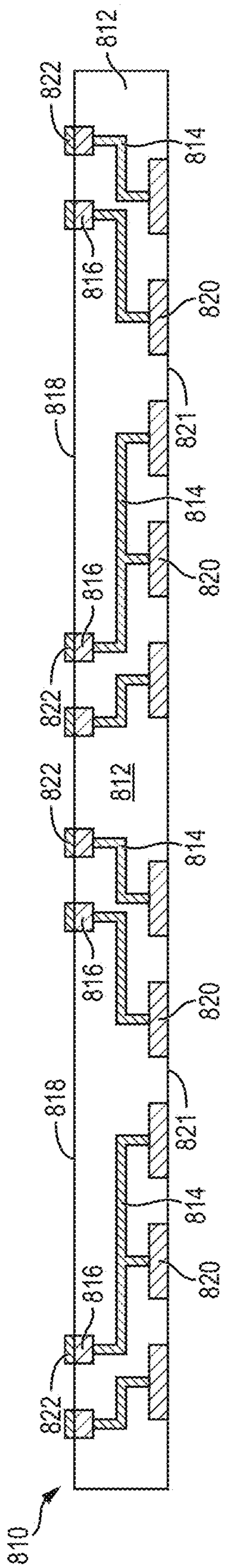

FIGS. 20*a*-201 illustrate, in relation to FIGS. 1 and 2*a*-2*c*, a process of forming a 3-D semiconductor package including a Fo-PoP with semiconductor die interconnected by PWB modular units having vertical interconnect structures. FIG. 20*a* shows a cross-sectional view of a substrate or interposer panel 810 containing insulating layers 812 and conductive layers 814. In one embodiment, interposer panel 810 contains one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Interposer panel 810 can be laminate based, thin flexible circuit based, ceramic, copper foil, glass, and may include a semiconductor wafer with an active surface containing one or more transistors, diodes, and other circuit elements to implement analog circuits or digital circuits.

Insulating layers 812 are formed using PVD, CVD, printing, lamination, spin coating, spray coating, sintering or thermal oxidation. Insulating layers 812 contain one or more layers of SiO2, Si3N4, SiON, Ta2O5, Al2O3, or other material having similar insulating and structural properties. Conductive layers 814 are formed using a patterning and metal deposition process such as sputtering, electrolytic plating, and electroless plating. Conductive layers 814 can be one or more layers of Al, Cu, Sn, Ni, Au, Ag, Ti, W, or other suitable electrically conductive material. Conductive layers 814 include lateral RDL and vertical conductive vias to provide electrical interconnect through interposer panel 810. Portions of conductive layers 814 are electrically common or electrically isolated according to the design and function of the semiconductor die or packages that are subsequently mounted to interposer panel 810.

A conductive layer or RDL 816 is formed in surface 818 of interposer panel 810 using a patterning and metal deposition process such as sputtering, electrolytic plating, or electroless plating. Conductive layer 816 can be one or more layers of Al, Cu, Sn, Ni, Au, Ag, or other suitable electrically conductive material. Conductive layer 816 operates as contact pads electrically connected to conductive layers 814 within interposer panel 810. In one embodiment, contact pads 816 have a pitch of 300 μm or less and a diameter of approximately 200 μm.

A conductive layer or RDL 820 is formed in surface 821 of interposer panel 810 using a patterning and metal deposition process such as sputtering, electrolytic plating, or electroless plating. Conductive layer 820 can be one or more layers of Al, Cu, Sn, Ni, Au, Ag, or other suitable electrically conductive material. Conductive layer 820 operates as contact pads electrically connected to conductive layers 814 within interposer panel 810. In one embodiment, contact pads 820 have a pitch of 500 μm or less. Conductive layer 820 is electrically connected to conductive layer 816 through conductive layers 814.

An interconnect structure or solder paste 822 is printed on conductive layer 816 of interposer panel 810. In one embodiment, interconnect structure 822 is formed by depositing a shallow solder cap on conductive layer 816 followed by a flux stencil printing. Solder paste 822 represents one type of interconnect structure that can be formed over conductive layer 816. The interconnect structure can also use bond wire, stud bump, micro bump, conductive pillar, composite interconnect structure, or other electrical interconnect.

Figure 20B:
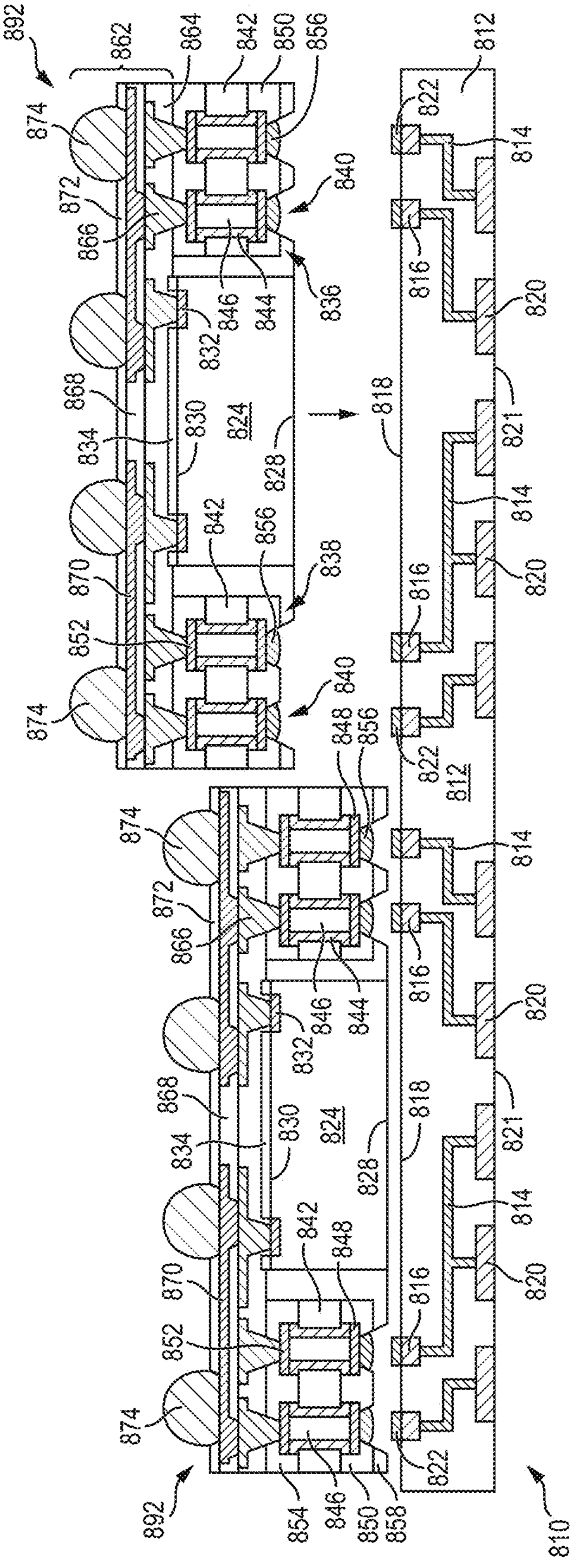

In FIG. 20*b*, Fo-PoP 892, similar to Fo-PoP 792 in FIG. 18*i*, are disposed over interposer panel 810 using a pick and place operation with back surface 828 of semiconductor die 824 and conductive layer 848 of PWB units 836 and 838 oriented toward surface 818 of interposer panel 810.

Fo-PoP 892 includes semiconductor die 824, PWB modular units 836 and 838, and build-up interconnect structure 862. Semiconductor die 824, similar to semiconductor die 124 from FIG. 3*c*, has a back surface 828 and an active surface 830 opposite back surface 828. Active surface 830 contains analog or digital circuits implemented as active devices, passive devices, conductive layers, and dielectric layers formed within the semiconductor die and electrically interconnected according to the electrical design and function of the semiconductor die. An electrically conductive layer 832 is formed over active surface 830. Conductive layer 832 operates as contact pads that are electrically connected to the circuits on active surface 830. An insulating or passivation layer 834 is conformally applied over active surface 830. A portion of insulating layer 834 is removed by LDA, etching, or other suitable process to expose portions of conductive layer 832.

PWB modular units 836 and 838 including vertical interconnects 840 are disposed around semiconductor die 824, similar to PWB modular units 164 and 166 in FIG. 5*g*. PWB modular units 836 and 838 include core substrate 842. Core substrate 842 includes one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Alternatively, core substrate 842 includes one or more insulating or passivation layers.

A plurality of through vias is formed through core substrate 842 using laser drilling, mechanical drilling, or DRIE. A conductive layer 844 is formed over core 842 and the sidewalls of the vias using a metal deposition process such as printing, PVD, CVD, sputtering, electrolytic plating, and electroless plating. Conductive layer 844 can be one or more layers of Al, Cu, Sn, Ni, Au, Ag, Ti, W, or other suitable electrically conductive material. In one embodiment, conductive layer 844 includes a first Cu layer formed by electroless plating, followed by a second Cu layer formed by electrolytic plating.

The remaining space in the vias is filled with an insulating or conductive filler material 846. The insulating filler material can be polymer dielectric material with filler and one or more layers of SiO2, Si3N4, SiON, Ta2O5, Al2O3, or other material having similar insulating and structural properties. The conductive filler material can be one or more layers of Al, Cu, Sn, Ni, Au, Ag, or other suitable electrically conductive material. In one embodiment, filler material 846 is a polymer plug. Alternatively, filler material 846 is Cu paste. The vias can also be left void, i.e., without filler material. Filler material 846 is selected to be softer or more compliant than conductive layer 844. Filler material 846 reduces the incidence of cracking or delamination by allowing deformation or change of shape of conductive layer 844 under stress. Alternatively, the vias can be completely filled with conductive layer 844.

A conductive layer 848 is formed over conductive layer 844 and filler material 846 using a metal deposition process such as printing, PVD, CVD, sputtering, electrolytic plating, and electroless plating. Conductive layer 848 can be one or more layers of Al, Cu, Sn, Ni, Au, Ag, Ti, W, or other suitable electrically conductive material. In one embodiment, conductive layer 848 includes a first Cu layer formed by electroless plating, followed by a second Cu layer formed by electrolytic plating.

An insulating or passivation layer 850 is formed over the surface of core substrate 842 and conductive layer 848 using PVD, CVD, printing, spin coating, spray coating, slit coating, rolling coating, lamination, sintering, or thermal oxidation. Insulating layer 850 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 850 is removed by LDA, etching, or other suitable process to expose portions of conductive layer 848. In one embodiment, insulating layer 850 is a masking layer.

An electrically conductive layer 852 is formed over conductive layer 844 and filler material 846 opposite conductive layer 848 using a metal deposition process such as printing, PVD, CVD, sputtering, electrolytic plating, and electroless plating. Conductive layer 852 can be one or more layers of Al, Cu, Sn, Ni, Au, Ag, Ti, W, or other suitable electrically conductive material. In one embodiment, conductive layer 752 includes a first Cu layer formed by electroless plating, followed by a second Cu layer formed by electrolytic plating. Conductive layer 852 is electrically connected to conductive layer 848 through conductive layer 844. Conductive layers 844, 848, and 852 form vertical interconnects 840 through core substrate 842.

An insulating or passivation layer 854 is formed over the surface of core substrate 842 and conductive layer 852 using PVD, CVD, printing, spin coating, spray coating, slit coating, rolling coating, lamination, sintering, or thermal oxidation. Insulating layer 854 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 854 is removed by LDA, etching, or other suitable process to expose portions of conductive layer 852. In one embodiment, insulating layer 854 is a masking layer. An optional protection layer 856, e.g., a solder cap or Cu OSP, is formed over conductive layer 848.

PWB units 836 and 838 are disposed around semiconductor die 824 in an interlocking pattern such that different sides of semiconductor die 824 are aligned with, and correspond to, a number of different sides of the PWB units in a repeating pattern. PWB modular units 836 and 838 are laterally offset from semiconductor die 824. Back surface 828 of semiconductor die 824 is offset from PWB modular units 836 and 838 by at least 1 μm, similar to FIG. 5*g*. In one embodiment, a thickness between back surface 828 of semiconductor die 824 and PWB units 836 and 838 is 1-150 μm. An encapsulant 858 is deposited over semiconductor die 824 and PWB units 836 and 838. A portion of encapsulant 858 is removed in a grinding operation. The grinding operation planarizes the surfaces of encapsulant 858 and semiconductor die 824, and reduces a thickness of Fo-PoP 892. A backside balance layer, similar to backside balance layer 196 in FIG. 5*g*, or an insulating layer, similar to insulating layer 296 in FIG. 6*m*, may be applied over encapsulant 858, PWB units 836 and 838, and semiconductor die 824 after the grinding operation. After the grinding operation, portions of encapsulant 858 are selectively removed by etching, LDA, or other suitable process to expose vertical interconnect structures 840. In one embodiment, encapsulant 858 and insulating layer 850 are removed at the same time, i.e., in the same manufacturing step.

Build-up interconnect structure 862, similar to build-up interconnect structure 180 in FIG. 5*e*, is formed over encapsulant 858, PWB units 836 and 838, and semiconductor die 824. An insulating or passivation layer 864 is formed over semiconductor die 824, PWB units 836 and 838, and encapsulant 858 using PVD, CVD, lamination, printing, spin coating, or spray coating. The insulating layer 864 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 864 is selectively removed by LDA, etching, or other suitable process to expose vertical interconnect structures 840 of PWB units 836 and 838, and conductive layer 832 of semiconductor die 824.

An electrically conductive layer or RDL 866 is formed over insulating layer 864 using a patterning and metal deposition process such as sputtering, electrolytic plating, and electroless plating. Conductive layer 866 can be one or more layers of Al, Cu, Sn, Ni, Au, Ag, or other suitable electrically conductive material. In one embodiment, conductive layer 866 contains Ti/Cu, TiW/Cu, or Ti/NiV/Cu. One portion of conductive layer 866 is electrically connected to conductive layer 832 of semiconductor die 824. Another portion of conductive layer 866 is electrically connected to vertical interconnect structures 840 of PWB units 836 and 838. Other portions of conductive layer 866 can be electrically common or electrically isolated depending on the design and function of semiconductor die 824.

An insulating or passivation layer 868 is formed over insulating layer 864 and conductive layer 866 using PVD, CVD, lamination, printing, spin coating, or spray coating. The insulating layer 868 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 868 is removed by LDA, etching, or other suitable process to expose conductive layer 866.

An electrically conductive layer or RDL 870 is formed over insulating layer 868 and conductive layer 866 using a patterning and metal deposition process such as sputtering, electrolytic plating, and electroless plating. Conductive layer 870 can be one or more layers of Al, Cu, Sn, Ni, Au, Ag, or other suitable electrically conductive material. In one embodiment, conductive layer 870 contains Ti/Cu, TiW/Cu, or Ti/NiV/Cu. One portion of conductive layer 870 is electrically connected to conductive layer 866. Other portions of conductive layer 870 can be electrically common or electrically isolated depending on the design and function of semiconductor die 824.

An insulating or passivation layer 872 is formed over insulating layer 868 and conductive layer 870 using PVD, CVD, printing, spin coating, or spray coating. The insulating layer 872 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 872 is removed by LDA, etching, or other suitable process to expose conductive layer 870.

The number of insulating and conductive layers included within build-up interconnect structure 862 depends on, and varies with, the complexity of the circuit routing design. Accordingly, build-up interconnect structure 862 can include any number of insulating and conductive layers to facilitate electrical interconnect with respect to semiconductor die 824.

An electrically conductive bump material is deposited over build-up interconnect structure 862 and electrically connected to the exposed portion of conductive layer 870 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 870 using a suitable attachment or bonding process. In one embodiment, the bump material is reflowed by heating the material above the material's melting point to form spherical balls or bumps 874. In some applications, bumps 874 are reflowed a second time to improve electrical contact to conductive layer 870. In one embodiment, bumps 874 are formed over a UBM layer. Bumps 874 can also be compression bonded or thermocompression bonded to conductive layer 870. Bumps 874 represent one type of interconnect structure that can be formed over conductive layer 870. The interconnect structure can also use bond wire, conductive paste, stud bump, micro bump, conductive pillar, composite interconnect structure, or other electrical interconnect. In one embodiment, bumps 874 have a pitch of 400 μm or less.

Figure 20C:
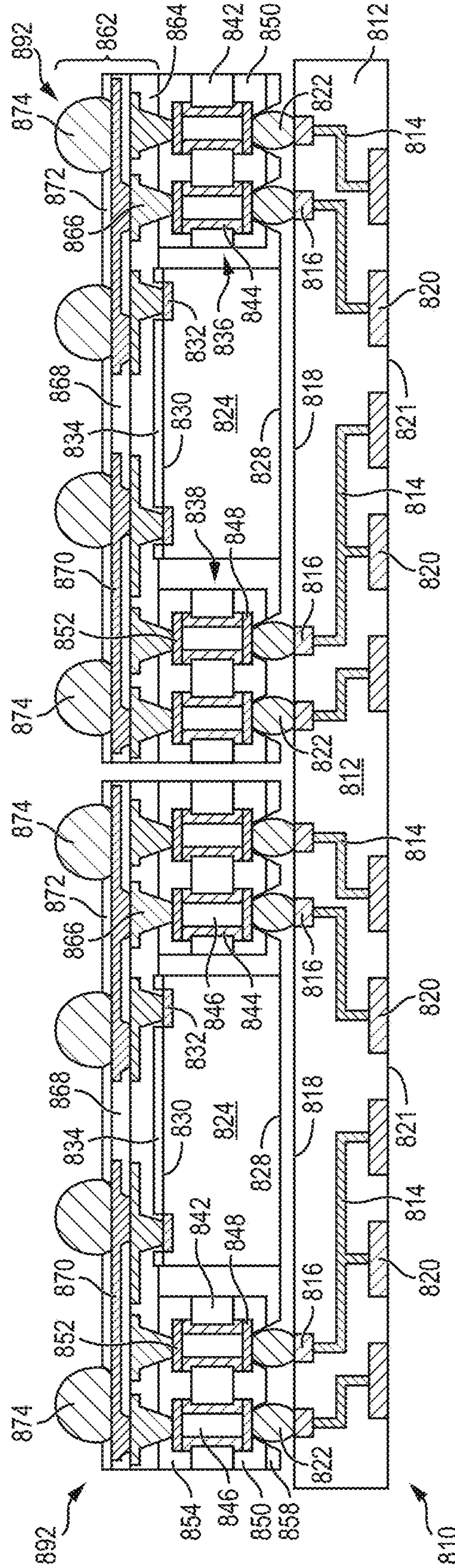

FIG. 20*c* shows Fo-PoP 892 mounted to interposer panel 810. Solder paste 822 is reflowed to metallurgically and electrically connect to conductive layer 848. In some applications, solder paste 822 is reflowed a second time to improve electrical contact to conductive layer 848. In one embodiment, an adhesive material, similar to adhesive 780 in FIG. 18*d*, is deposited over back surface 828 of semiconductor die 824 prior to mounting Fo-PoP 892 to interposer panel 810. Fo-PoP 892 are tested prior to mounting Fo-PoP 892 to interposer panel 810 to assure that only known good packages are mounted to interposer panel 810.

Figure 20D:
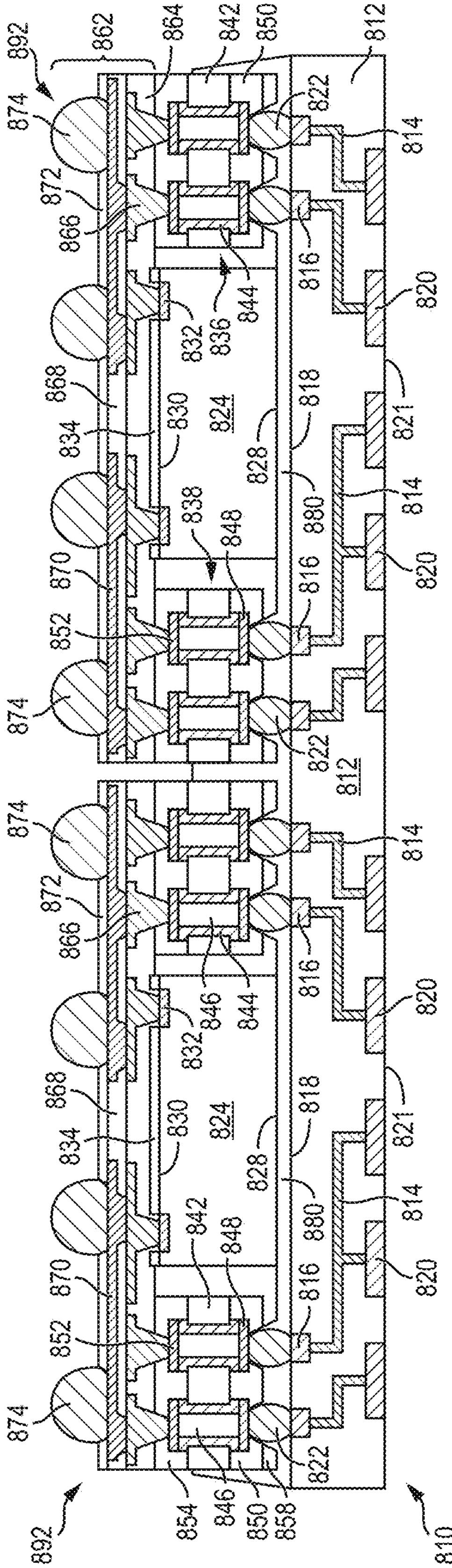

In FIG. 20*d*, an underfill material 880 deposited between Fo-PoP 892 and interposer panel 810 using a paste printing, jet dispense, compressive molding, transfer molding, liquid encapsulant molding, vacuum lamination, spin coating, mold underfill, or other suitable application process. Underfill 880 can be epoxy, epoxy-resin adhesive material, polymeric materials, films, or other non-conductive materials. Underfill 880 is non-conductive and environmentally protects the semiconductor device from external elements and contaminants.

Figure 20E:
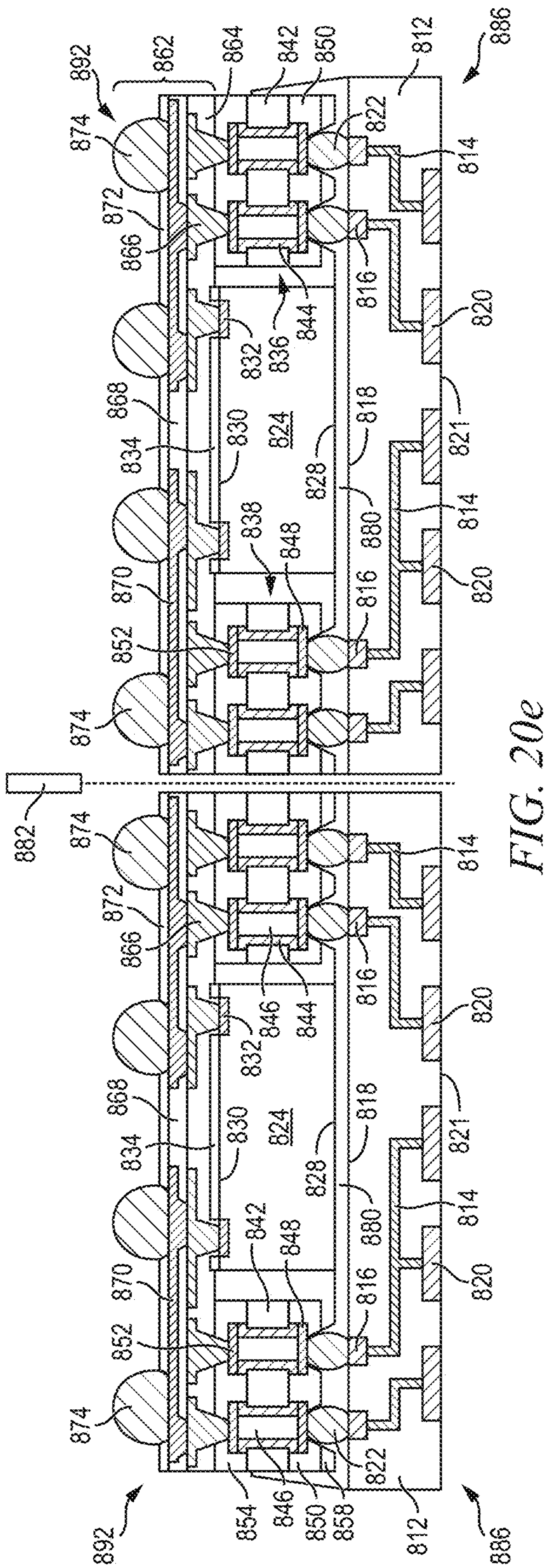

In FIG. 20*e*, interposer panel 810 is singulated through underfill material 880 and insulating layers 812 using a saw blade or laser cutting tool 882 to form individual interposers 886 with Fo-PoP 892 mounted over surface 818. In one embodiment, interposer panel 810 is singulated prior to mounting Fo-PoP 892, i.e., interposer panel 810 is singulated into individual interposers 886 and each Fo-PoP 892 is then mounted to an individual interposer 886.

Figure 20F:
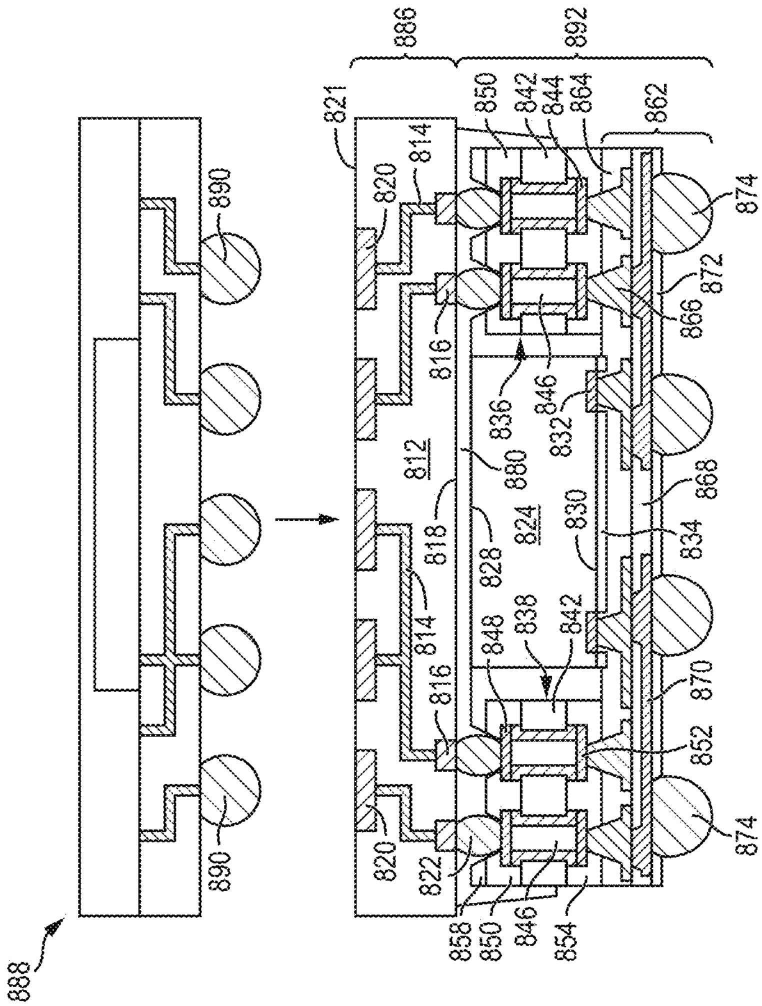

In FIG. 20*f*, a semiconductor die or device 888 is disposed over surface 821 of interposer 886 using a pick and place or other suitable operation. Semiconductor device 888 may include filter, memory, or other IC chips, processors, microcontrollers, known-good packages, or any other packaged device containing semiconductor die or other electronic devices or circuitry. In one embodiment, Fo-PoP 892 has an I/O count of 552 and semiconductor device 888 is a memory device with an I/O count of 504 and a bump pitch of approximately 500 μm. Bumps 890 of semiconductor device 888 are aligned with conductive layer 820 of interposer 886. The pitch between bumps 890 coincides with the pitch of conductive layer 820 of interposer 886, e.g., the pitch of both bumps 890 and conductive layer 820 is 500 μm. Bumps 890 can be Al, Sn, Ni, Au, Ag, Pb, Bi, Cu, solder, and combinations thereof, with an optional flux solution. For example, the bump material can be eutectic Sn/Pb, high-lead solder, or lead-free solder. Bumps 890 represent one type of interconnect structure that can be formed over semiconductor devices 888. The interconnect structure can also use bond wire, conductive paste, stud bump, micro bump, conductive pillar, composite interconnect structure, or other electrical interconnect. Alternatively, bumps 890 can be formed on conductive layer 820 of interposer 886.

Figure 20G:
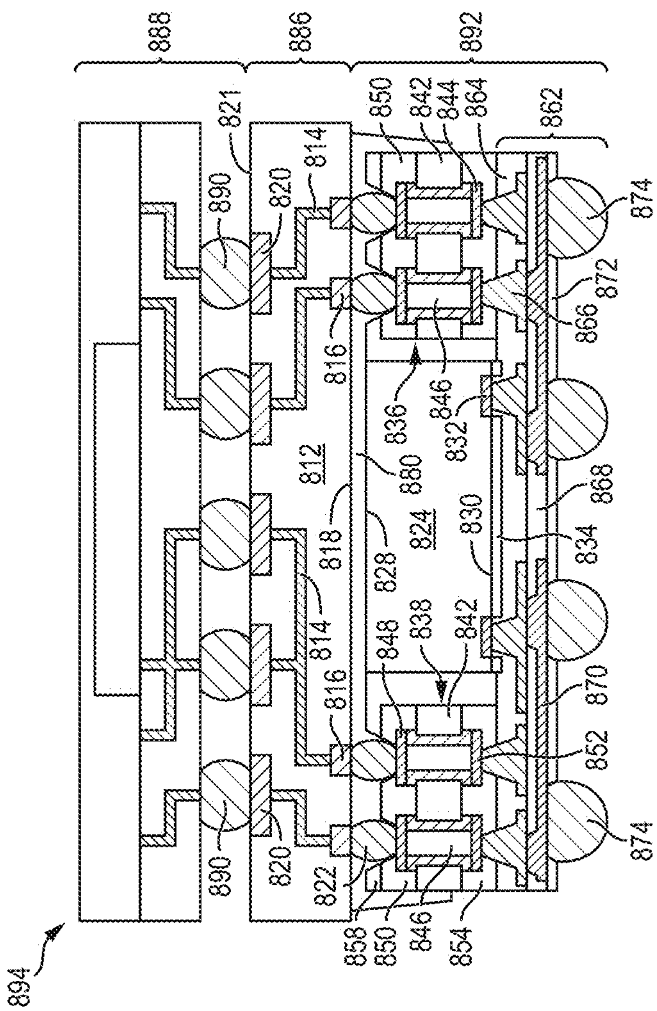
Figure 20H:
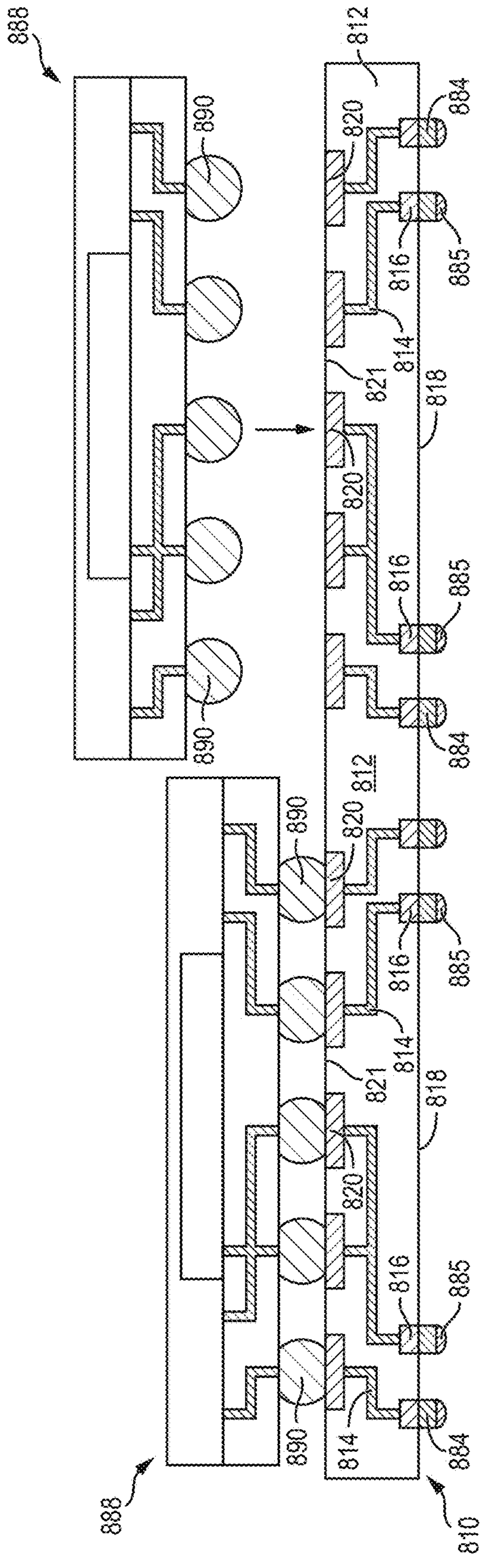

FIG. 20*g* shows semiconductor device 888 mounted to interposer 886 over Fo-PoP 892 to form a 3-D semiconductor package 894. Bumps 890 are reflowed to metallurgically and electrically connect to conductive layer 820. In some applications, bumps 890 are reflowed a second time to improve electrical contact to conductive layer 820. Semiconductor device 888 is electrically connected to semiconductor die 824 through interposer 886, PWB units 836 and 838, and build-up interconnect structure 862.

In another embodiment, continuing from FIG. 20*a*, interposer panel 810 includes conductive pillars 884 and bump caps 885, similar to conductive pillars 702 and bump caps 704 in FIG. 17*d*, formed over conductive layer 816. Conductive pillars 884 are formed by depositing a patterning or photoresist layer over surface 818 of interposer panel 810. A portion of the photoresist layer is removed by an etching process to form vias down to conductive layer 816. Alternatively, a portion of the photoresist layer is removed by LDA to form vias exposing conductive layer 816. An electrically conductive material is deposited within the vias over conductive layer 816 using an evaporation, sputtering, electrolytic plating, electroless plating, screen printing, or other suitable metal deposition process. The conductive material can be Cu, Al, W, Au, solder, or other suitable electrically conductive material. In one embodiment, the conductive material is deposited by plating Cu in the vias. The photoresist layer is removed by an etching process to leave individual conductive pillars 884.

An electrically conductive bump material is deposited over conductive pillars 884 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded bump cap 885. The combination of conductive pillars 884 and bump cap 885 constitute a composite interconnect structure with a non-fusible portion (conductive pillar 884) and a fusible portion (bump cap 885). In one embodiment, the diameter of conductive pillars 884 ranges from 115 μm to 145 μm and the pitch between adjacent bump caps 885 is 300 μm or less.

Semiconductor device 888 is disposed over surface 821 of interposer panel 810 using pick and place or other suitable operation. Bumps 890 of semiconductor device 888 are aligned with conductive layer 820 of interposer panel 810. The pitch between bumps 890 coincides with the pitch of conductive layer 820, e.g., the pitch of both bumps 890 and conductive layer 820 is 500 μm. In one embodiment, bumps 890 are formed on conductive layer 820 instead of semiconductor device 888.

Figure 20I:
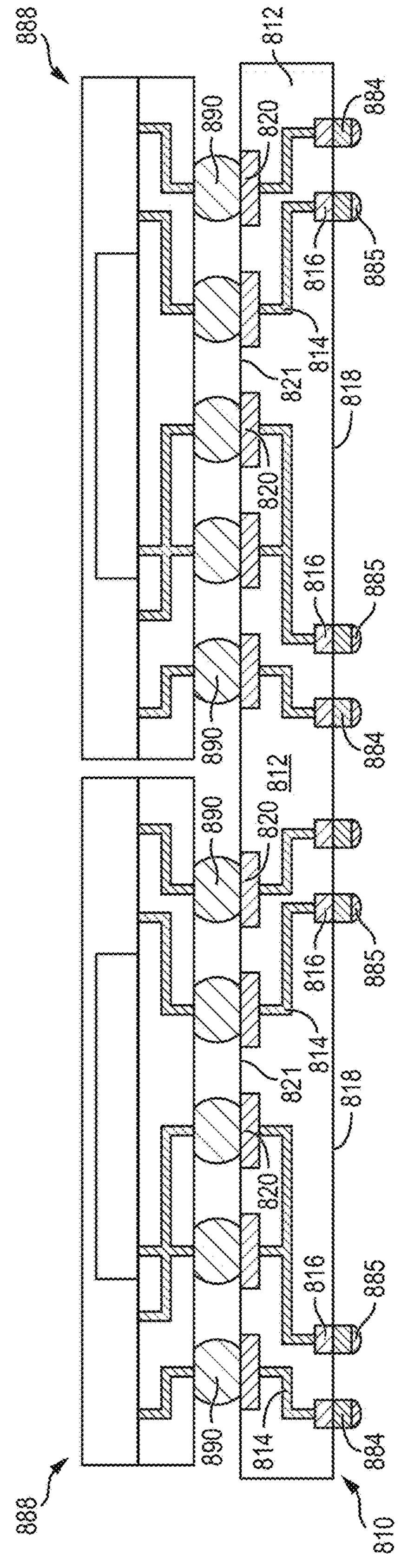

FIG. 20*i* shows semiconductor device 888 mounted to interposer panel 810. Bumps 890 are reflowed to metallurgically and electrically connect to conductive layer 820. In some applications, bumps 890 are reflowed a second time to improve electrical contact to conductive layer 820. Bumps 890 represent one type of interconnect structure that can be formed between semiconductor device 888 and interposer panel 810. The interconnect structure can also use bond wire, conductive paste, stud bump, micro bump, conductive pillar, composite interconnect structure, or other electrical interconnect. In one embodiment, an underfill material is disposed between semiconductor device 888 and interposer panel 810.

Figure 20J:
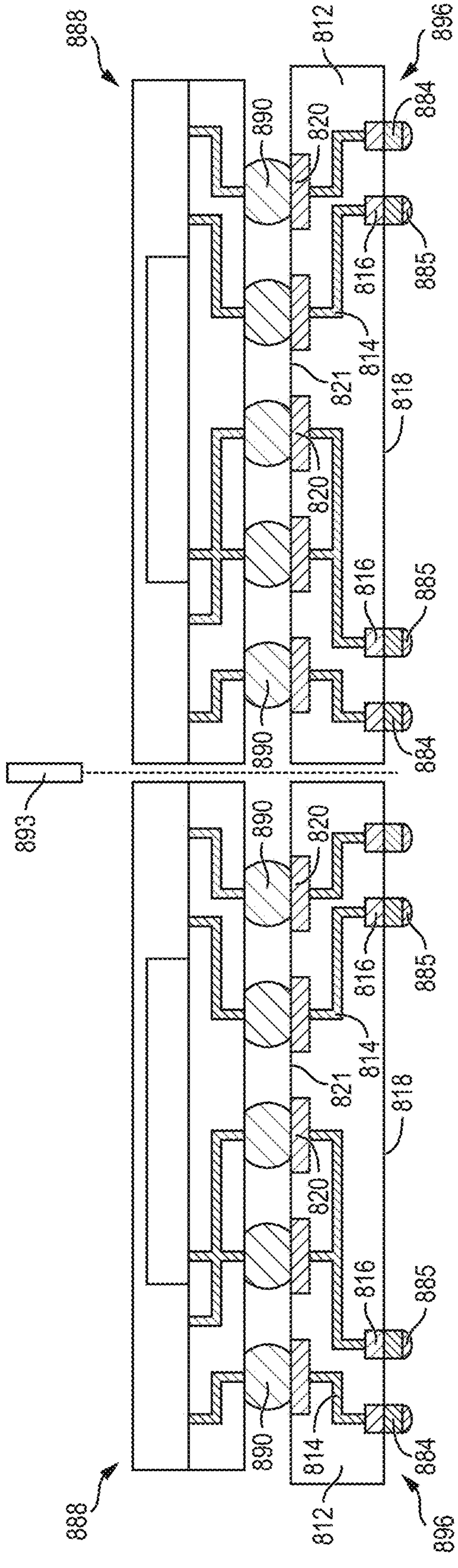

In FIG. 20*j*, interposer panel 810 is singulated through insulating layers 812 using a saw blade or laser cutting tool 893 to form individual interposers 896 with semiconductor device 888 mounted over surface 821. In one embodiment, interposer panel 810 is singulated prior to mounting semiconductor device 888, i.e., interposer panel 810 is singulated into individual interposers 896 and each semiconductor device 888 is then mounted to an individual interposer 896.

Figure 20K:
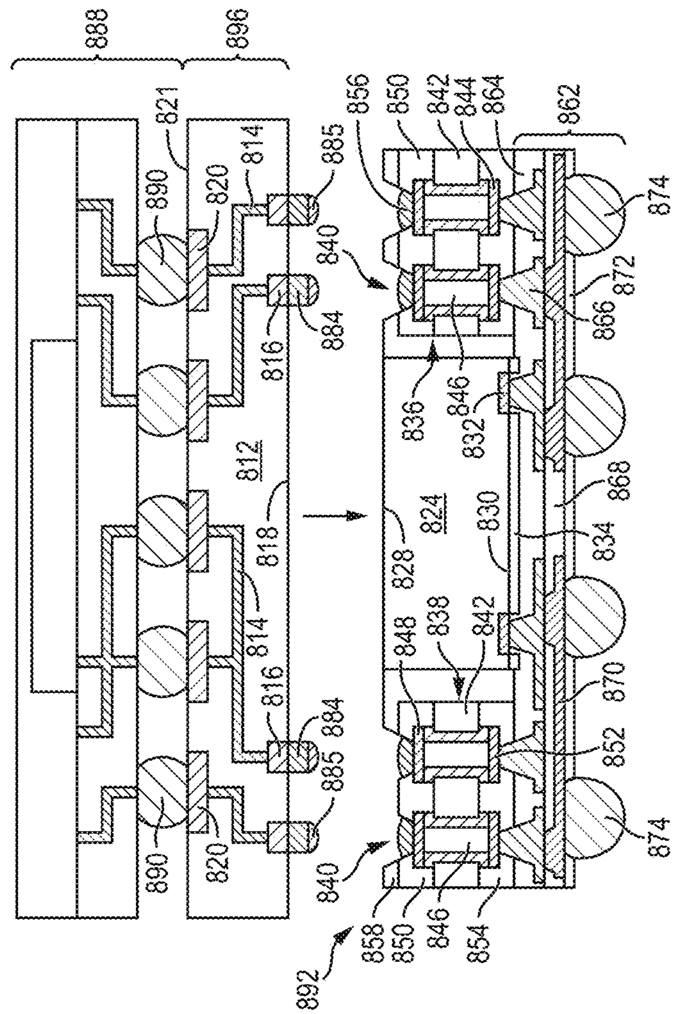
Figure 20I:
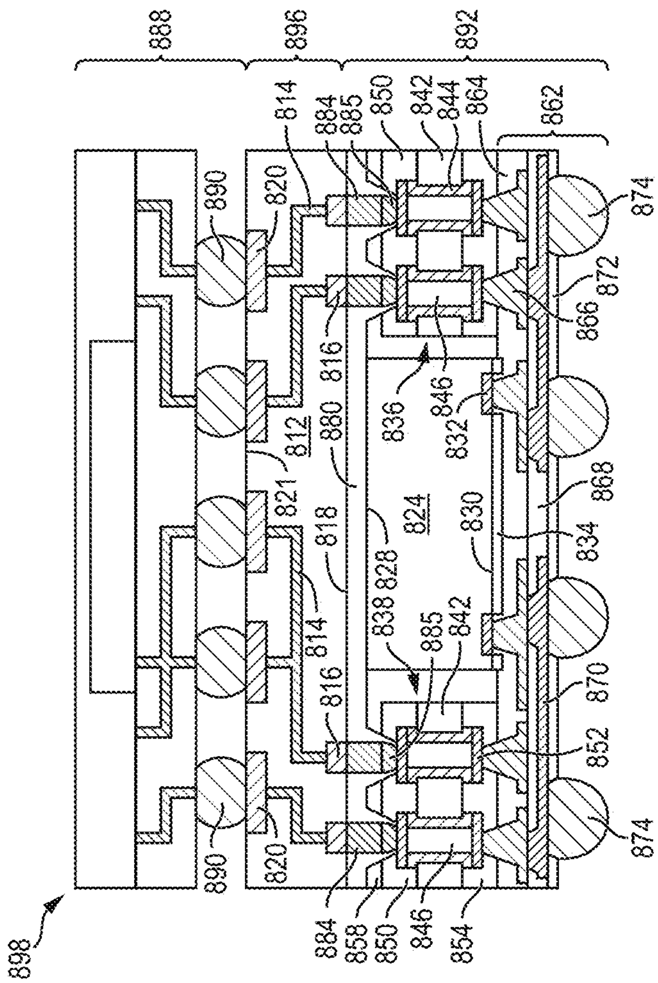

In FIG. 20*k* interposer 886 and semiconductor device 888 are disposed over Fo-PoP 892 from FIG. 20*b* with surface 818 of interposer 896 oriented toward Fo-PoP 892. In one embodiment, interposer 896 and semiconductor device 888 are disposed over Fo-PoP 892 on a panel level, i.e., interposer 896 and semiconductor device 888 are disposed over a reconstituted wafer containing Fo-PoP 892 prior to singulating the reconstituted wafer into individual Fo-PoP 892, similar to FIG. 18*b*. Conductive pillars 884 of interposer 896 are aligned with exposed vertical interconnects 840 of Fo-PoP 892. The pitch between adjacent conductive pillars 884 coincides with the pitch of exposed vertical interconnects 840, e.g., the pitch of both conductive pillars 884 and the exposed vertical interconnects 840 is 300 μm. In one embodiment, an adhesive material, similar to adhesive 780 in FIG. 18*d*, is deposited over back surface 828 of semiconductor die 824 prior to mounting interposer 896.

FIG. 20*l* shows interposer 896 and semiconductor device 888 mounted to Fo-PoP 892. Bump caps 885 are reflowed to metallurgically and electrically connect to vertical interconnects 840. In some applications, bump caps 885 are reflowed a second time to improve electrical contact to conductive layer 848. Semiconductor device 888 is electrically connected to semiconductor die 824 through interposer 896, PWB units 836 and 838, and build-up interconnect structure 862. Underfill material 880 is deposited between Fo-PoP 892 and interposer 896 using a paste printing, jet dispense, compressive molding, transfer molding, liquid encapsulant molding, vacuum lamination, spin coating, mold underfill, or other suitable application process. Fo-PoP 892, interposer 896, and semiconductor device 888 form a 3-D semiconductor package 898, similar to 3-D semiconductor package 894 in FIG. 20*g*.

Figure 21:
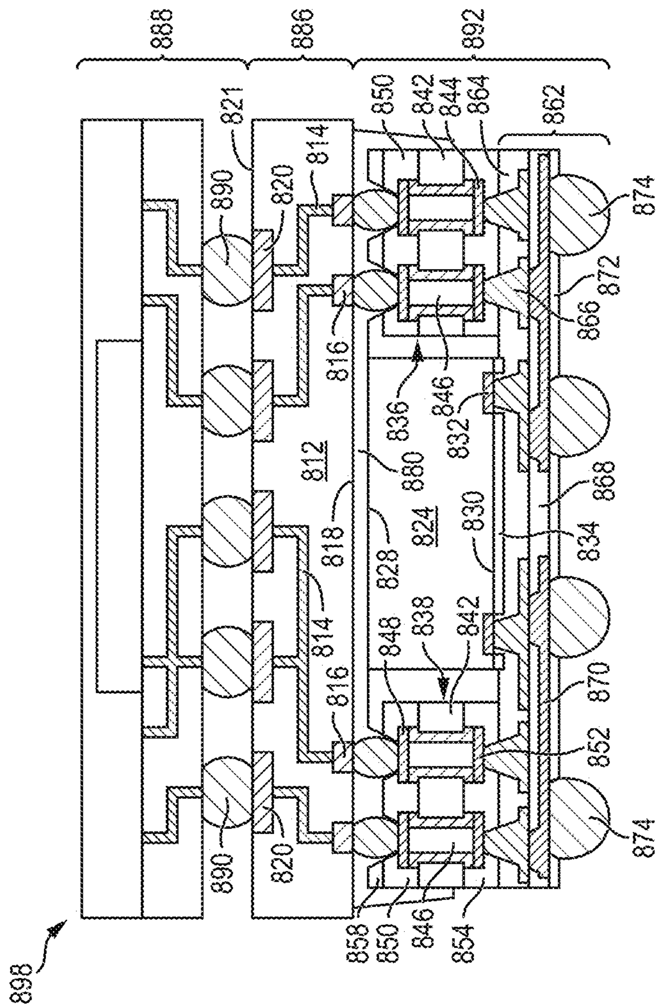
FIG. 21 illustrates a 3-D semiconductor device including a Fo-PoP with semiconductor die interconnected by PWB modular units having vertical interconnect structures.

FIG. 21 shows 3-D semiconductor package 894 from FIG. 20*g*. Semiconductor die 824 is electrically connected through build-up interconnect structure 862 to bumps 874 for connection to external devices. Semiconductor device 888 is electrically connected to semiconductor die 824 and external devices through interposer 886, PWB units 836 and 838, build-up interconnect structure 862, and bumps 874. The components of 3-D semiconductor package 894, i.e., Fo-PoP 892, interposer 886, and semiconductor device 888 are each fabricated separately. Forming Fo-PoP 892, interposer 886, and semiconductor device 888 separately allows each component to utilize a standardized infrastructure and fabrication process. For example, standardized materials and fabrication tools are employed to mass-produce Fo-PoP 892 and interposer 886 for incorporation into 3-D semiconductor package 894 and a variety of other semiconductor packages. Incorporating standardized components within 3-D semiconductor package 894 lowers manufacturing costs, capital risk, and cycle time by reducing or eliminating the need for specialized semiconductor processing lines. Forming Fo-PoP 892, interposer 886, and semiconductor device 888 independent from one another also allows Fo-PoP 892, interposer 886, and semiconductor device 888 to be tested prior to incorporating each component into 3-D semiconductor package 894. Thus, only known good components are included in 3-D semiconductor package 894. By using only known good components, manufacturing steps and materials are not wasted making defective packages and the overall cost of 3-D semiconductor package 894 is reduced.

The thin profile of Fo-PoP 892 reduces the overall thickness of 3-D semiconductor package 894. In one embodiment, a thickness Fo-PoP 892 including bumps 874 is less than 0.4 mm. PWB modular units 836 and 838 are made with low cost manufacturing technology such as substrate manufacturing technology and provide a cost effective alternative to using standard laser drilling processes for vertical interconnection in Fo-PoP 892. Interposer 886 provides a cost effect, reliable electrical interconnection between Fo-PoP 892 and semiconductor device 888 without adding significant thickness to 3-D semiconductor package 894, e.g., interposer 886 has a thickness of 120 μm or less. In one embodiment, interposer 886 is a thin flexible circuit sheet to further reduce the thickness of 3-D semiconductor package 894. Interposer 886 may also provide RF and SiP functions, e.g., interposer 886 may include an embedded thin film capacitor, inductor, and/or passive component, to increase the electrical performance and functionality of 3-D semiconductor package 894 without increasing the footprint of 3-D semiconductor package 894.

Figure 22A:
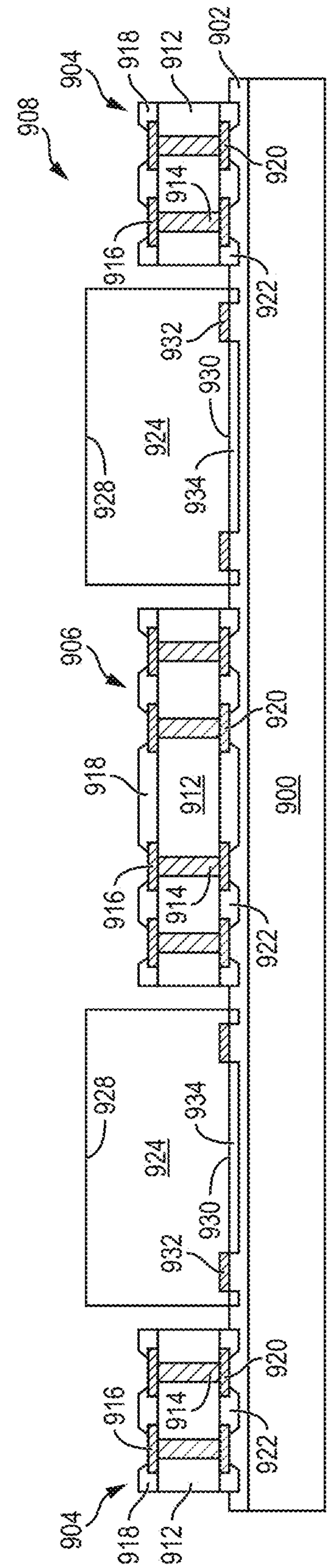
FIGS. 22*a*-22*e* illustrate another process of forming a Fo-PoP with semiconductor die interconnected by PWB modular units having vertical interconnect structures.

FIGS. 22*a*-22*e* and 23 illustrate, in relation to FIGS. 1 and 2*a*-2*c*, a process of forming a 3-D semiconductor device including a Fo-PoP with semiconductor die interconnected by PWB modular units having vertical interconnect structures. FIG. 22*a* shows a cross-sectional view of a portion of a carrier or temporary substrate 900 containing sacrificial base material such as silicon, polymer, beryllium oxide, glass, or other suitable low-cost, rigid material for structural support. An interface layer or double-sided tape 902 is formed over carrier 900 as a temporary adhesive bonding film, etch-stop layer, or thermal release layer. Semiconductor die 924 and PWB modular units 904 and 906 are mounted to carrier 900 forming reconstituted wafer 908.

Semiconductor die 924, similar to semiconductor die 124 from FIG. 3*c*, are mounted to carrier 900 and interface layer 902 using, for example, a pick and place operation with active surface 930 oriented toward the carrier. Semiconductor die 924 has a back surface 928 and an active surface 930 opposite back surface 928. An electrically conductive layer 932 is formed over active surface 930. An insulating or passivation layer 934 is conformally applied over active surface 930. A portion of insulating layer 934 is removed by LDA, etching, or other suitable process to expose portions of conductive layer 932.

A plurality of PWB modular units 904 and 906 is disposed around or in a peripheral region of semiconductor die 924. PWB modular units 904 and 906 disposed within reconstituted wafer 908 can differ in size and shape from one another, while still providing through vertical interconnect for the Fo-PoP 964. PWB units 904 and 906 include interlocking footprints having square and rectangular shapes, a cross-shape (+), an angled or "L-shape," a circular or oval shape, a hexagonal shape, an octagonal shape, a star shape, or any other geometric shape. PWB units 904 and 906 are disposed around semiconductor die 924 in an interlocking pattern such that different sides of semiconductor die 924 are aligned with, and correspond to, a number of different sides of the PWB units in a repeating pattern. In one embodiment, PWB modular units 904 and 906 are a single unit, similar to PWB unit 270 in FIG. 6*i*, and semiconductor die 924 is disposed in an opening formed in the PWB unit.

PWB units 904 and 906 include a core substrate 912. Core substrate 912 includes one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Alternatively, core substrate 912 includes one or more insulating or passivation layers.

A plurality of through vias is formed through core substrate 912 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 914. In one embodiment, Cu is deposited over the sidewall of the through vias by electroless plating and electroplating and the through vias are filled with conductive paste or plugging resin with fillers, similar to vertical interconnects 740 in FIG. 18*a*.

An electrically conductive layer or RDL 916 is formed over the surface of core substrate 912 and conductive vias 914 using a patterning and metal deposition process such as printing, PVD, CVD, sputtering, electrolytic plating, and electroless plating. Conductive layer 916 includes one or more layers of Al, Cu, Sn, Ni, Au, Ag, or other suitable electrically conductive material. Conductive layer 916 is electrically connected to conductive vias 914. Conductive layer 916 operates as contact pads electrically connected to conductive vias 914.

An insulating or passivation layer 918 is formed over the surface of core substrate 912 and conductive layer 916 using PVD, CVD, printing, spin coating, spray coating, slit coating, rolling coating, lamination, sintering, or thermal oxidation. Insulating layer 918 includes one or more layers of $SiO_2$, $Si_3N_4$, SiON, $Ta_2O_5$, $Al_2O_3$, $HfO_2$, BCB, PI, PBO, polymer dielectric resist with or without fillers or fibers, or other material having similar structural and dielectric properties. A portion of insulating layer 918 is removed by LDA, etching, or other suitable process to expose portions of conductive layer 916. In one embodiment, insulating layer 918 is a masking layer.

An electrically conductive layer or RDL 920 is formed over a surface of core substrate 912 opposite conductive layer 916 using a patterning and metal deposition process such as printing, PVD, CVD, sputtering, electrolytic plating, and electroless plating. Conductive layer 920 includes one or more layers of Al, Cu, Sn, Ni, Au, Ag, or other suitable electrically conductive material. Conductive layer 920 is electrically connected to conductive vias 914 and conductive layer 916. Conductive layer 920 operates as contact pads electrically connected to conductive vias 914. Alternatively, conductive vias 914 are formed through core substrate 912 after forming conductive layer 916 and/or conductive layer 920.

An insulating or passivation layer 922 is formed over the surface of core substrate 912 and conductive layer 920 using PVD, CVD, printing, spin coating, spray coating, slit coating, rolling coating, lamination, sintering, or thermal oxidation. Insulating layer 922 includes one or more layers of $SiO_2$, $Si_3N_4$, SiON, $Ta_2O_5$, $Al_2O_3$, $HfO_2$, BCB, PI, PBO, polymer dielectric resist with or without fillers or fibers, or other material having similar structural and dielectric properties. A portion of insulating layer 922 is removed by LDA, etching, or other suitable process to expose portions of conductive layer 920. In one embodiment, insulating layer 922 is a masking layer. Portions of conductive layer 916, conductive layer 920, and conductive vias 914 are electrically common or electrically isolated according to the design and function of semiconductor die 924 and later mounted semiconductor die or devices.

Figure 22B:
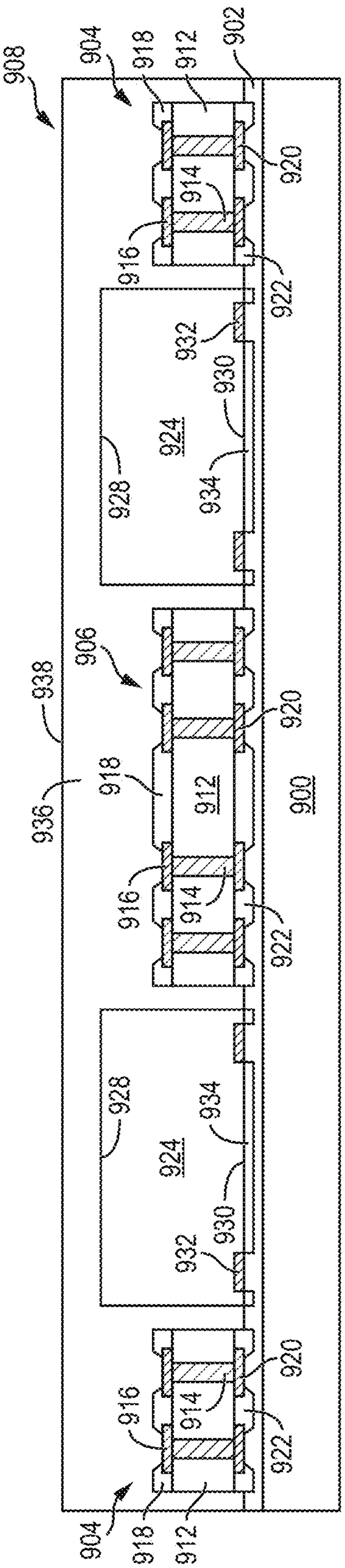

In FIG. 22*b*, an encapsulant or molding compound 936 is deposited over semiconductor die 924, PWB units 904 and 906, and carrier 900 using a paste printing, compressive molding, transfer molding, liquid encapsulant molding, vacuum lamination, spin coating, or other suitable applicator. Encapsulant 936 can be polymer composite material, such as epoxy resin with filler, epoxy acrylate with filler, or polymer with proper filler. Encapsulant 936 is non-conductive and environmentally protects the semiconductor device from external elements and contaminants. Encapsulant 936 also protects semiconductor die 924 from degradation due to exposure to light.

Continuing from FIG. 22*b*, carrier 900 and interface layer 902 are removed by chemical etching, mechanical peeling, CMP, mechanical grinding, thermal bake, UV light, laser scanning, or wet stripping leaving conductive layer 932 and insulating layer 934 of semiconductor die 924 and conductive layer 920 and insulating layer 922 of PWB units 904 and 906 exposed from encapsulant 936.

Figure 22C:
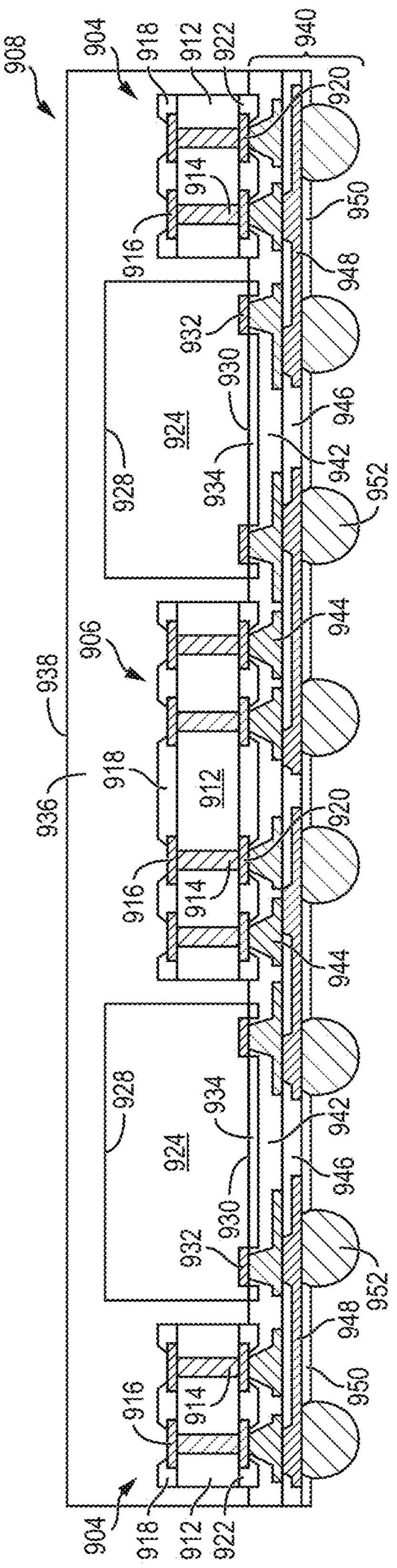

In FIG. 22*c*, a build-up interconnect structure 940 is formed over conductive layer 932 and insulating layer 934 of semiconductor die 924, conductive layer 920 and insulating layer 922 of PWB units 904 and 906, and encapsulant 936. Build-up interconnect structure 940 includes insulating layer 942, conductive layer 944, insulating layer 946, conductive layer 948, and insulating layer 950. Insulating or passivation layer 942 is formed over conductive layer 932, insulating layer 934, conductive layer 920, insulating layer 922, and encapsulant 936 using PVD, CVD, printing, slit coating, spin coating, spray coating, injection coating, lamination, sintering, or thermal oxidation. The insulating layer 942 contains one or more layers of $SiO_2$, $Si_3N_4$, SiON, $Ta_2O_5$, $Al_2O_3$, low temperature (less than 250° C.) curing polymer dielectric materials, or other material having similar insulating and structural properties. A portion of insulating layer 942 is removed by an exposure and development process, LDA, etching, or other suitable process to expose conductive layer 920 of PWB units 904 and 906, and conductive layer 932 of semiconductor die 924.

Electrically conductive layer or RDL 944 is formed over insulating layer 942 using PVD, CVD, electrolytic plating, electroless plating process, or other suitable metal deposition process. Conductive layer 944 can be one or more layers of Al, Ti, TiW, Cu, Sn, Ni, Au, Ag, or other suitable electrically conductive material. One portion of conductive layer 944 is electrically connected to conductive layer 932 of semiconductor die 924. One portion of conductive layer 944 is electrically connected to conductive layer 920 of PWB units 904 and 906. Other portions of conductive layer 944 can be electrically common or electrically isolated depending on the design and function of semiconductor die 924.

Insulating or passivation layer 946 is formed over insulating layer 942 and conductive layer 944 using PVD, CVD, printing, slit coating, spin coating, spray coating, injection coating, lamination, sintering, or thermal oxidation. Insulating layer 946 includes one or more layers of $SiO_2$, $Si_3N_4$, SiON, $Ta_2O_5$, $Al_2O_3$, low temperature (less than 250° C.)

curing polymer dielectric materials, or other material having similar structural and insulating properties. A portion of insulating layer 946 is removed by an exposure and development process, LDA, etching, or other suitable process to expose conductive layer 944.

Electrically conductive layer or RDL 948 is formed over insulating layer 946 and conductive layer 944 using PVD, CVD, electrolytic plating, electroless plating process, or other suitable metal deposition process. Conductive layer 948 can be one or more layers of Al, Ti, TiW, Cu, Sn, Ni, Au, Ag, or other suitable electrically conductive material. One portion of conductive layer 948 is electrically connected to conductive layer 944. Other portions of conductive layer 948 can be electrically common or electrically isolated depending on the design and function of semiconductor die 924.

Insulating or passivation layer 950 is formed over insulating layer 946 and conductive layer 948 using PVD, CVD, printing, slit coating, spin coating, spray coating, injection coating, lamination, sintering, or thermal oxidation. The insulating layer 950 includes one or more layers of low temperature (less than 250° C.) curing polymer dielectric materials, SiO2, Si3N4, SiON, Ta2O5, Al2O3, polymer dielectric materials, or other material having similar structural and insulating properties. A portion of insulating layer 950 is removed by an exposure and development process, LDA, etching, or other suitable process to expose conductive layer 948.

The number of insulating and conductive layers included within build-up interconnect structure 940 depends on, and varies with, the complexity of the circuit routing design. Accordingly, build-up interconnect structure 940 can include any number of insulating and conductive layers to facilitate electrical interconnect with respect to semiconductor die 924.

An electrically conductive bump material is deposited over build-up interconnect structure 940 and electrically connected to the exposed portion of conductive layer 948 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 948 using a suitable attachment or bonding process. In one embodiment, the bump material is reflowed by heating the material above the material's melting point to form spherical balls or bumps 952. In some applications, bumps 952 are reflowed a second time to improve electrical contact to conductive layer 948. In one embodiment, bumps 952 are formed over a UBM layer. Bumps 952 can also be compression bonded or thermocompression bonded to conductive layer 948. Bumps 952 represent one type of interconnect structure that can be formed over conductive layer 948. The interconnect structure can also use bond wire, conductive paste, stud bump, micro bump, conductive pillar, composite interconnect structure, or other electrical interconnect. In one embodiment, bumps 952 have a pitch of 400 μm or less.

Figure 22D:
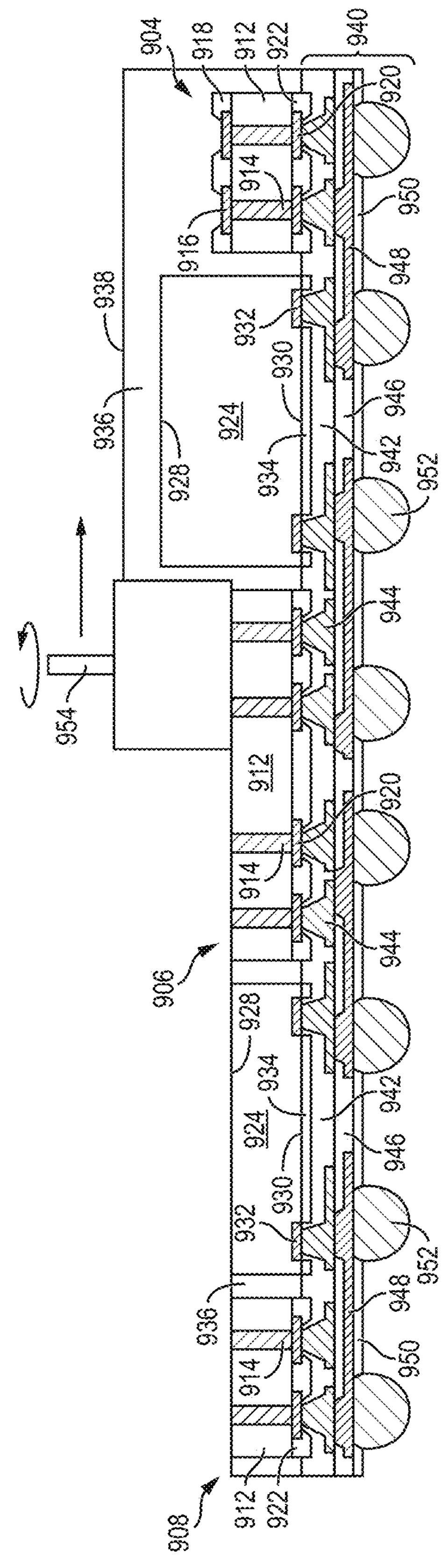

In FIG. 22*d*, surface 938 of encapsulant 936 undergoes a grinding operation with grinder 954. The grinding operation removes a portion of encapsulant 936, back surface 928 of semiconductor die 924, and conductive layer 916 and insulating layer 920 of PWB units 904 and 906. The grinding operation reduces an overall thickness of reconstituted wafer 908 and exposes conductive vias 914 of PWB units 904 and 906.

Figure 22E:
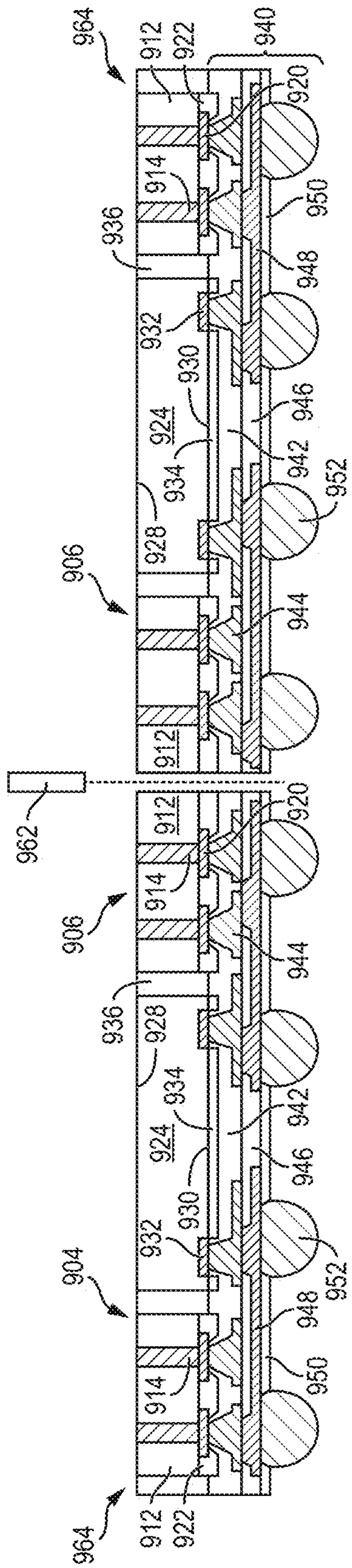

In FIG. 22*e*, reconstituted wafer 908 with build-up interconnect structure 940 is singulated using a saw blade or laser cutting tool 962 to form individual Fo-PoP 964. PWB modular units 904 and 906 within Fo-PoP 964 provide a cost effective alternative to using standard laser drilling processes for vertical interconnection in Fo-PoP 964.

Figure 23:
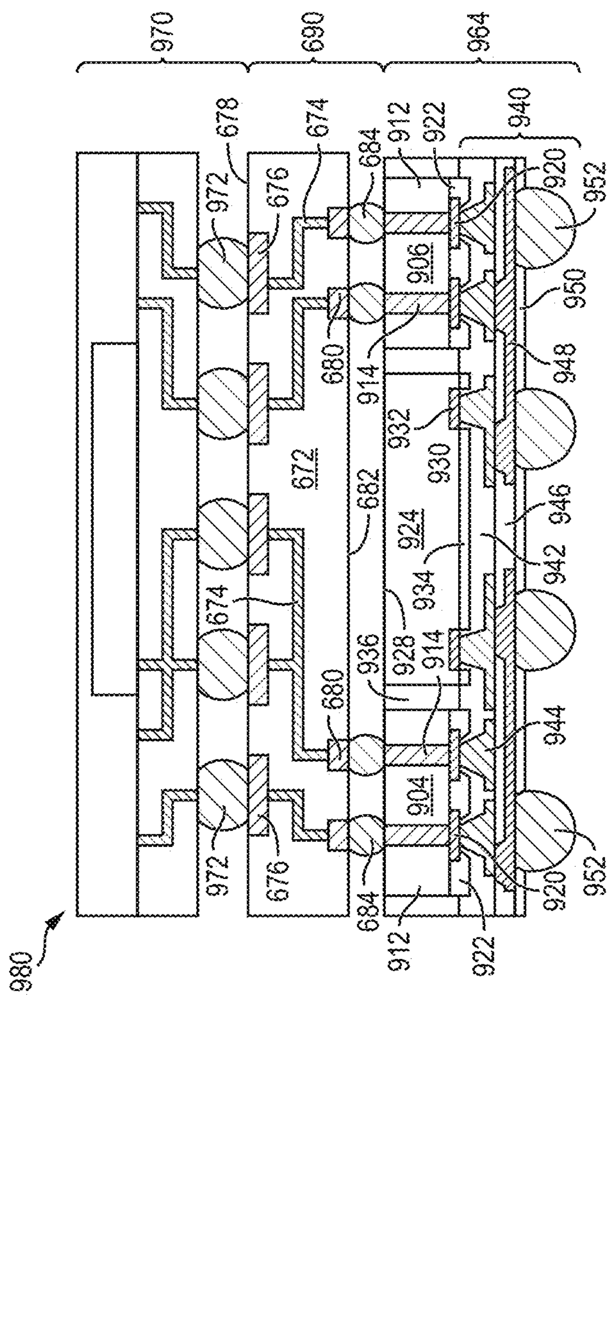
FIG. 23 illustrates a 3-D semiconductor device including the Fo-PoP of FIGS. 22*a*-22*e*.

FIG. 23 shows Fo-PoP 964 from FIG. 22*e* with interposer 690 from FIG. 17*c* and semiconductor die or device 970 stacked over Fo-PoP 964. Interposer 690 is mounted to Fo-PoP 964 using pick and place or other suitable operation. In one embodiment, interposer 690 is mounted at the wafer level, i.e., interposer 690 is disposed over reconstituted wafer 908 prior to singulation, similar to FIG. 18*b*. Bumps 684 are reflowed to metallurgically and electrically connect interposer 690 to conductive vias 914 of PWB units 904 and 906. In some applications, bumps 694 are reflowed a second time to improve electrical contact to conductive vias 914. Bumps 684 represent one type of interconnect structure that can be formed between interposer 690 and Fo-PoP 964. The interconnect structure can also use bond wire, conductive paste, stud bump, micro bump, conductive pillar, composite interconnect structure, or other electrical interconnect. In one embodiment, an adhesive material, similar to adhesive 780 in FIG. 18*d*, is deposited over back surface 928 of semiconductor die 924 prior to mounting interposer 690.

Semiconductor device 970 is disposed over surface 678 of interposer 690 using a pick and place or other suitable operation. Semiconductor device 970 may include filter, memory, or other IC chips, processors, microcontrollers, known-good packages, or any other packaged device containing semiconductor die or other electronic devices or circuitry. In one embodiment, Fo-PoP 964 has an I/O count of 552 and semiconductor device 970 is a memory device with an I/O count of 504 and a bump pitch of approximately 500 μm. Bumps 972 are reflowed to metallurgically and electrically connecting semiconductor device 970 to conductive layer 676 of interposer 690. In some applications, bumps 972 are reflowed a second time to improve electrical contact to conductive layer 676. Bumps 972 are Al, Sn, Ni, Au, Ag, Pb, Bi, Cu, solder, and combinations thereof. Bumps 972 can be eutectic Sn/Pb, high-lead solder, or lead-free solder. The pitch between bumps 972 coincides with the pitch of conductive layer 676 of interposer 690, e.g., the pitch of both bumps 972 and conductive layer 676 is 500 μm. Bumps 972 represent one type of interconnect structure that can be formed between semiconductor devices 970 and interposer 690. The interconnect structure can also use bond wire, conductive paste, stud bump, micro bump, conductive pillar, composite interconnect structure, or other electrical interconnect. Semiconductor device 970 is electrically connected to semiconductor die 924 through interposer 690, PWB units 904 and 906, and build-up interconnect structure 940. Fo-PoP 964, interposer 690, and semiconductor device 970 are fabricated separately and can be stacked in any order at either a panel level, i.e., prior to singulation, or as individual components, i.e., after singulation. In one embodiment, an underfill material is deposited between Fo-PoP 964 and surface 682 of interposer 690, and/or between semiconductor device 970 and surface 678 of interposer 690.

Fo-PoP 964, interposer 690, and semiconductor device 970 form a 3-D semiconductor package 980. Semiconductor die 924 is electrically connected through build-up interconnect structure 940 to bumps 952 for connection to external devices. Semiconductor device 970 is electrically connected to semiconductor die 924 and external devices through interposer 690, PWB units 904 and 906, build-up interconnect structure 940, and bumps 952. The components of 3-D semiconductor package 980, i.e., Fo-PoP 964, interposer 690, and semiconductor device 970 are each fabricated separately. Forming Fo-PoP 964, interposer 690, and semiconductor device 970 separately allows each component to utilize a standardized infrastructure and fabrication process. For example, standardized materials and fabrication tools are employed to mass-produce Fo-PoP 964 for incorporation into 3-D semiconductor package 980 and a variety of other semiconductor packages. Incorporating standardized components within 3-D semiconductor package 980 lowers manufacturing costs, capital risk, and cycle time by reducing or eliminating the need for specialized semiconductor processing lines. Forming Fo-PoP 964, interposer 690, and semiconductor device 970 independent from one another also allows Fo-PoP 964, interposer 690, and semiconductor device 970 to be tested prior to incorporating each component into 3-D semiconductor package 980. Thus, only known good components are included in 3-D semiconductor package 980. By using only known good components, manufacturing steps and materials are not wasted making defective packages and the overall cost of 3-D semiconductor package 980 is reduced.

The thin profile of Fo-PoP 964 reduces the overall thickness of 3-D semiconductor package 980. In one embodiment, a thickness Fo-PoP 964 including bumps 952 is less than 0.4 mm. PWB modular units 904 and 906 are made with low cost manufacturing technology such as substrate manufacturing technology and provide a cost effective alternative to using standard laser drilling processes for vertical interconnection in Fo-PoP 964. Interposer 690 provides a cost effect, reliable electrical interconnection between Fo-PoP 964 and semiconductor device 970 without adding significant thickness to 3-D semiconductor package 980, e.g., interposer 690 has a thickness of 120 μm or less. In one embodiment, interposer 690 is a thin flexible circuit sheet to further reduce the thickness of 3-D semiconductor package 980. Interposer 690 may also provide RF and SiP functions, e.g., interposer 690 may include an embedded thin film capacitor, inductor, and/or passive component, to increase the electrical performance and functionality of 3-D semiconductor package 980 without increasing the footprint of 3-D semiconductor package 980.

Figure 24:
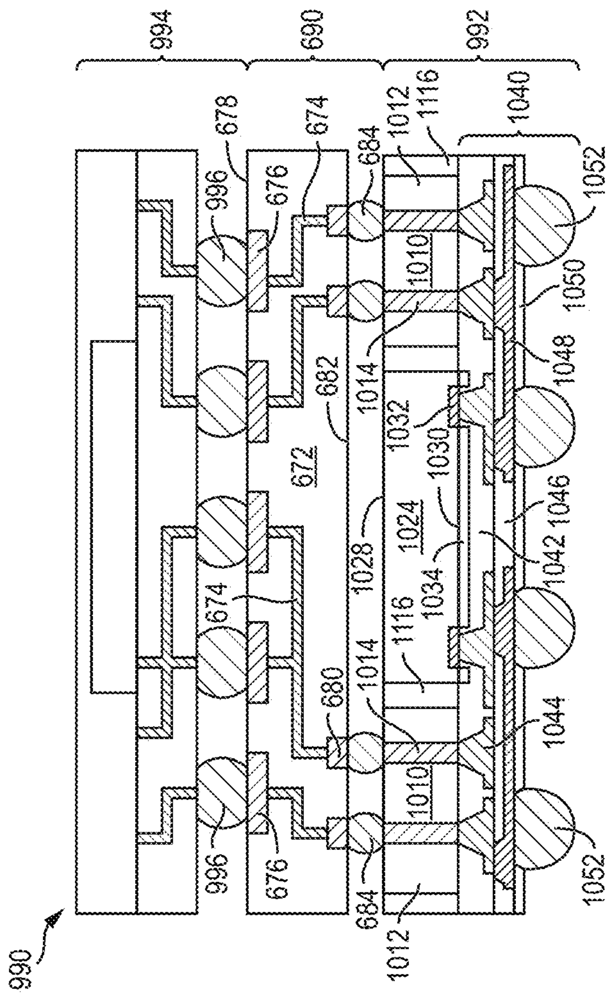
FIG. 24 illustrates another 3-D semiconductor device including a Fo-PoP with semiconductor die interconnected by PWB modular units having vertical interconnect structures.

FIG. 24 shows 3-D semiconductor package 990 including stacked Fo-PoP 992, interposer 690 from FIG. 17*c*, and semiconductor die or device 994. Fo-PoP 992 includes semiconductor die 1024, PWB modular units 1010, and build-up interconnect structure 1040. Semiconductor die 1024, similar to semiconductor die 124 from FIG. 3*c*, has a back surface 1028 and an active surface 1030 opposite back surface 1028. An electrically conductive layer 1032 is formed over active surface 1030. An insulating or passivation layer 1034 is conformally applied over active surface 1030. A portion of insulating layer 1034 is removed by LDA, etching, or other suitable process to expose portions of conductive layer 1032.

PWB modular units 1010 are disposed around semiconductor die 1024, similar to PWB modular units 904 and 906 in FIG. 22*a*. PWB units 1010 include core substrate 1012. Core 1012 includes one or more laminated layers of polytetrafluoroethylene prepreg, FR-4, FR-1, CEM-1, or CEM-3 with a combination of phenolic cotton paper, epoxy, resin, woven glass, matte glass, polyester, glass fabric with filler, and other reinforcement fibers or fabrics. Alternatively, core substrate 1012 includes one or more insulating or passivation layers.

A plurality of through vias is formed through core substrate 1012 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 1014. In one embodiment, Cu is deposited over the sidewall of the through vias by electroless plating and electroplating and the through vias are filled with conductive paste or plugging resin with fillers, similar to vertical interconnects 740 in FIG. 18*a*.

Encapsulant or molding compound 1016 is deposited over semiconductor die 1024 and PWB units 1010 using a paste printing, compressive molding, transfer molding, liquid encapsulant molding, vacuum lamination, spin coating, or other suitable applicator. Encapsulant 1016 can be polymer composite material, such as epoxy resin with filler, epoxy acrylate with filler, or polymer with proper filler. Encapsulant 1016 is non-conductive and environmentally protects the semiconductor device from external elements and contaminants. Encapsulant 1016 also protects semiconductor die 1024 from degradation due to exposure to light. A portion of encapsulant 1016 is removed in a grinding operation. The grinding operation exposes conductive vias 1114, planarizes the surface of encapsulant 1116 and semiconductor die 1024, and reduces an overall thickness of 3-D semiconductor package 990. In one embodiment, a portion of back surface 1028 of semiconductor die 1024 is also removed by the grinding operation.

Build-up interconnect structure 1040 is formed over conductive layer 1032 and insulating layer 1034 of semiconductor die 1024, PWB units 1010, and encapsulant 1016. Build-up interconnect structure 1040 includes insulating layer 1042, conductive layer 1044, insulating layer 1046, conductive layer 1048, and insulating layer 1050.

Insulating or passivation layer 1042 is formed over conductive layer 1032, insulating layer 1034, PWB units 1010, and encapsulant 1116 using PVD, CVD, printing, slit coating, spin coating, spray coating, injection coating, lamination, sintering, or thermal oxidation. The insulating layer 1042 contains one or more layers of $SiO_2$, $Si_3N_4$, SiON, $Ta_2O_5$, $Al_2O_3$, low temperature (less than 250° C.) curing polymer dielectric materials, or other material having similar insulating and structural properties. A portion of insulating layer 1042 is removed by an exposure and development process, LDA, etching, or other suitable process to expose conductive vias 1014 of PWB units 1010, and conductive layer 1032 of semiconductor die 1024.

Electrically conductive layer or RDL 1044 is formed over insulating layer 1042 using PVD, CVD, electrolytic plating, electroless plating process, or other suitable metal deposition process. Conductive layer 1044 can be one or more layers of Al, Ti, TiW, Cu, Sn, Ni, Au, Ag, or other suitable electrically conductive material. One portion of conductive layer 1044 is electrically connected to conductive layer 1032 of semiconductor die 1024. One portion of conductive layer 1044 is electrically connected to conductive vias 1014 of PWB units 1010. Other portions of conductive layer 1044 can be electrically common or electrically isolated depending on the design and function of semiconductor die 1024.

Insulating or passivation layer 1046 is formed over insulating layer 1042 and conductive layer 1044 using PVD, CVD, printing, slit coating, spin coating, spray coating, injection coating, lamination, sintering, or thermal oxidation. Insulating layer 1046 includes one or more layers of $SiO_2$, $Si_3N_4$, SiON, $Ta_2O_5$, $Al_2O_3$, low temperature (less than 250° C.) curing polymer dielectric materials, or other material having similar structural and insulating properties. A portion of insulating layer 1046 is removed by an exposure and development process, LDA, etching, or other suitable process to expose conductive layer 1044.

Electrically conductive layer or RDL 1048 is formed over insulating layer 1046 and conductive layer 1044 using PVD, CVD, electrolytic plating, electroless plating process, or other suitable metal deposition process. Conductive layer 1048 can be one or more layers of Al, Ti, TiW, Cu, Sn, Ni, Au, Ag, or other suitable electrically conductive material. One portion of conductive layer 1048 is electrically connected to conductive layer 1044. Other portions of conductive layer 1048 can be electrically common or electrically isolated depending on the design and function of semiconductor die 1024.

Insulating or passivation layer 1050 is formed over insulating layer 1046 and conductive layer 1048 using PVD, CVD, printing, slit coating, spin coating, spray coating, injection coating, lamination, sintering, or thermal oxidation. The insulating layer 1050 includes one or more layers of low temperature (less than 250° C.) curing polymer dielectric materials, SiO2, Si3N4, SiON, Ta2O5, Al2O3, polymer dielectric materials, or other material having similar structural and insulating properties. A portion of insulating layer 1050 is removed by an exposure and development process, LDA, etching, or other suitable process to expose conductive layer 1048.

The number of insulating and conductive layers included within build-up interconnect structure 1040 depends on, and varies with, the complexity of the circuit routing design. Accordingly, build-up interconnect structure 1040 can include any number of insulating and conductive layers to facilitate electrical interconnect with respect to semiconductor die 1024.

An electrically conductive bump material is deposited over build-up interconnect structure 1040 and electrically connected to the exposed portion of conductive layer 1048 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 1048 using a suitable attachment or bonding process. In one embodiment, the bump material is reflowed by heating the material above the material's melting point to form spherical balls or bumps 1052. In some applications, bumps 1052 are reflowed a second time to improve electrical contact to conductive layer 1048. In one embodiment, bumps 1052 are formed over a UBM layer. Bumps 1052 can also be compression bonded or thermocompression bonded to conductive layer 1048. Bumps 1052 represent one type of interconnect structure that can be formed over conductive layer 1048. The interconnect structure can also use bond wire, conductive paste, stud bump, micro bump, conductive pillar, composite interconnect structure, or other electrical interconnect. In one embodiment, bumps 1052 have a pitch or 400 μm or less.

Interposer 690 from FIG. 17*c* and semiconductor device 994 are stacked over Fo-PoP 992. Interposer 690 is mounted to Fo-PoP 992 using a pick and place or other suitable operation. Bumps 684 metallurgically and electrically connected interposer 690 to conductive vias 1014 of PWB units 1010. Bumps 684 represent one type of interconnect structure that can be formed between interposer 690 and Fo-PoP 992. The interconnect structure can also use bond wire, conductive paste, stud bump, micro bump, conductive pillar, composite interconnect structure, or other electrical interconnect. In one embodiment, an adhesive material, similar to adhesive 780 in FIG. 18*d*, is deposited over back surface 1028 of semiconductor die 1024 prior to mounting interposer 690.

Semiconductor device 994 is disposed over surface 678 of interposer 690. Semiconductor device 994 may include filter, memory, or other IC chips, processors, microcontrollers, known-good packages, or any other packaged device containing semiconductor die or other electronic devices or circuitry. In one embodiment, Fo-PoP 992 has an I/O count of 552 and semiconductor device 994 is a memory device with an I/O count of 504 and a bump pitch of approximately 500 μm. Bumps 996 are reflowed to metallurgically and electrically connect semiconductor device 994 to conductive layer 676 of interposer 690. In some applications, bumps 996 are reflowed a second time to improve electrical contact to conductive layer 676. Bumps 996 are Al, Sn, Ni, Au, Ag, Pb, Bi, Cu, solder, and combinations thereof. Bumps 996 can be eutectic Sn/Pb, high-lead solder, or lead-free solder. The pitch between bumps 996 coincides with the pitch of conductive layer 676 of interposer 690, e.g., the pitch of both bumps 996 and conductive layer 676 is 500 μm. Bumps 996 represent one type of interconnect structure that can be formed between semiconductor devices 994 and interposer 690. The interconnect structure can also use bond wire, conductive paste, stud bump, micro bump, conductive pillar, composite interconnect structure, or other electrical interconnect. Semiconductor device 994 is electrically connected to semiconductor die 1024 through interposer 690, PWB units 1010, and build-up interconnect structure 1040. Fo-PoP 992, interposer 690, and semiconductor device 994 are fabricated separately and can be stacked in any order at either a panel level, i.e., prior to singulation, or as individual components, i.e., after singulation. In one embodiment, an underfill material is deposited between Fo-PoP 992 and surface 682 of interposer 690, and/or between semiconductor device 994 and surface 678 of interposer 690.

Fo-PoP 992, interposer 690, and semiconductor device 994 form a 3-D semiconductor package 990. Semiconductor die 1024 is electrically connected through build-up interconnect structure 1040 to bumps 1052 for connection to external devices. Semiconductor device 994 is electrically connected to semiconductor die 1024 and external devices through interposer 690, PWB units 1010, build-up interconnect structure 1040, and bumps 1052. The components of 3-D semiconductor package 990, i.e., Fo-PoP 992, interposer 690, and semiconductor device 994 are each fabricated separately. Forming Fo-PoP 992, interposer 690, and semiconductor device 994 separately allows each component to utilize a standardized infrastructure and fabrication process. For example, a separate set of standardized materials and fabrication tools are employed to mass-produce Fo-PoP 992 for incorporation into 3-D semiconductor package 990 and a variety of other semiconductor packages. Incorporating standardized components within 3-D semiconductor package 990 lowers manufacturing costs, capital risk, and cycle time by reducing or eliminating the need for specialized semiconductor processing lines. Forming Fo-PoP 992, interposer 690, and semiconductor device 994 independent from one another also allows Fo-PoP 992, interposer 690, and semiconductor device 994 to be tested prior to incorporating each component into 3-D semiconductor package 990. Thus, only known good components are included in 3-D semiconductor package 990. By using only known good components, manufacturing steps and materials are not wasted making defective packages and the overall cost of 3-D semiconductor package 990 is reduced.

The thin profile of Fo-PoP 992 reduces the overall thickness of 3-D semiconductor package 990. In one embodiment, a thickness Fo-PoP 992 including bumps 1052 is less than 0.4 mm. PWB modular units 1010 are made with low cost manufacturing technology such as substrate manufacturing technology and provide a cost effective alternative to using standard laser drilling processes for vertical interconnection in Fo-PoP 992. Interposer 690 provides a cost effect, reliable electrical interconnection between Fo-PoP 992 and semiconductor device 994 without adding significant thickness to 3-D semiconductor package 990, e.g., interposer 690 has a thickness of 120 μm or less. In one embodiment, interposer 690 is a thin flexible circuit sheet to further reduce the thickness of 3-D semiconductor package 990. Interposer 690 may also provide RF and SiP functions, e.g., interposer 690 may include an embedded thin film capacitor, inductor, and/or passive component, to increase the electrical performance and functionality of 3-D semiconductor package 990 without increasing the footprint of 3-D semiconductor package 990.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:

a first semiconductor die;

a modular interconnect unit disposed adjacent to the first semiconductor die, wherein the modular interconnect structure includes a vertical interconnect structure;

an encapsulant deposited over the modular interconnect unit and around the first semiconductor die with an opening in a surface of the encapsulant extending to the vertical interconnect; and an interconnect interposer disposed over the first semiconductor die and modular interconnect unit.

2. The semiconductor device of claim 1, wherein the vertical interconnect structure includes a bump material disposed within a via through the modular interconnect unit.

3. The semiconductor device of claim 1, wherein the modular interconnect unit includes a core substrate and the vertical interconnect structure includes a conductive via extending through the core substrate.

4. The semiconductor device of claim 1, further including an interconnect structure extending into the opening of the encapsulant to electrically connect the interconnect interposer to the vertical interconnect structure.

5. The semiconductor device of claim 1, further including a second semiconductor die disposed over the interconnect interposer.

6. The semiconductor device of claim 1, further including an interconnect structure formed over the first semiconductor die and modular interconnect unit opposite the interconnect substrate.

7. A semiconductor device, comprising:

a first semiconductor die;

a modular interconnect unit disposed adjacent to the first semiconductor die, wherein the modular interconnect structure includes a vertical interconnect structure; and an encapsulant deposited over the modular interconnect unit and around the first semiconductor die with an opening in the encapsulant extending to the vertical interconnect structure.

8. The semiconductor device of claim 7, further including an interconnect interposer disposed over the first semiconductor die and modular interconnect unit.

9. The semiconductor device of claim 8, further including an interconnect structure extending into the opening of the encapsulant to electrically connect the interconnect interposer to the vertical interconnect structure.

10. The semiconductor device of claim 8, further including an interconnect structure formed over the first semiconductor die and modular interconnect unit opposite the interconnect substrate.

11. The semiconductor device of claim 8, further including a second semiconductor die disposed over the interconnect interposer.

12. The semiconductor device of claim 7, wherein the vertical interconnect structure includes a bump material disposed within a via through the modular interconnect unit.

13. The semiconductor device of claim 7, wherein the modular interconnect unit includes a core substrate and the vertical interconnect structure includes a conductive via extending through the core substrate.

14. A method of making a semiconductor device, comprising:

providing a first semiconductor die;

disposing a modular interconnect unit adjacent to the first semiconductor die, wherein the modular interconnect structure includes a vertical interconnect structure;

depositing an encapsulant over the modular interconnect unit and around the first semiconductor die with an opening in a surface of the encapsulant extending to the vertical interconnect; and disposing an interconnect interposer over the first semiconductor die and modular interconnect unit.

15. The method of claim 14, wherein the vertical interconnect structure includes a bump material disposed within a via through the modular interconnect unit.

16. The method of claim 14, wherein the modular interconnect unit includes a core substrate and the vertical interconnect structure includes a conductive via extending through the core substrate.

17. The method of claim 14, further including forming an interconnect structure extending into the opening of the encapsulant to electrically connect the interconnect interposer to the vertical interconnect structure.

18. The method of claim 14, further including disposing a second semiconductor die over the interconnect interposer.

19. The method of claim 14, further including forming an interconnect structure over the first semiconductor die and modular interconnect unit opposite the interconnect substrate.

20. A method of making a semiconductor device, comprising:

providing a first semiconductor die;

disposing a modular interconnect unit adjacent to the first semiconductor die, wherein the modular interconnect structure includes a vertical interconnect structure; and depositing an encapsulant over the modular interconnect unit and around the first semiconductor die with an opening in the encapsulant extending to the vertical interconnect structure.

21. The method of claim 20, further including disposing an interconnect interposer over the first semiconductor die and modular interconnect unit.

22. The method of claim 21, further including forming an interconnect structure extending into the opening of the encapsulant to electrically connect the interconnect interposer to the vertical interconnect structure.

23. The method of claim 21, further including forming an interconnect structure formed over the first semiconductor die and modular interconnect unit opposite the interconnect substrate.

24. The method of claim 20, wherein the vertical interconnect structure includes a bump material disposed within a via through the modular interconnect unit.

25. The method of claim 20, wherein the modular interconnect unit includes a core substrate and the vertical interconnect structure includes a conductive via extending through the core substrate.

* * * * *